(12) United States Patent
Dorr

(10) Patent No.: US 7,621,460 B2
(45) Date of Patent: Nov. 24, 2009

(54) DATA STORAGE SYSTEM HAVING COOLING FAN SPEED PROTECTION

(75) Inventor: Timothy Dorr, North Attleboro, MA (US)

(73) Assignee: EMC Corporation, Hopkinton, MA (US)

( * ) Notice: Subject to any disclaimer, the term of this patent is extended or adjusted under 35 U.S.C. 154(b) by 585 days.

(21) Appl. No.: 11/238,350

(22) Filed: Sep. 29, 2005

(65) Prior Publication Data

US 2007/0069584 A1    Mar. 29, 2007

(51) Int. Cl.
F24F 7/00 (2006.01)
H02P 1/04 (2006.01)
G05D 23/00 (2006.01)
G06F 11/00 (2006.01)

(52) U.S. Cl. ............ 236/49.3; 318/469; 318/472; 714/47

(58) Field of Classification Search .......... 236/49.3, 236/DIG. 9; 700/276; 318/469, 472, 254.1, 318/811; 714/47, 48; 361/91.1, 91.6
See application file for complete search history.

(56) References Cited

U.S. PATENT DOCUMENTS

| | | | | |
|---|---|---|---|---|
| 5,528,229 A * | 6/1996 | Mehta | ............... | 340/3.4 |
| 5,841,876 A * | 11/1998 | Gifford et al. | ........... | 381/71.14 |
| 6,040,668 A * | 3/2000 | Huynh et al. | ............... | 318/471 |
| 6,135,718 A * | 10/2000 | Yang | ............ | 417/22 |
| 6,390,379 B1 * | 5/2002 | Huang | .............. | 236/49.3 |
| 6,650,074 B1 * | 11/2003 | Vyssotski et al. | ...... | 318/400.12 |
| 6,879,120 B2 * | 4/2005 | Xi | ............. | 318/400.01 |
| 6,891,347 B2 * | 5/2005 | Dobbs et al. | ............... | 318/471 |
| 7,275,380 B2 * | 10/2007 | Durant et al. | ............... | 62/178 |
| 2003/0015983 A1 * | 1/2003 | Montero et al. | ............ | 318/473 |
| 2003/0137267 A1 | 7/2003 | Blake | | |
| 2004/0027799 A1 * | 2/2004 | King et al. | .............. | 361/687 |
| 2004/0234376 A1 | 11/2004 | Marando et al. | | |
| 2004/0263105 A1 | 12/2004 | Tsai et al. | | |
| 2005/0196157 A1 * | 9/2005 | Fung | ............ | 388/804 |

OTHER PUBLICATIONS

Electronic Motor Control for Fan IBM Technical Disclosure Bulletion, vol. 36, No. Aug. 8, 1993.
International Search Report Written Opinion.
U.S. Appl. No. 11/238,601, filed Mar. 29, 2005.
U.S. Appl. No. 11/238,600, filed Mar. 29, 2005.
U.S. Appl. No. 11/238,352, filed Mar. 29, 2005.
U.S. Appl. No. 11/238,284, filed Mar. 29, 2005 (Now U.S. Pat. No. 7,134,902).
U.S. Appl. No. 11/238,283, filed Mar. 29, 2005.

* cited by examiner

*Primary Examiner*—Chen-Wen Jiang

(57) ABSTRACT

A speed control system is provided for controlling temperature within a chassis. The chassis includes therein a temperature sensing device for producing a temperature signal representative of temperature within the chassis, a fan, and a fan speed controller. The fan speed controller produces a nominal fan speed control signal comprising a train of pulses, successive pulses having a duty cycle related to the temperature signal produced by the temperature sensing device, such time durations decreasing with increasing temperature. The speed control system includes a decoupling circuit responsive to the nominal fan speed control signal for, in response to relatively a low duty cycle, coupling the nominal fan control signal to an output of the decoupling circuit, and, in response a relatively high duty cycle, producing a preset fan speed signal at the output of the decoupling circuit. The fan has a speed in accordance with the signal at the output of the decoupling circuit.

11 Claims, 48 Drawing Sheets

| U.C. | INTERPOSER | SEB | SEB | DISPLAY |
|---|---|---|---|---|
| c1 | | | | |
| a | A | | | A |
| a | A | A | | A |
| a.b | A | | A | A |
| c2 | | B | B | |
| a | | A | A | A |
| c1 | | A | B | |
| a.b | A | A | A | A |
| b | A | B | B | A |
| c2 | A | B | B | |
| c2 | A | B | C | |

A MEANS ENCLOSURE IDENTIFIES ITSELF BY BLINKING NUMBER AND TAKES OWNERSHIP OF UNOWNED BOARDS. OTHER CASES IT DISPLAYS UNKNOWN.

FIG. 7

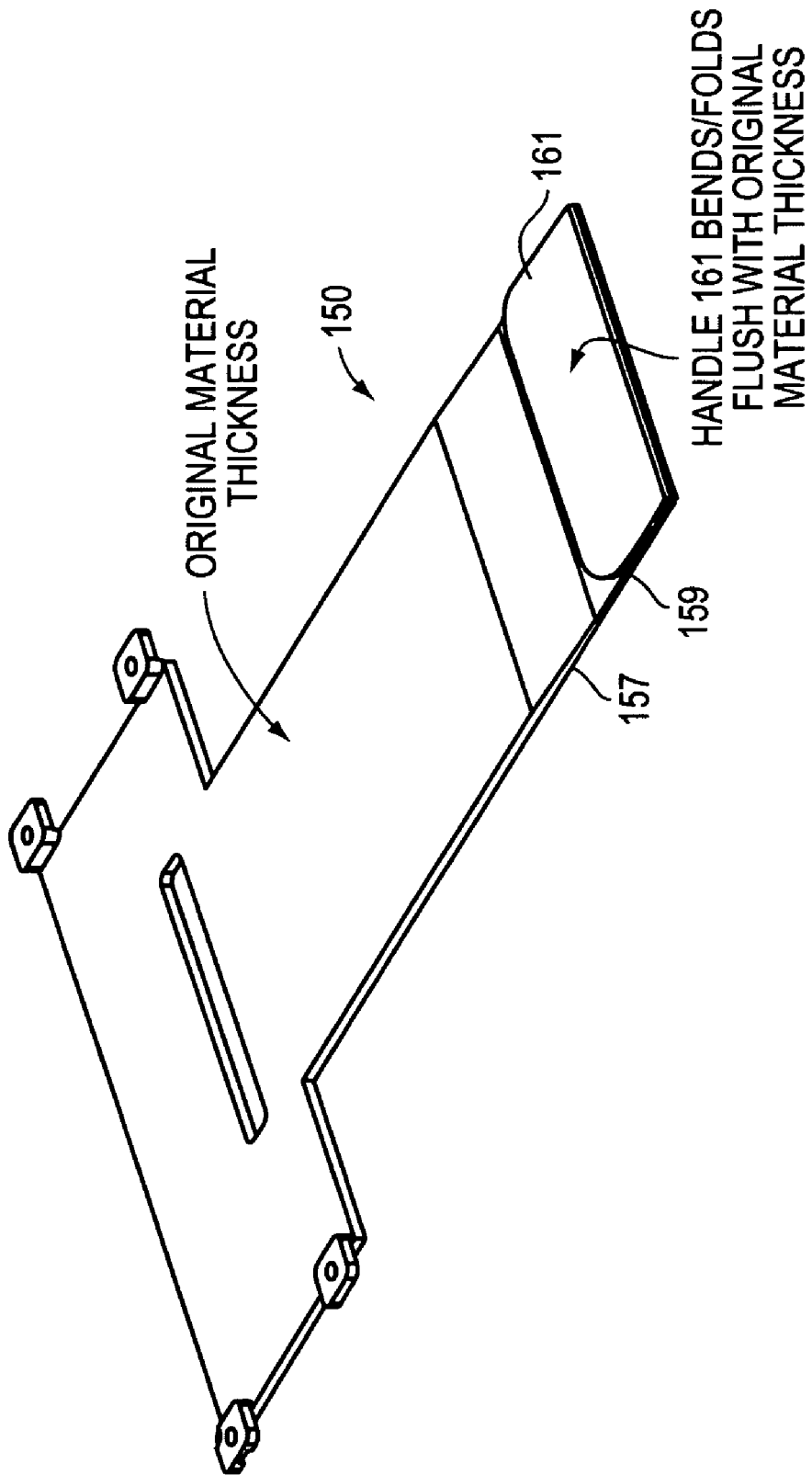

DATA STORAGE SYSTEM HAVING COOLING FAN SPEED PROTECTION

RELATED APPLICATIONS

This patent application is copending with U.S. patent application Ser. No. 11/167,884 filed Jun. 27, 2005 entitled 2:2 Multiplexer, assigned to the same assignee as the present invention and this patent application hereby claims the benefit of the filing date of such copending patent application under the provision of 35 USC 120 as to any subject matter claim in this application and described in said copending patent application.

INCORPORATION BY REFERENCE

This patent application incorporates by reference the entire subject matter in copending U.S. patent application Ser. No. 11/167,884 filed Jun. 27, 2005 entitled 2:2 Multiplexer, assigned to the same assignee as the present invention.

TECHNICAL FIELD

This invention relates generally to data storage systems and more particularly to data storage systems having cooling fan speed protection.

BACKGROUND

As is known in the art, in data storage systems there is a desire to control the speed of the fan to limit the amount of noise and prolong the life of the fan. In previous systems the fan was allowed to run at full speed all of the time. Now, with fan speed control there is a device that monitors and controls the speed of the fan. However, there is the potential that the controller which provides the speed control signal to the fan might fail in such a way that it will cause the fan to stop spinning (i.e., a failure of the controller may produce a fan control signal of zero volts thereby resulting in the fan to stop spinning). Hence, if the controller stops functioning or loses power in such a manner that its control signal goes to 0 Volts, the fan will stop. The effect will unfortunately result in a rise in the temperature of the chassis and thereby require the system to be shut down.

SUMMARY

In accordance with the invention, a speed control system is provided for controlling temperature within a chassis. The chassis includes therein a temperature sensing device for producing a temperature signal representative of temperature within the chassis, a fan, and a fan speed controller. The fan speed controller produces a nominal fan speed control signal comprising a train of pulses, successive pulses having a duty cycle related to the temperature signal produced by the temperature sensing device, such duty cycle increasing with increasing temperature. The speed control system includes a decoupling circuit responsive to the nominal fan speed control signal for, in response to relatively low duty cycles, coupling the nominal fan control signal to an output of the decoupling circuit, and, in response relatively high duty cycles, producing a preset fan speed signal at the output of the decoupling circuit. The fan has a speed in accordance with the signal at the output of the decoupling circuit.

In one embodiment, the nominal speed control signal varies from a zero fan speed control signal to a maximum fan speed control signal and wherein the preset fan speed control signal is represents the maximum fan speed control signal.

In one embodiment, the relatively small duty cycle to no duty cycle indicates a failure of the fan speed controller.

With such an arrangement, the decoupling circuit detects if nominal speed control signal stays low for too long a time (characteristic of a failed speed controller) and in such case causes the fan to speed up to full speed (since the decoupling circuit assumes a worst-case condition and drives the fan to full speed).

The details of one or more embodiments of the invention are set forth in the accompanying drawings and the description below. Other features, objects, and advantages of the invention will be apparent from the description and drawings, and from the claims.

DESCRIPTION OF DRAWINGS

FIG. 7 is an illustration of aspects of enclosure number display;

FIG. 16B is an isometric view of a tray-like device of FIG. 14 with a handle portion thereof in a fully closed position;

Like reference symbols in the various drawings indicate like elements.

DETAILED DESCRIPTION

Figure 1:
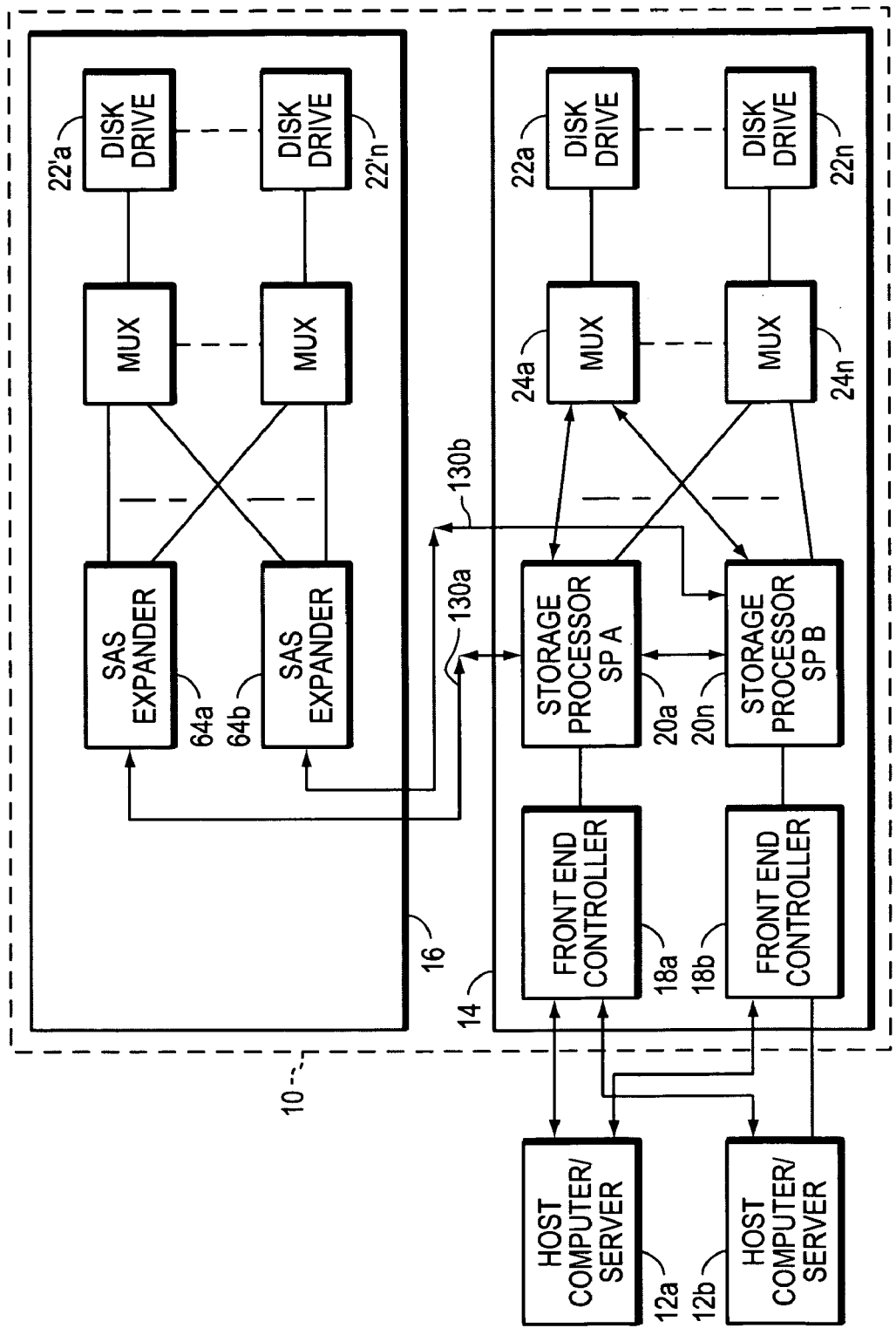
FIGS. 1-3 are block diagrams of a RAID data storage system with SAS expansion.

Referring now to FIG. 1, a data storage system 10 is shown coupled to a pair of host computer/servers 12a, 12b, as shown. The data storage system 10 includes a plurality of, here for example, two chassis or enclosures 14, 16, as shown. Enclosure 14 is sometimes referred to herein as a Disk Processor Enclosure (DPE) and enclosure 16 is sometimes referred to herein as a Disk Array Enclosure (DAE). The DPE 14 and DAE 16 will be described in more detail in connection with FIGS. 2 and 3, respectively. Suffice it to say here that DPE 14 includes a pair of front end controllers 18a, 18b, each having a pair of ports coupled to the pair of host computer/servers 12a, 12b, as shown. The DPE 14 also includes a pair of storage processors 20a, 20b coupled to each other with storage processor 20a being connected to front end controller 18a and storage processor 20b being connected to front end controller 18b, as shown. The storage processors 20a and 20b are connected to a bank of disk drives 22a-22n though a plurality of multiplexers 24a-24n, as shown.

The storage processors 20a, 20b of DPE 14 are connected to the DAE 16 though a pair of cables 130a, 130b, respectively, as shown. As will be described in more detail in connection with FIG. 3, the DAE 16 includes additional disk drives 22'a-22'n, here for example, twelve disk drives, and is used to increase the storage capacity of the data storage system 10. Thus, in this example, the number of disk drives 22a-22n in DPE 14 is twelve and the user has chosen to expand the storage capacity to twenty four disk drives by connecting the DAE 16 which in this example includes twelve disk drives 22'a-22'n.

Figure 2:
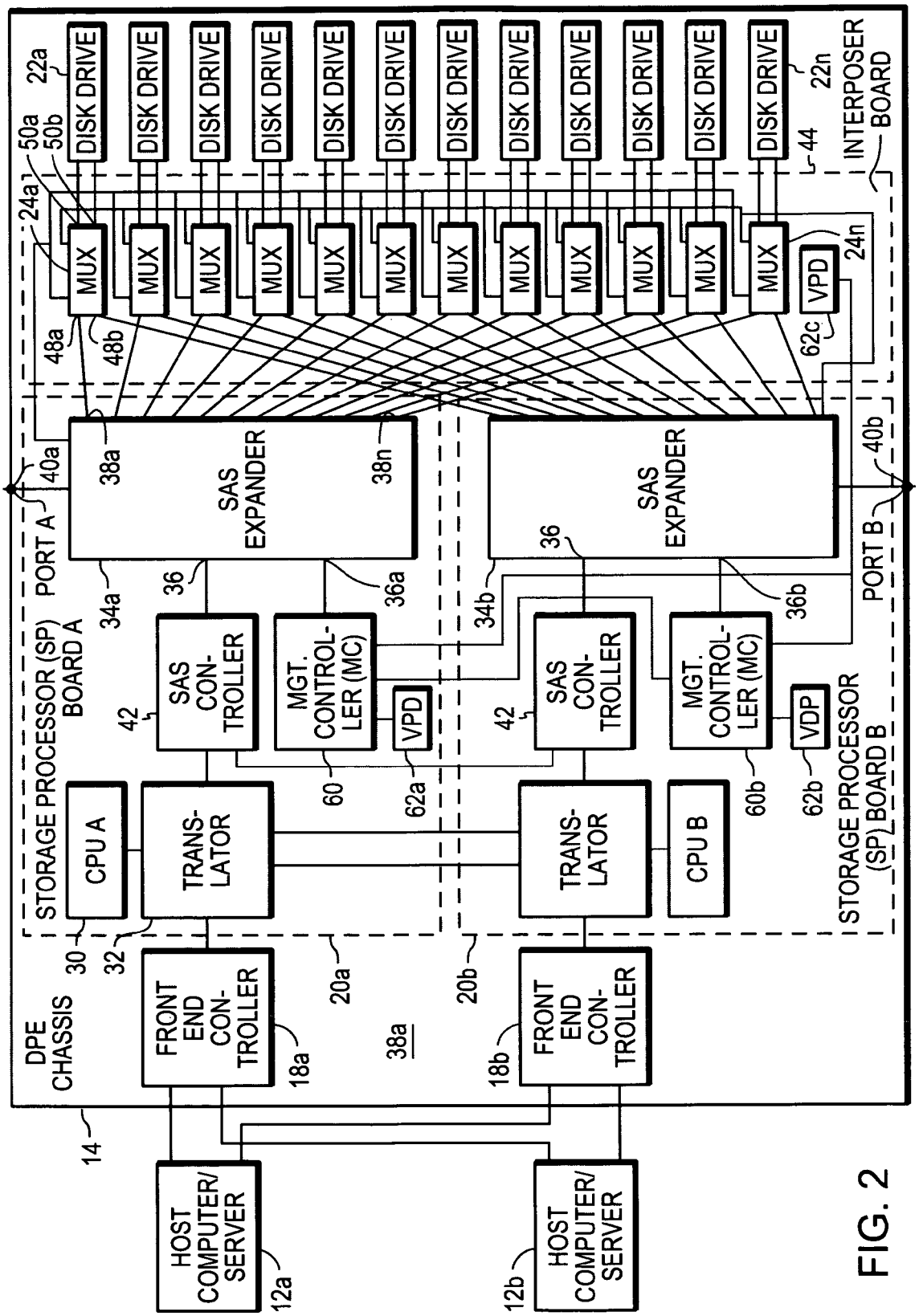

Referring now to FIG. 2, the DPE 14 is shown to include the pair of storage processors 20a, 20b, each disposed on a corresponding one of a pair of printed circuit boards STORAGE PROCESSOR (SP) BOARD A and STORAGE PROCESSOR (SP) BOARD B, respectively, as indicated. Each one of the printed circuit boards has disposed thereon: (a) a processor 30; (b) a translator 32 controlled by the processor 30; (c) a SAS expander 34a on STORAGE PROCESSOR (SP) BOARD A and SAS expander 34b on STORAGE PROCESSOR (SP) BOARD B each having a bidirectional front end port 36 and a plurality of bidirectional backend ports 38a-38n, and an expansion port 40a for STORAGE PROCESSOR (SP) BOARD A and 40b STORAGE PROCESSOR (SP) BOARD B; and (d) a SAS controller 42 coupled between the translator 32 and the expander controller 34; as shown. The DPE 14 also includes an interposer printed circuit board 44 having thereon the plurality of, here twelve, multiplexers 24a-24n.

Each one of the multiplexers 24a-24n has: (a) a pair of bidirectional front end ports 48a, 48b; and (b) a pair of bidirectional back end ports 50a, 50b. For each one of the plurality of multiplexers 24a-24n, a first one of the pair of bidirectional front end ports for example port 48a is connected to a corresponding backend port 38a of the SAS expander 34a disposed on a first one of the pair of storage processor printed circuit boards, here STORAGE PROCESSOR (SP) BOARD A; and a second one of the pair of bidirectional front end ports 48b is connected to a corresponding backend port 38n of the SAS expander 34b disposed on a second one of the pair of storage processor printed circuit boards here STORAGE PROCESSOR (SP) BOARD B.

As noted above, the DPE 14 includes a plurality of disk drives 22a-22n. Each one of the disk drives is coupled to at least one backend port 50a, 50b of a corresponding one of the plurality of multiplexers 22a-22n. More particularly, in the disk drive 22a-22n is a SAS disk drive having a pair of ports, as shown in FIG. 2, the pair of ports is connected to the pair of backend ports of the multiplexer; on the other hand, if the disk drive is a SATA disk drive having a single port the signal port is connected to only one of the pair of backend ports of the multiplexer. The multiplexers are here active multiplexers described in the above referenced pending patent application the subject matter thereof being incorporated herein by reference.

The DPE 14 also includes a pair of management controllers 60, each one being disposed on a corresponding one of the pair of storage processor printed circuit boards here STORAGE PROCESSOR (SP) BOARD A and here STORAGE PROCESSOR (SP) BOARD B, as shown. A first of the pair of management controllers 60, here the controller 60 disposed on STORAGE PROCESSOR (SP) BOARD A includes an additional front end port 36a of the SAS expander 34 disposed on such storage processor printed circuit boards and the second one of the pair of management controllers 60 disposed on the STORAGE PROCESSOR (SP) BOARD B is coupled to an additional front end port 36b of the SAS expander 34, as shown.

Monitors 62a, 62b, 62c herein sometimes referred to as a Vital Product Data (VPD), are disposed on the STORAGE PROCESSOR (SP) BOARD A, STORAGE PROCESSOR (SP) BOARD B and interposer board 44, respectively, as shown. The monitors 62a, 62b, and 62c are coupled to the pair of management controllers 60 on the STORAGE PROCESSOR (SP) BOARDS A and B, as shown. Vital Product Data includes information programmed by the factory into a "resume" EEPROM on some Field Replaceable Units (FRUs), generally containing some unique information on each part such as a World Wide Number and serial number. The term "VPD" is often used to refer to the EEPROM itself. Here, there is a VPD EEPROM on each STORAGE PROCESSOR (SP) BOARD A, STORAGE PROCESSOR (SP) BOARD B and interposer board 44.

Figure 3:
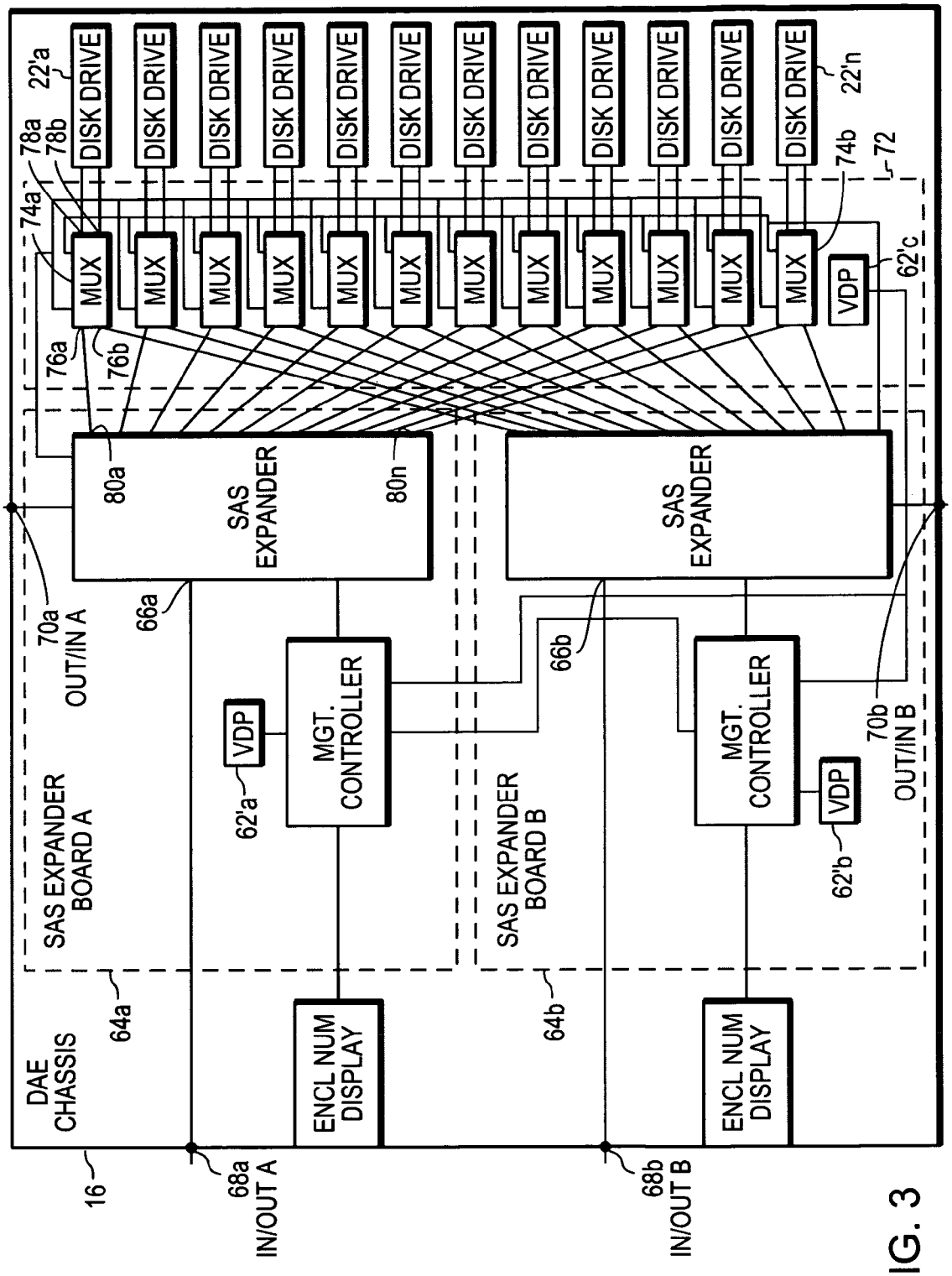

Referring now to FIG. 3, DAE 16 is shown to include a pair of SAS expander printed circuit boards 64a, 64b, a pair of SAS expanders 66a, 66b, each one being disposed on a corresponding one of the pair of SAS expander printed circuit boards 64a, 64b, each one of the pair of SAS expanders 66a, 66b has a bidirectional front end expansion port 68a, 68b, respectively, and a bidirectional backend expansion port 70a, 70b, respectively.

Also included in DAE 16 is an interposer printed circuit 72 board. A plurality of, here twelve, multiplexers 74a-74n is disposed on the interposer printed circuit board 72, each one of the plurality of multiplexers 74a-74n includes (a) a pair of bidirectional front end ports 76a, 76b; (b) a pair of bidirectional back end ports 78a, 78b. For each one of the multiplexers 74a-74n, a first one of the pair of bidirectional front end ports here port 76a, for example, is connected to a corresponding one of backend ports 80a-80n of the SAS expander 66a and a second one of the pair of bidirectional front end ports, here 76b, for example, is connected to a corresponding backend port of the SAS expander 66b as shown. The DAE 16 includes, as noted above, the plurality of disk drives 22'a-22'n, each one being coupled to at least one backend port 78a, 78b of a corresponding one of the plurality of multiplexers 74a-74n. More particularly, in the disk drive 22'a-22'n is a SAS disk drive having a pair of ports, as shown in FIG. 3, the pair of ports is connected to the pair of backend ports of the multiplexer; on the other hand, if the disk drive is a SATA disk drive having a single port the signal port is connected to only one of the pair of backend ports of the multiplexer. The multiplexers are here active multiplexers described in the above referenced pending patent application the subject matter thereof being incorporated herein by reference.

Referring again also to FIGS. 1 and 2, the bidirectional front end expansion ports 40a, 40b of SAS expanders 34a, 34b are connected to the expansion ports 70a, 70b, respectively, as shown. Thus, SAS expander 34a is connected to SAS expander 64a through cable 130a and SAS expander 34b is connected to SAS expander 64b through cable 130b. Thus, referring to FIG. 1, data can pass between any one of the host computer/servers 12a, 12b and any one of the here twenty four disk drives 22a-22n and 22'a-22'n.

Referring again to FIG. 3, as with DPE 14 (FIG. 2) the DAE 16 includes a pair of management controllers, each one being disposed on a corresponding one of the pair of expander printed circuit boards, a first of the pair of expansion board management controllers being coupled to an additional front end port of the SAS expander disposed on the first one of the pair of expander printed circuit boards and a second one the pair of expansion management controllers being coupled to an additional front end port of the SAS expander disposed on the second one of the pair of expander printed circuit boards.

Further, as with the DPE 14, the DAE 16 includes monitors 62'a, 62'b, 62'c having Vital Product Data (VPD) as well as enclosure numerical displays.

Figure 4:
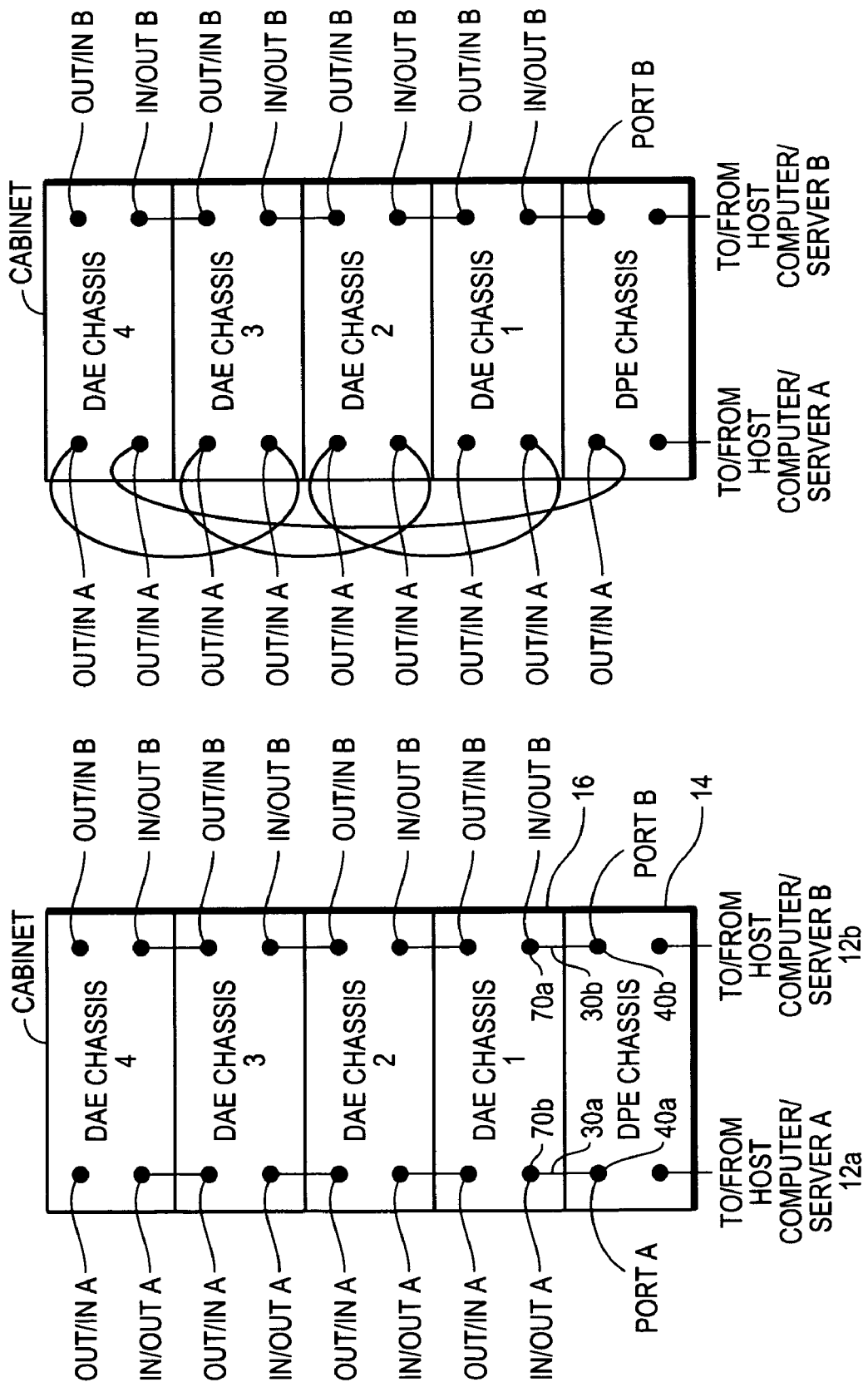
FIGS. 4-6 are block diagrams of interconnections of enclosures in a RAID data storage system with SAS expansion.

Thus, the data storage system 10 (FIG. 1) may be further expanded as shown in FIG. 4 in a cabinet here having four DAEs 16 and a DPE 12. As noted above, here a DPE has up to 12 disk drives, and each one of the four DAEs, has 12 disk drives to provide, in this example, a data storage system having up to 60 disk drives. Enclosures can be wired up in various ways, two of which are shown in FIG. 4 and another being shown in FIG. 4A. The connections between enclosures consist of standard SAS signals and cables.

Each one of the cables includes four SAS lanes so that at any one instant in time, at most 4 messages can be going to 4 different drives, but successive messages can be sent to different drives using the same SAS lane. Those 4 lanes are also used to send traffic to drives on downstream expanders, so a message can be sent on one of the input lanes, out one of the 4 output lanes to an input lane on the next box.

Here, in the DPE there are eight lanes between the translator and the SAS controller; four SAS lanes between the pair of SAS controllers; one SAS lane between each multiplexer and a backend SAS port; and four lanes at each of the expansion ports 40a, 40b. For each DAE there are four SAS lanes between each one of the ports 70a, 70b and the connected one of the pair of SAS expanders 64a, 64b, respectively, and one SAS lane between each multiplexer and a backend SAS port.

Cabling

Figure 5:
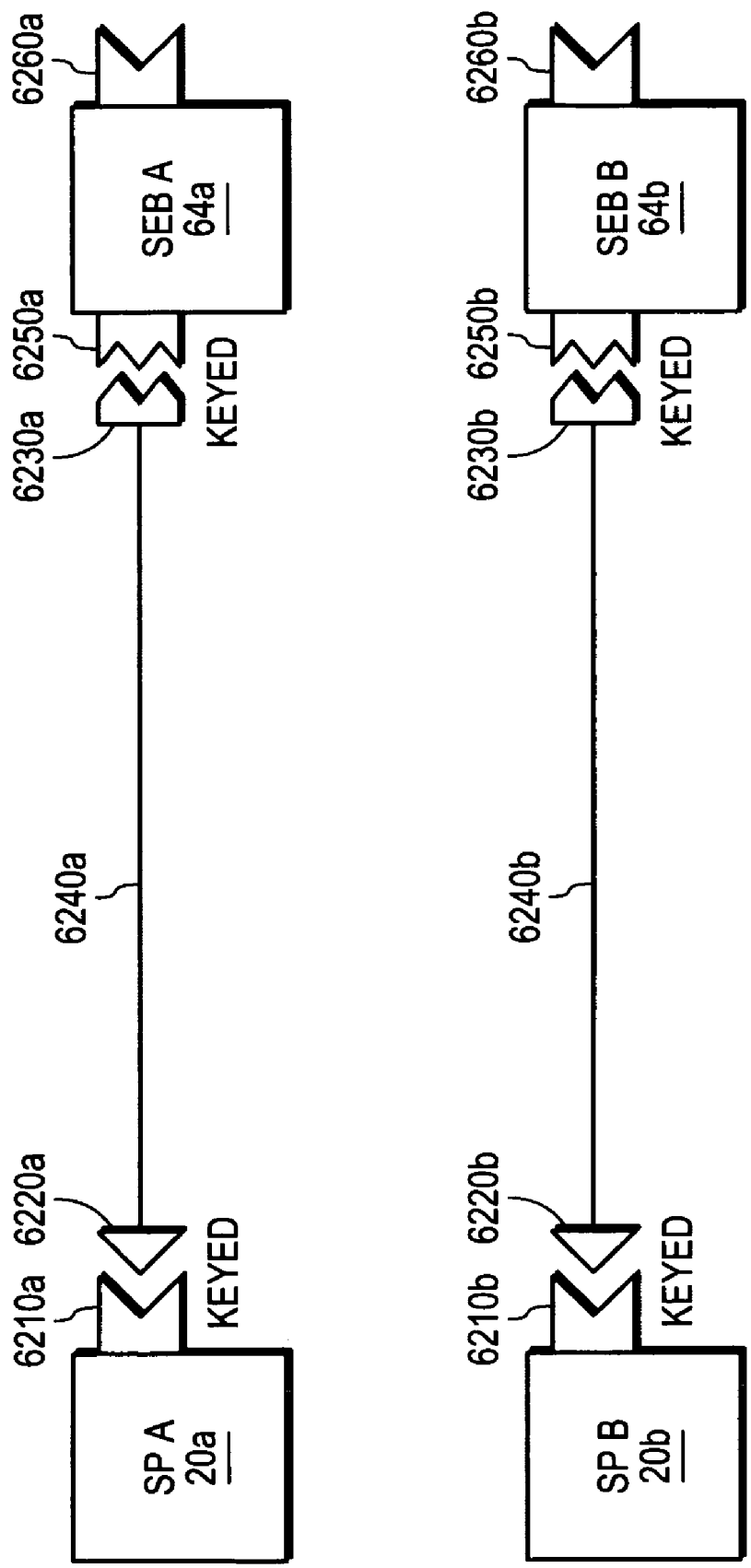

Cables and expansion port connectors are keyed as shown conceptually in FIG. 5. Each SP 20a, 20b has an output (i.e., backend) connector 6210a, 6210b and each SAS Expander Board (SEB) 64a, 64b of a DAE has an input (i.e., front end) connector 6250a, 6250b and an output (i.e., backend) connector 6260a, 6260b, and each cable 6240a, 6240b has an input (i.e., front end) plug 6220a, 6220b and output (i.e., backend) plug 6230a, 6230b. Thus, with such cable/connector keying, it is impossible for a user to connect two input or two outputs together. Thus, the only way to connect SEBs together is in a daisy chain or linear fashion, and there can be at most one SP at one end in a chain of SEBs. A fully cabled system will have exactly two vacant output connectors, and a new DAE is always shipped with two cables to fill those vacancies.

Given these constraints, and referring to FIGS. 4, 4A as well, there are 4 types of cabling errors that the customer can make:

1. Cross-wiring an A side of a DPE or DAE to a B side of a DAE.
2. Wiring an SAS Expander Board (SEB) 64a, 64b, to itself in a loop, either directly by plugging its output to its input, or indirectly through other SEBs. A loop like this cannot connect to a STORAGE PROCESSOR BOARD (SP).
3. Forgetting to connect anything to the input on one SEB while the peer SEB is wired up.
4. Wiring the two SEBs on a DAE to STORAGE PROCESSOR BOARDS (SPs) on different arrays
5. or some combination of above.

Thus, each DPE and each DAE or each pair of DAEs are, as noted above, connected through only a pair of cables. Thus, considering a DPE/DAE connection, as shown in FIG. 5: (A) a first cable has a front end keyed terminator connected to the keyed expansion connector of a first one of the pair of SAS expanders and a backend keyed terminator connected to the front end keyed connector of a first one of the pair of SAS expanders; and (B) a second cable having a front end keyed terminator connected to the keyed expansion connector of a first one of the pair of SAS expanders and a backend keyed terminator connected to the front end keyed connector of a second one of the pair of SAS expanders.

Figure 6:
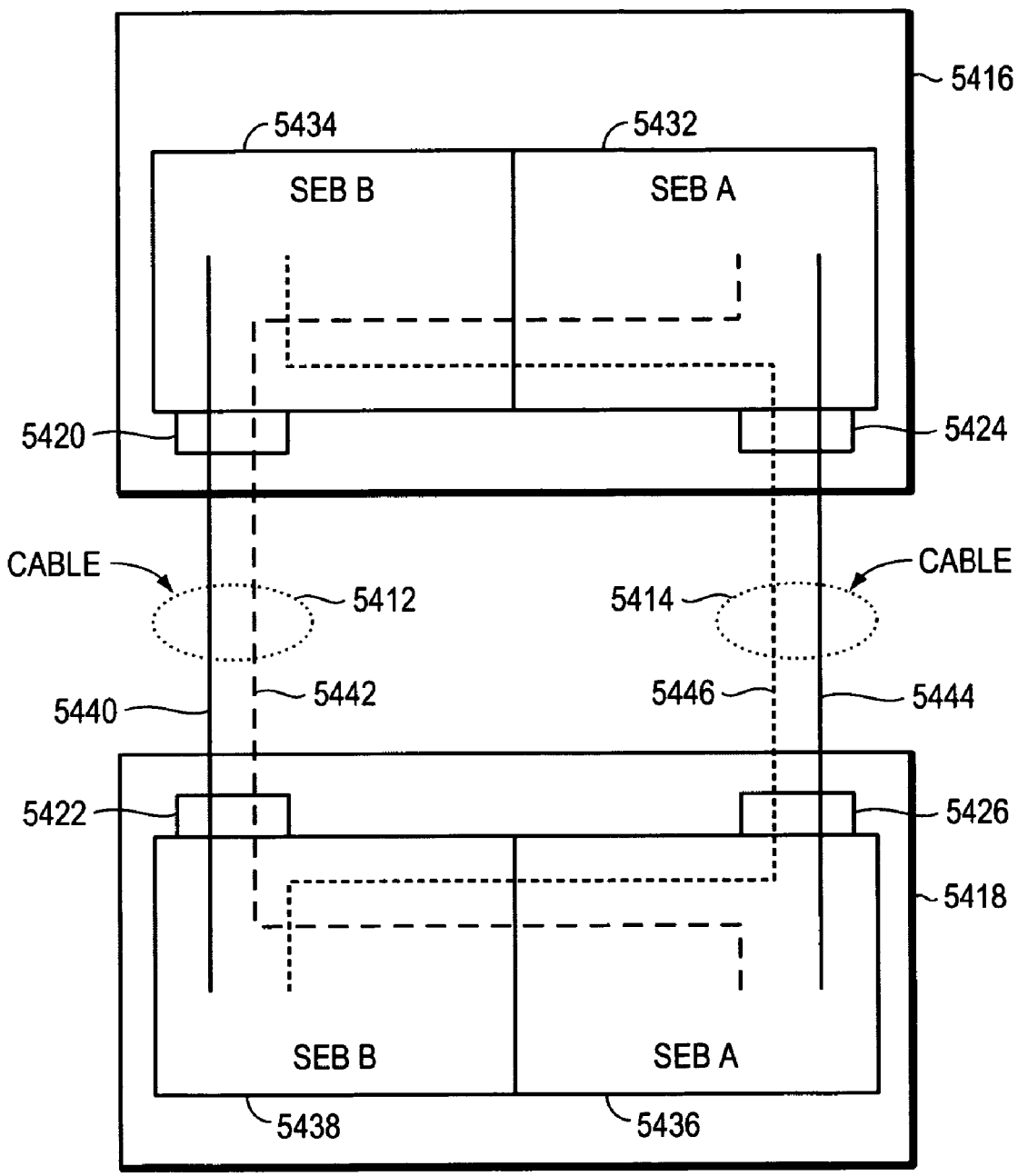

In at least one embodiment as illustrated in FIG. 6, a cross-cabling arrangement may be provided in which each SAS port has a redundant path through another cable to help avoid connectivity loss if one cable is removed.

Under normal circumstances cables 5412, 5414 connect enclosures 5416, 5418. In particular, enclosure 5416 has connectors 5420, 5424 and enclosure 5418 has a connectors 5422, 5426; cable 5412 connects between connector 5420 and connector 5422 and cable 5414 connects between connector 5424 and connector 5426.

Enclosure 5416 has an SEB A 5432 and an SEB B 5434, and enclosure 5418 has corresponding SEB A 5436 and SEB B 5438.

Datapaths 5440, 5442 are carried by cable 5412, and datapaths 5444, 5446 are carried by cable 5414. Datapaths 5440,

5446 link SEB B 5434 and SEB B 5438. Datapaths 5444, 5442 link SEB A 5432 and SEB A 5436.

Thus, each SEB has two datapaths to its corresponding SEB in the other enclosure, one carried by each cable.

If one of the cables becomes disconnected, each SEB retains one datapath to its corresponding SEB. For example, if cable 5412 is disconnected, datapaths 5440, 5442 are lost, but SEB B 5434 can still communicate with SEB B 5438 through datapath 5446, and SEB A 5432 can still communicate with SEB A 5436 through datapath 5444. Similarly, if instead cable 5414 is disconnected, datapaths 5446, 5444 are lost, but SEB B 5434 can still communicate with SEB B 5438 through datapath 5440, and SEB A 5432 can still communicate with SEB A 5436 through datapath 5442.

Each data path may include two conductors, and the crossovers may be internal to the SEBs. As shown, loss of a single cable between corresponding SEBs does not remove connectivity between the SEBs. Depending on the implementation, such a loss may merely cause a loss of bandwidth (e.g., half the bandwidth) between the SEBs.

Automatic Enclosure Numbering

Now described is an enclosure numbering strategy that specifies the system's behavior under component-swapping scenarios. An enclosure (disk array enclosure (DAE) 16 or disk processor enclosure (DPE)) 14 may be "swapped" (as described below), and one or more components (one or more of 3 main boards or 12 drives) of the enclosure may be swapped. Methods described below apply regardless of:
- whether an original component failed,
- whether a replacement component is brand new or was previously used in the instant array or another array, DPE, or DAE
- the configuration of the array
- cabling order
- whether the swap is a hot swap (where possible) or a cold swap
- whether power is on or off
- whether an enclosure operating system ("Flare") is online or offline.

Each DAE has 2 SAS expander boards (SEBs) 64a, 64b and 1 interposer board 72. A DPE has 2 storage processors boards (SPs A and B) 20a, 20b and 1 interposer board 44. A DPE or DAE has 0-12 drives. There is only one part number of each type of part: SP, SEB, DPE, DAE, interposer, and drive of a given type, regardless of where it is used. For example, SP A and SP B are identical, distinguished only by which side of the DPE they are plugged into.

Any of the 3 boards in an enclosure or a drive, except for an SP, can be one of two states: owned or unowned state. This state persists across boots and power outages:

Unowned: A component leaves the factory in unowned state, and remains in that state until the first time its DPE or DAE is accepted into an array by Flare.

Owned: When Flare accepts a DPE or DAE for use by the array, it takes ownership of all the boards and drives that are not bypassed. Flare creates a unique signature for each new DAE or DFE and writes that information to each board and drive, keeping a copy of this information in a database to indicate which DPE and DAEs belong to the current array. A board or drive is thus owned by a DAE or DPE which in turn is owned by an array. Once owned, a component can only be restored to an unowned state through a special maintenance function that resets all the components in a DAE or DPE to unowned state with one command.

The signature that Flare writes to a board (e.g., in EEPROM) or drive (as data) uniquely identifies the DAE or DPE it belongs to, the enclosure number, and (for drives) the slot number. In the case of drives, the term "signature" as used herein includes parts of both a field replaceable unit (FRU) signature and FRU ID currently stored on drives.

Flare can read the signature of any board or drive and determine which DAE or DPE owns it and whether that DAE or DPE is part of the current array. In a DAE, an SEB can read its own signature as well as the signature on the other 2 boards. Therefore, an SEB can determine (without input from Flare) whether any board in a DAE is unowned or owned, whether all boards are all owned by the same DAE, and the enclosure number of the DAE that owns them. Boards cannot read the signatures on drives.

A DAE or DPE chassis does not have any memory itself, and therefore has no signature. When populated with drives and boards, it has one of three states derived from the signatures of the components within it. A minimal DAE that can be powered up and recognized by an array contains an interposer and one SEB.

The first two states are "normal":

Unowned state: all boards and drives present in the DAE are unowned. No instance of Flare has ever recognized the drives or boards in this enclosure. This state typically persist only immediately after manufacturing, before the box is first connected to an online array. An unowned enclosure has no enclosure number.

Owned state: the DAE is owned by a particular array. This state occurs when at least one board in the DAE is owned, and all owned boards and more than half the owned drives are owned by the same DAE, and the signatures of the boards and drives are stored in Flare's database. Normally an enclosure is owned by the array to which it is connected. An owned DAE displays the enclosure number that is stored in the signatures on the boards.

Undefined state: more than half the owned drives and all the boards have signatures that do not match the same DAE. The DAE may or may not have an enclosure number displayed. A DAE in this state is normally converted to owned state when it becomes online to Flare, providing Flare (possibly with user assistance) accepts the enclosure into the array. A DAE has undefined ownership only after a cold swap of boards or drives with boards or drives owned by another DAE.

Unowned drives and boards, or drives bypassed by Flare, do not contribute to the determination of owned or undefined states of DAEs.

DPEs are always considered owned by the array defined in the first 3 Flare database drives in the DPE. Once Flare boots, the owner of the interposer board on the DPE is set to the current DPE.

Each SEB has an enclosure number display, a single digit that displays either an "unknown" symbol (such as a dash) or an enclosure number, either of which may be blinking or solid (or off, in the case of no power). The enclosure number of a DPE is always 0. It is not necessary for enclosure number 0 to blink.

In a normal case, when an unowned DAE powers up, both SEBs display a blinking unknown symbol. When Flare boots and detects the unowned DAE, it takes ownership of the DAE and all components within it and assigns an enclosure number to them. Flare then causes a solid enclosure number to be displayed on both SEBs. Any unowned or owned drives plugged into an owned DAE while the DAE is online and accepted by Flare, become owned by the array (providing the user accepts the drives if prompted by Flare). If Flare does not accept the enclosure, the number or unknown symbol remains blinking. Thus, a blinking number means the enclosure is not online to a Flare system, or that none of the enclosure's drives are being used by Flare (the enclosure may still be used as a pass-through to other enclosures and enclosure errors may still be detected).

Once Flare has taken ownership of a DAE, the next time the owned DAE powers up, if all 3 boards have the same signature, the SEBs display their blinking enclosure number until Flare recognizes and accepts the DAE and tells the SEBs to display the numbers solid. The blinking enclosure number that a DAE displays on its own, before Flare brings it online, is based only on information on the boards, not the drives.

A blinking unknown symbol at power up, before Flare comes online, means that the SEB cannot determine the DAE's enclosure number. It generally means that the DAE is unowned, but it could instead mean that the 3 boards have different signatures. This always corresponds to the undefined ownership state of the box.

In one case, a DAE's ownership state may be undefined because the drives do not match the boards, but since the SEBs cannot read drives, they may show a blinking number different from the number of the DAE that owns the drives. This happens only if many drives are moved from one DAE to another or if multiple boards are swapped from an owned DAE to another.

If one of the SEBs is unable to communicate with the other (because the other SEB was removed, not powered up, lost connectivity, or had some catastrophic failure) an enclosure fault LED turns on, and the enclosure number on the SEB blinks if the remaining two boards have the same signature, or shows unknown if not.

Whenever one SEB displays an enclosure number, the other SEB displays either a blinking unknown or the same enclosure number—there is no case in which they would display different blinking numbers. A solid enclosure number displayed on an SEB means that Flare on the corresponding SP for that loop has taken ownership of the DAE and is using drives in that DAE. If either SP takes ownership of a DAE, all the components in the DAE become owned.

A DAE is understood to be displaying its enclosure number when both SEBs, if functioning, display the same number.

When Flare detects that a DAE has come online, and that more than half of the owned drives have a signature for the same DAE, Flare uses the signature on the drives, not on the boards, to identify the enclosure. In normal cases this result agrees (is consistent with) the boards. If not, and Flare chooses to accept the enclosure, Flare rewrites the signatures on the boards to match that of the drives, and this may change the enclosure number that displays on the DAE in the odd case above. Upon accepting the enclosure Flare also writes signatures on any unowned drives.

If the DAE has no owned drives, or half or fewer of the owned drives have signatures for this DAE, Flare uses the boards and/or the remaining drives to resolve the identity of the enclosure, possibly with user assistance through storage management software ("Navi"), as described in use cases described below. If Flare accepts the enclosure, it rewrites the signatures on all parts to agree, with a user prompt if drives with data on them might be overwritten because they are owned by other DAEs or are in the wrong slots on this DAE.

If a DAE is powered up while connected to an operational Flare array, the user may never notice a period of a blinking unknown symbol or enclosure number—Flare may accept the enclosure quickly enough so that the display shows solid right away. If a DAE previously online to an array is disconnected, or if Flare (on both SPs) becomes nonfunctioning, the solid enclosure number reverts to blinking again.

Boards and drives retain their own signatures and Flare retains records of all recognized components in its database. Whenever Flare recognizes a new enclosure, changed enclosure, or removed enclosure, Flare updates its database if necessary.

As used herein, the terms "accepted" and "rejected" pertain to a DAE or disk drive that is powered up and has at least one side connected and available for responsive communication with ("visible to") a functioning Flare system. The terms do not pertain to unconnected or powered-down DAEs.

If a DAE is rejected, it remains visible to the system but is not considered online to that system, and all of its drives are considered offline. A rejected DAE always displays an enclosure fault LED indication and blinking enclosure number. A DPE is always considered accepted by the Flare system running in it.

An individual drive may be accepted or rejected if its enclosure is accepted. A rejected (also called bypassed) drive is not considered online to the system even if the DAE is online.

By default, Flare attempts to accept all DAEs and drives with which it can communicate. In general, it only rejects a DAE or drive if that component has conflicting information or if accepting the component risks data loss, and the user does not authorize the acceptance when prompted. Once accepted by a running Flare system, the component cannot be rejected while it remains online to Flare. On the next boot or power cycle, if no physical part was replaced or moved, Flare accepts all the same components even if cabling between DAEs has changed.

The meanings of "hot swap" and "cold swap" depend on a customer replaceable unit (CRU) being added or replaced. Hot swap for a board (an SEB or SP) means that the DAE or DPE was already powered on prior to board insertion, and means that the other SEB or SP is providing power to the enclosure. Flare does not need to be running. All other board swaps are cold swaps.

Hot swap for a drive means that its DAE or DPE is accepted by a running Flare system at the time of drive insertion, regardless of the state of the previous drive in the slot prior to the insertion. Therefore drive swaps on a powered-up DPE where Flare is not running on either SP, or on a powered-up DAE that is not connected to or is bypassed by Flare, are considered cold swaps. All other drive swaps are cold swaps.

Hot swap for an entire DAE means that the array is powered up and Flare is running at the time the first cable of a powered-up DAE is connected to the array, so that Flare sees the DAE being added. If Flare is not online when the DAE is added, it is a cold swap.

If one of the redundant power supplies in an enclosure is working, the enclosure is considered powered on. All swaps on a powered-off enclosure are cold swaps, but drive swaps on a powered-on enclosure can also be cold swaps if done while the enclosure is bypassed.

Some operations (e.g., replacement of an interposer) can only be done as cold swap. Some operations involving multiple part replacement are much more readily handled when done incrementally as hot swaps rather than all at once as a cold swap (e.g., replacing both SEBs or all drives in a RAID group).

In a few unlikely cases behavior of the system is different depending on whether a swap is a hot swap or a cold swap. In general a hot swap does not result in a change to any of the components of the system other than the one being inserted (e.g., a running DAE never changes its enclosure number if a board is swapped or drives are swapped), while a cold swap could affect other components that were not swapped, by causing their signatures to be eventually overwritten, as described below A DAE or DPE is online if at least one of the two sides of the enclosure is recognized by a running Flare system and, in the case of a DAE, the DAE is accepted into the array. For a DPE this means Flare is running on at least one of the SPs, and for a DAE it means at least one side is connected to a running Flare system that has accepted it. A DAE connected to a running Flare system but rejected (i.e., bypassed) is considered offline, even though Flare needs to communicate with it in order to route I/O data to downstream enclosures. An offline DAE always displays an enclosure fault LED and blinking enclosure number.

A cold swap is always considered an offline swap. A hot swap of a component in a DAE or DPE, can be either online or offline, depending on whether the enclosure is online or offline at the time of insertion. A hot or cold swap of an entire DAE or DPE is always considered an offline swap, even in the case where the DAE is connected to an array already online. In other words, "online swap" only applies to SEBs, SPs or drives.

When a DAE or disk drive first becomes visible to Flare (after a boot, connection, or power-up), Flare undergoes a discovery procedure to decide whether to accept or reject it, possibly accompanied by user prompts. Once accepted, it stays accepted as long as it remains online, i.e., remains in communication with Flare. An accepted DAE, as long as at least one SEB remains online, remains accepted no matter how many boards or drives are removed or added while power is on, and no additional discovery takes place after such swaps.

If a drive in an accepted DAE is rejected the drive stays rejected until it is removed. If it is reinserted, another discovery of the drive takes place.

If a DAE is rejected, it stays rejected until the DAE is completely disconnected from the array or powered off, a board or drive is swapped or the user requests a rediscovery. After insertion of a drive or board in a rejected DAE, Flare again attempts a discovery identical to the initial discovery after a power-up, with possible prompts. This may cause the DAE to be accepted or rejected again.

In addition to discovery automatically initiated by swapping, Navi also gives the user the option to retry discovery of a DAE or drive that was previously rejected after a prompt, even if nothing has changed. This allows the user who initially answered "no" to the prompt to change his answer to "yes". (A "yes" answer cannot be changed to "no".) Details of the discovery procedure are described below in use case descriptions. The use cases may be categorized into online and offline cases. "Online" refers to circumstances, e.g., swaps, that take place while the DAE is online. "Offline" refers to circumstances, e.g., swaps, that take place while the DAE is offline. In online cases, Flare is always aware of which components have been swapped and which have not been swapped, and Flare relies on a rule that a component not being swapped will never change its identity (its indication of the DAE to which it belongs) while online. Accordingly, swapping boards and drives has no effect on the identity of the remaining boards and drives, and the identity of the inserted components is straightforward to determine. In offline cases, Flare deduces which parts have been swapped during the offline period. Since an enclosure's identity is based entirely on the components within it, swapping multiple parts can change an enclosure's identity.

Now described are use cases in which a DAE was offline and then is brought online, wherein one or more boards or drives may have been swapped while it was offline. This includes-both cold (power off) and hot swaps, including simply disconnecting and reconnecting a DAE to an array without making any changes or adding a DAE to an array already running.

In the case of a hot swap of an SEB or SP while offline, the DAE or DPE has power but Flare is not running or has not accepted the DAE or DPE (hereinafter "DAE" denotes either a DAE or a DPE unless otherwise specified). For a DAE in this state, the SEB not being swapped (unswapped SEB) displays (indicates its identity with) either an enclosure number or an "unknown" symbol. If it displays an enclosure number, the inserted board's signature displays that same number after the swap (if the inserted board is unowned when inserted, its signature is set to match that of the unswapped SEB). If the unswapped SEB displays "unknown", the inserted board also displays "unknown" and its signature is not set. In no case does an offline DAE rewrite the signature of an already identified SEB.

The user can replace both SEBs, one at a time, with boards from another DAE, and both SEBs can display an enclosure number that does not match the original number from either SEB's signature. This follows the rule that a DAE's enclosure number, once displayed at power up, never changes until power cycled again or when brought online to Flare.

If an offline DAE (not DPE) is bypassed at the time the user inserts an SEB, Flare attempts a discovery after the insertion, just as if the DAE had just been powered up or connected, and the DAE's enclosure number may change as a result of the insertion.

For an offline DPE, the user sees no visible change when inserting an SP, since the enclosure number is always zero.

Now described is the DAE's behavior at power on, prior to being brought online, after a possible cold board swap.

Figure 9:
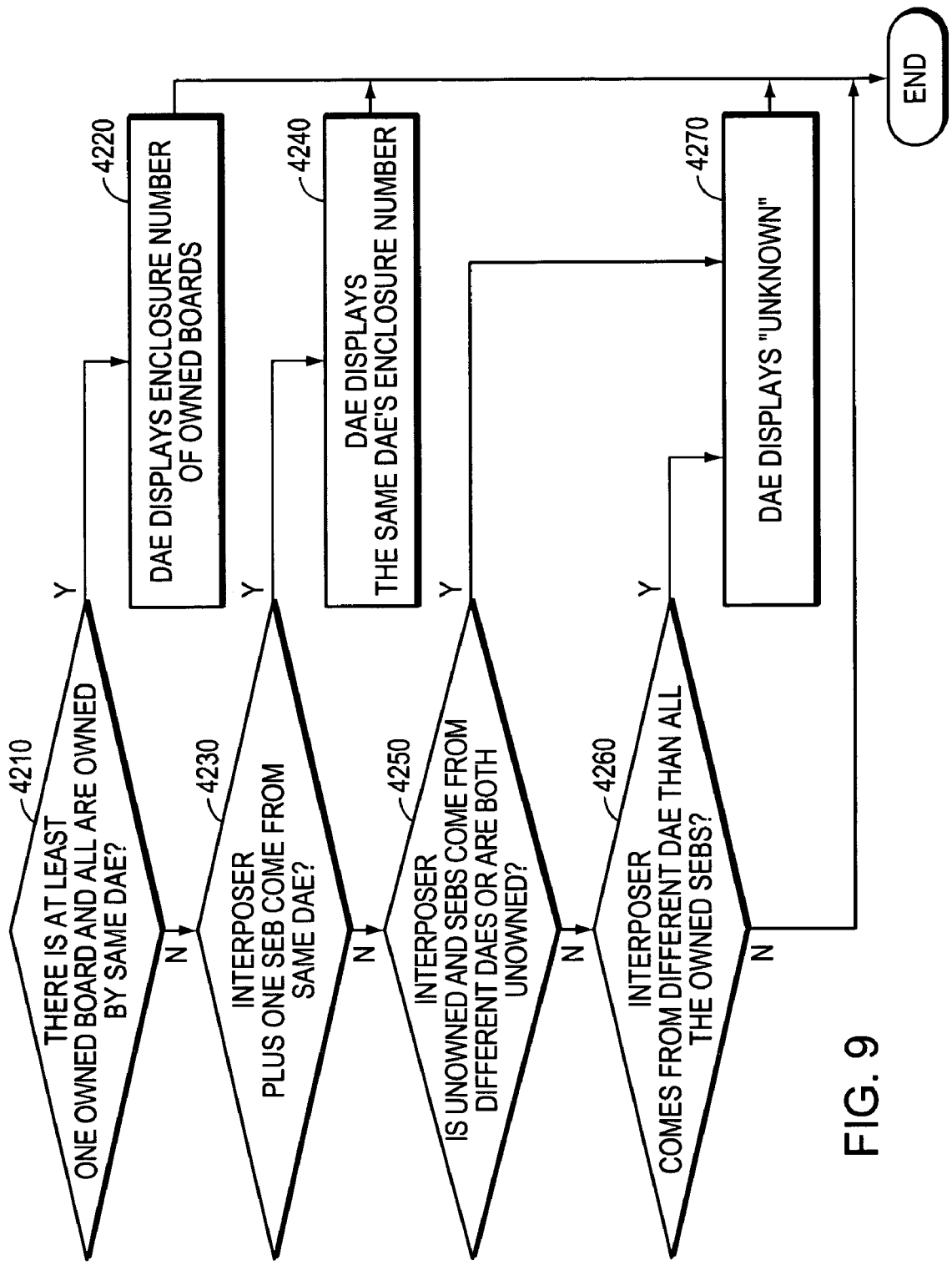
FIGS. 9-11D are flow diagrams of procedures for use in a data storage system.
Figure 10A:
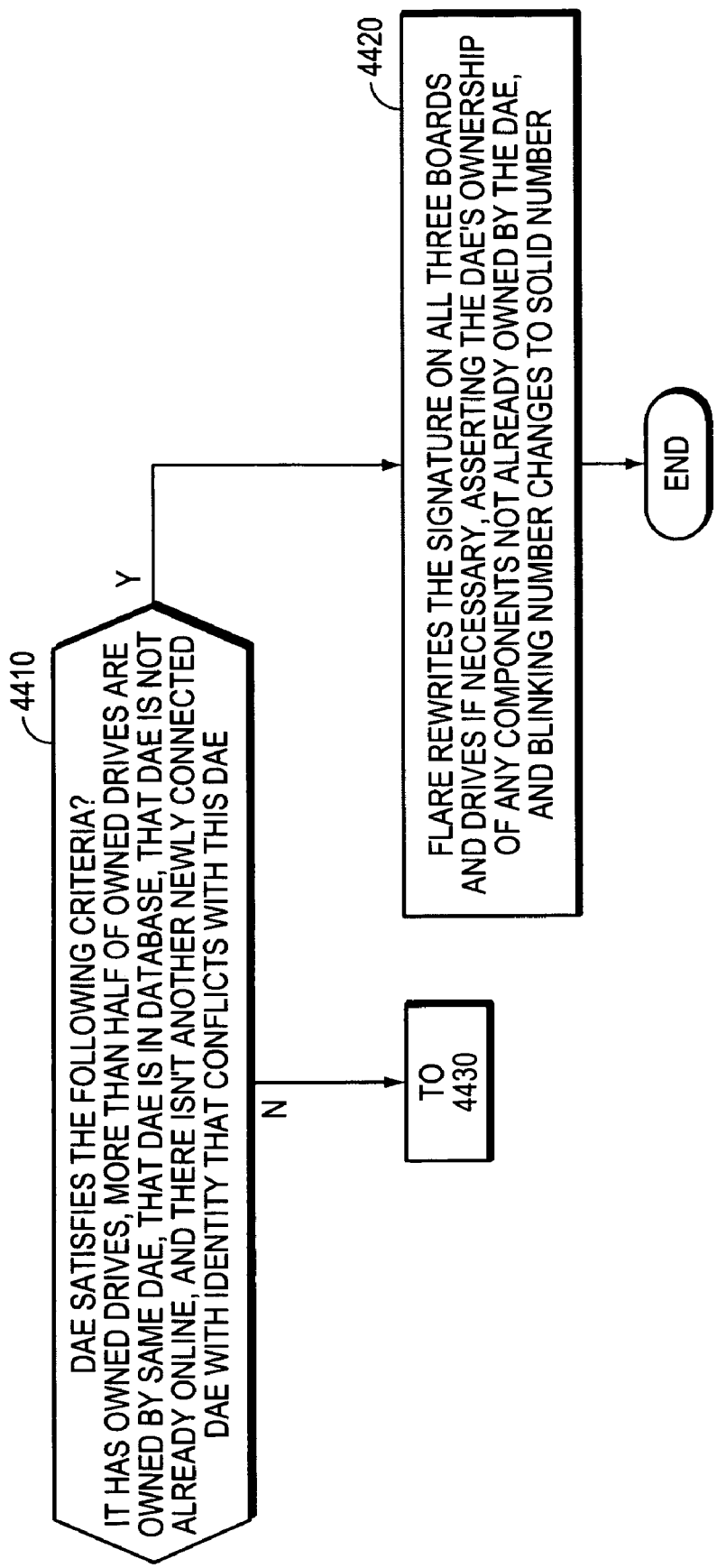
Figure 10B:
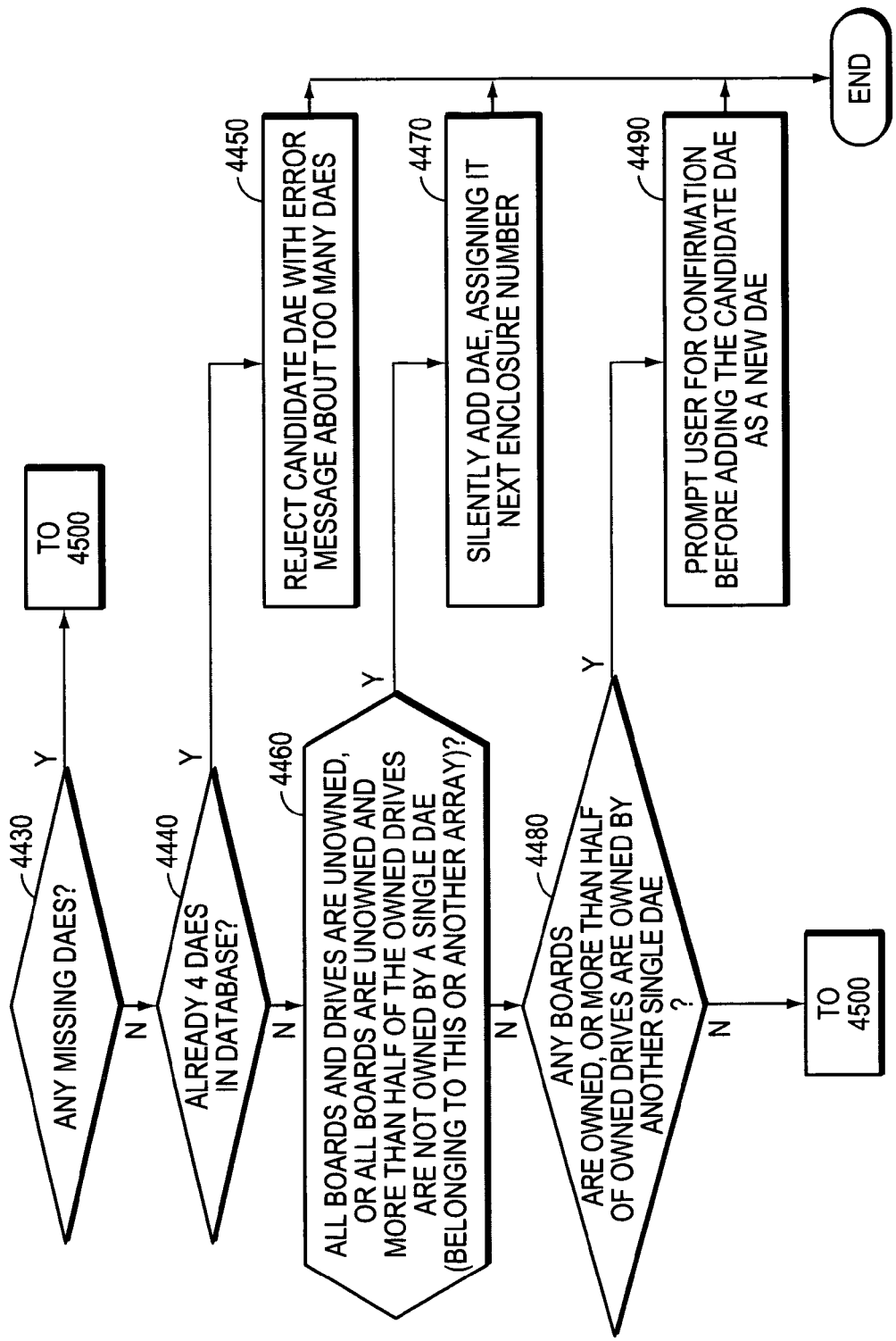
Figure 10C:
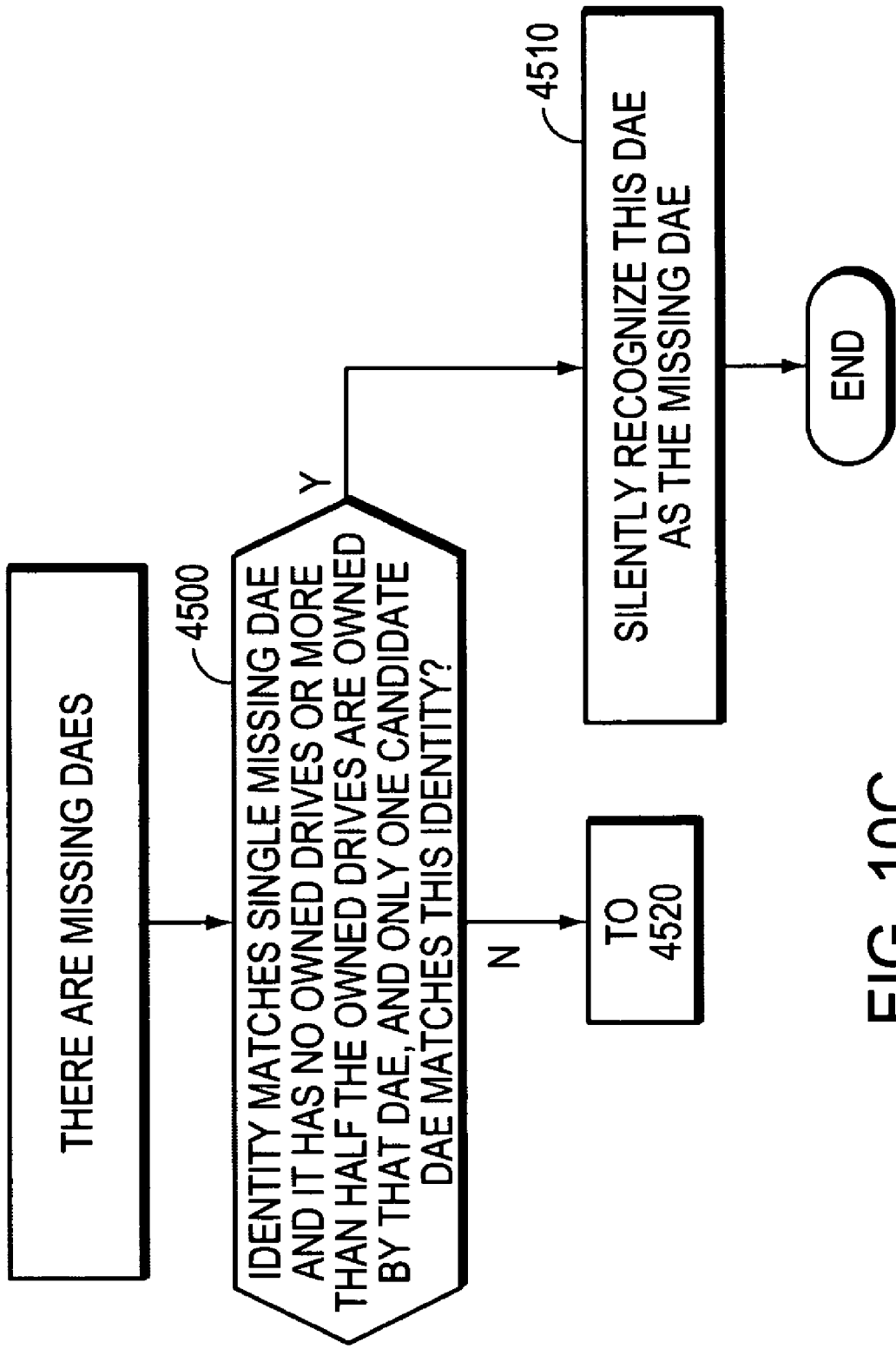
Figure 10D:
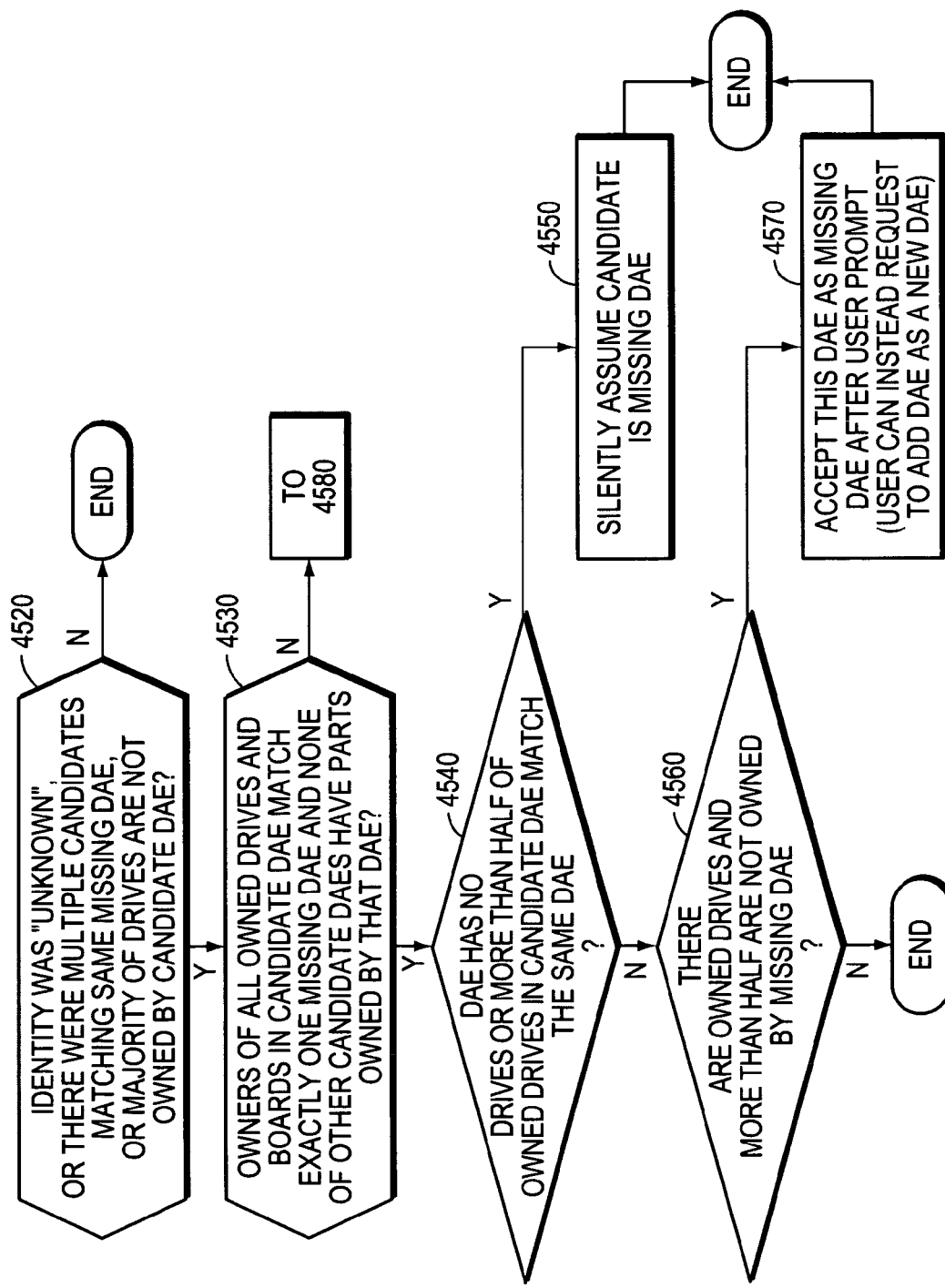
Figure 10E:
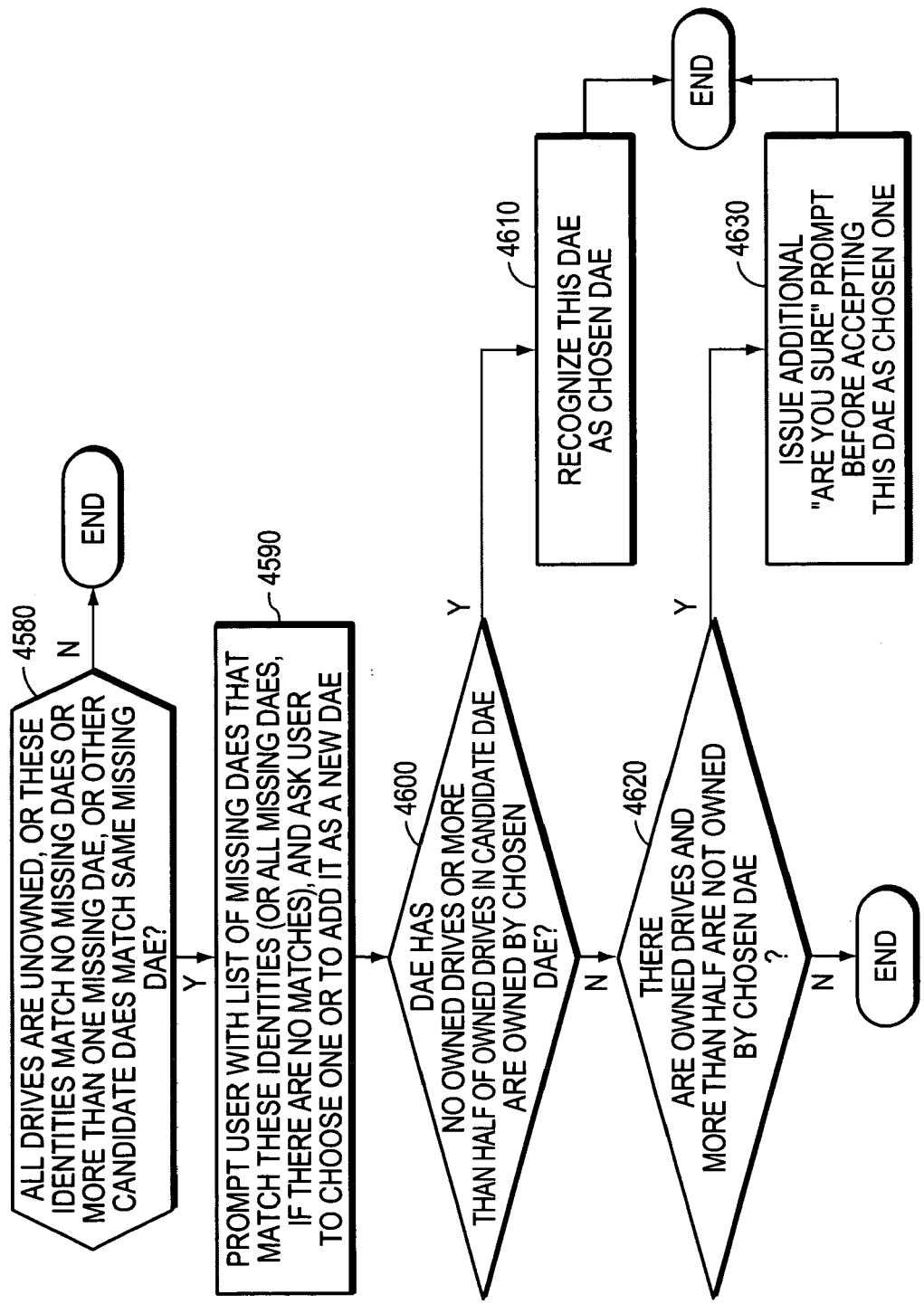
Figure 11A:
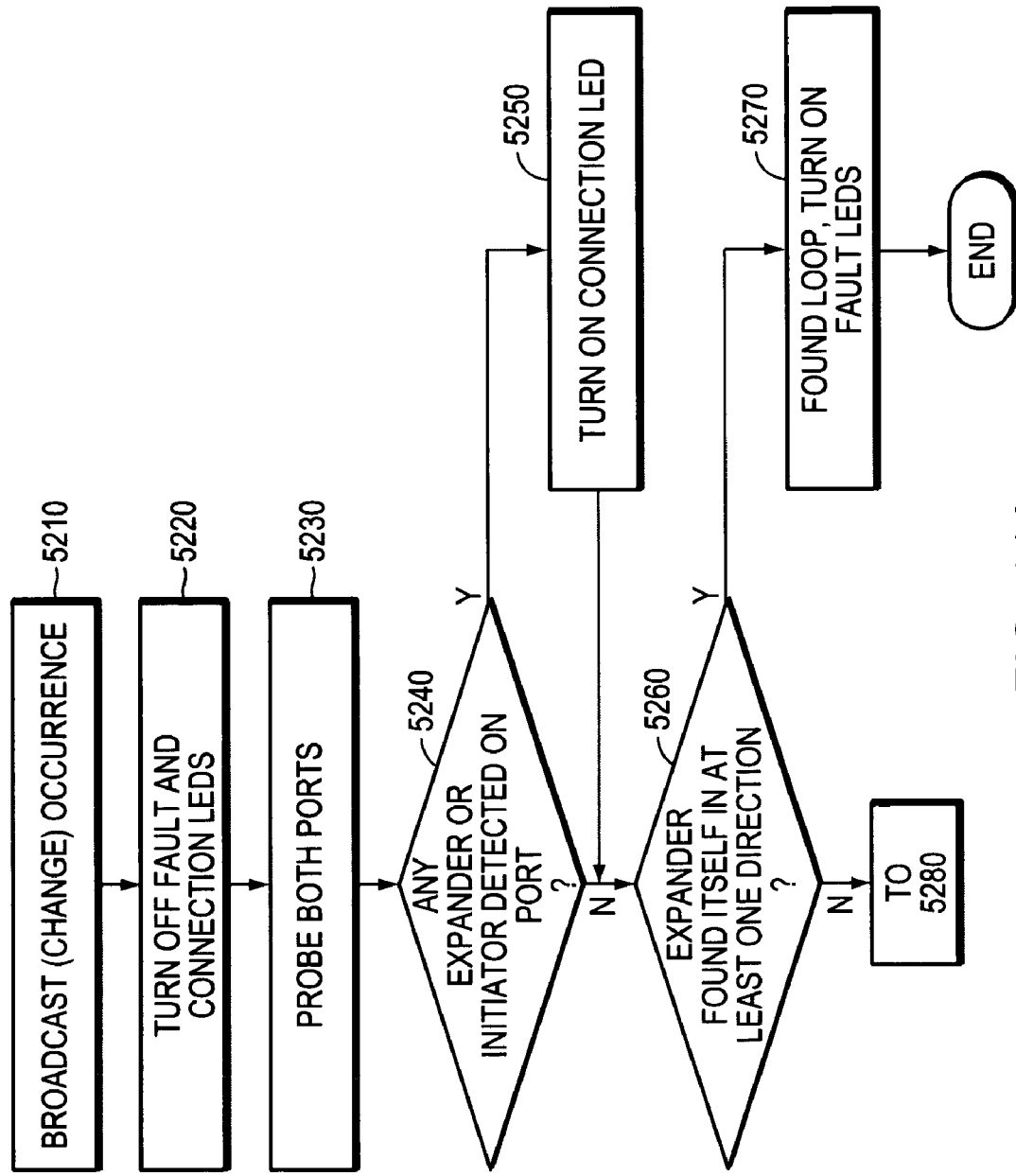
Figure 11B:
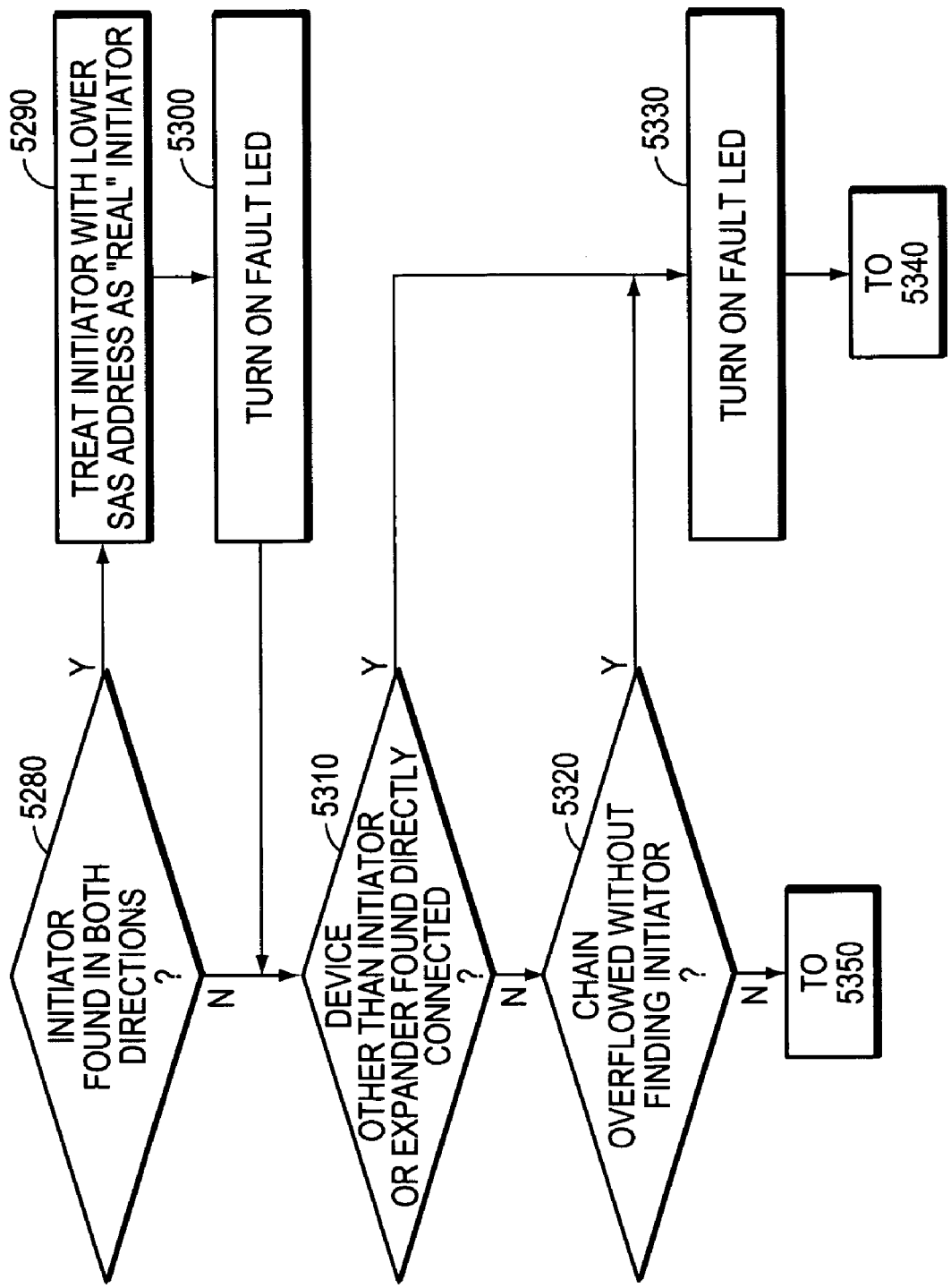
Figure 11C:
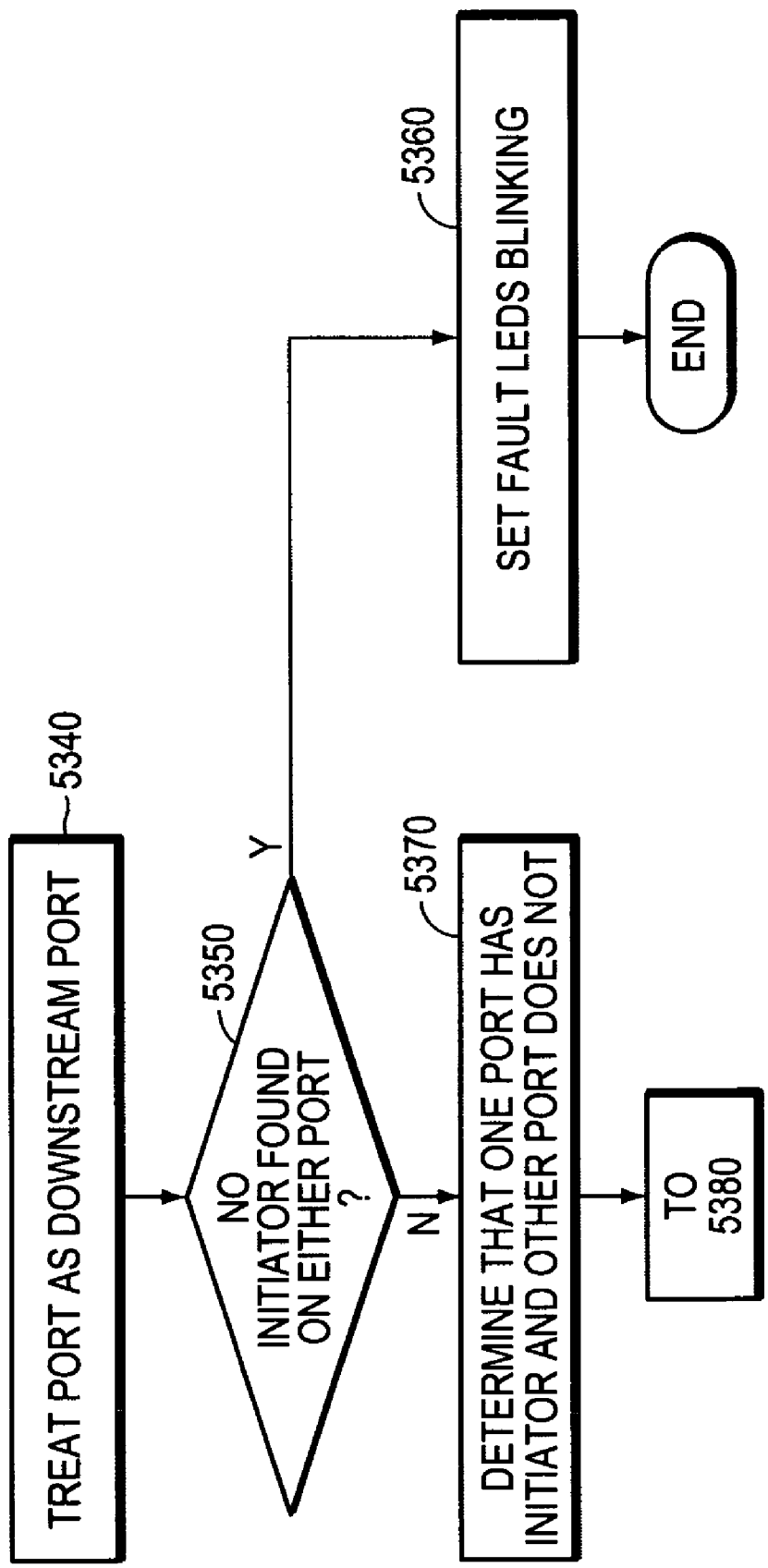
Figure 11D:
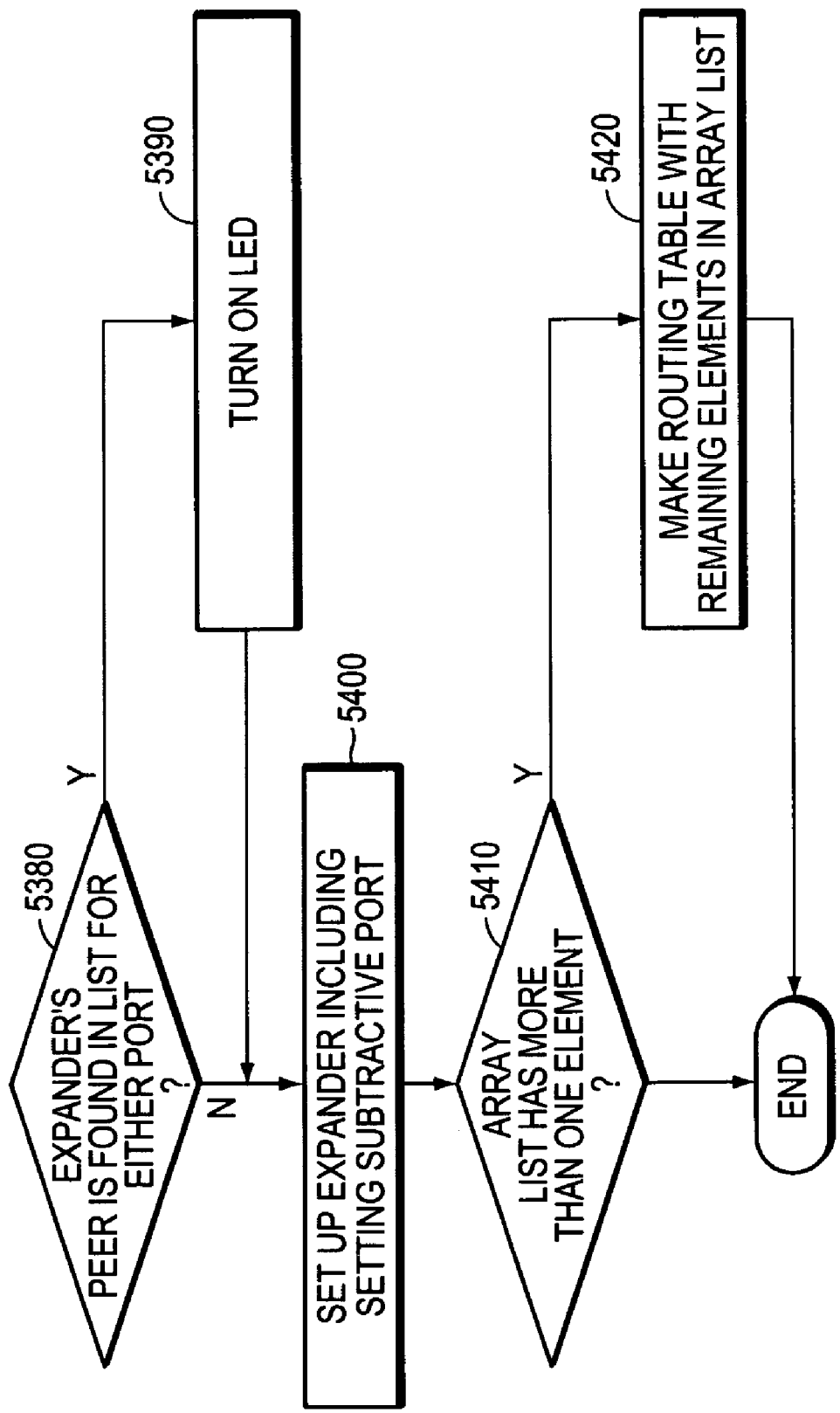

When a DAE powers up before being recognized by Flare, it displays a blinking number as shown in FIG. 7, depending on ownership (enclosure identity) of the boards. FIG. 7 illustrates aspects of enclosure number display at power up, and includes tabular and pictorial representations of how a DAE determines its identity and blinking number after a possible cold swap, including variants V1-V11. All possible ownership combinations are listed, where an empty cell represents unowned, unknown, or removed, and A, B and C represent the signature of an owner and its enclosure number. Two outlined rows represent normal cases in which the DAE is brand new or was already used but no boards were swapped. With respect to FIG. 9, use cases represented by letters a,b,c are now described:

a. If there is at least one owned board, and all are owned by the same DAE (step 4210), the DAE displays the enclosure number of the owned boards (step 4220). In this case no boards were replaced, or the replacement boards were unowned and will become owned by the current DAE.

b. If the interposer plus one SEB come from the same DAE (step 4230), the DAE displays that enclosure number (step 4240). In this case, if any boards were replaced, one SEB was replaced by an owned or unowned SEB, so the DAE displays the same number it had before, or the interposer plus 1 SEB were replaced by boards from one other DAE, so the displayed number is from the other DAE (which Flare will later correct).

c. If (c1) the interposer is unowned and the SEBs come from different DAEs or are both unowned (step 4250), or (c2) the interposer comes from a different DAE than all the owned SEBs (step 4260), the DAE displays "unknown" (step 4270).

In the former case the interposer was replaced by an unowned board and an SEB may have been replaced by an owned board, and in the latter case the interposer, the interposer plus an SEB, or both SEBs, were replaced by owned boards. The DAE does not display an enclosure number since the interposer disagrees with both SEBs (and all boards are owned) or the interposer is unowned and the SEBs do not agree.

In the cold swaps described above, if the DAE is able to determine its identity and shows an enclosure number on its display, the DAE takes ownership of any unowned replacement boards and Flare (when it comes up) is not aware that a swap was made. Previously owned boards, or unowned boards in DAEs that could not resolve their enclosure number, do not have their signatures changed until Flare comes up. At that point, if Flare accepts the enclosure, all boards, pre-owned or not, become owned by the DAE, as described below.

This behavior allows the DAE to blink its original enclosure number if any single board is replaced while powered up, or when powered down if any two boards are replaced, as long as a replacement is not an owned interposer. If the interposer is replaced by an owned board, or one of two replacement boards are owned, the DAE cannot reliably determine its number (or determines the wrong number). In other words, for the DAE to display its number, all the owned boards must agree, except that one of the SEBs is permitted to disagree. Disagreeing SEBs are treated as a special case because the most likely swap with an owned board is an SEB swap. In all the other cases in which the boards have multiple owners, the DAE cannot rely on any one board, so it blinks "unknown" rather than displaying a possibly misleading enclosure number, until the DAE connects to Flare which can resolve the difference.

An SEB's determination of its own enclosure number is therefore incorrect only if the user replaces the interposer plus at least one SEB with owned boards from one other DAE; or the user replaces all 3 boards: 1 or 2 from one DAE and the others being unowned. In these cases the DAE erroneously determines it has the identity of the other DAE, but Flare subsequently corrects this situation and changes the displayed number before accepting the DAE, as now described.

Enclosure Identification After Customer Replacement Units (CRUs) are Swapped

In the discovery process, Flare determines the identity of a DAE or drive with which it is communicating, and whether it brings the component online, allowing for the possibility that one or more boards and drives may have been swapped while the DAE was not connected. When both SPs communicate with the DAE, only one of them (usually, the first to communicate with it) executes the behavior now described unless otherwise specified.

If discovery is successful and Flare accepts a DAE into the array, the enclosure number on the DAE displays solid and the drives are able to be accessed. If Flare does not accept the DAE, the entire DAE is bypassed and the drives are unavailable until the next discovery.

If Flare accepts the DAE (silently or with user confirmation, as described below), Flare then processes the drives normally regardless of whether the drives were used to determine enclosure identity.

If Flare rejects and bypasses a DAE, an enclosure fault light is turned on and the user is sent a message. If a drive is online but bypassed, a drive fault light is turned on and the user is sent a message. In a possible implementation, an indication may be provided specifying whether a DAE or drive is bypassed (but is otherwise operative) or has failed. Messages are sent by email and Navi alerts, except there are no additional email messages or alerts in cases in which the rejection occurred as a result of a user request (e.g., in response to a prompt).

In all cases below in which Flare prompts the user for the identity of a DAE, the user also has the option to choose any missing DAE or to add the DAE as a new one, instead of choosing one of the DAEs that Flare suggests. Where Flare is described as "silently" adding or recognizing the DAE, the user has no option to change that decision. If the user chooses a missing DAE that had unfaulted drives with bound data on it, and those same drives are missing from the candidate DAE, Flare subsequently prompts again accordingly.

Figure 8:
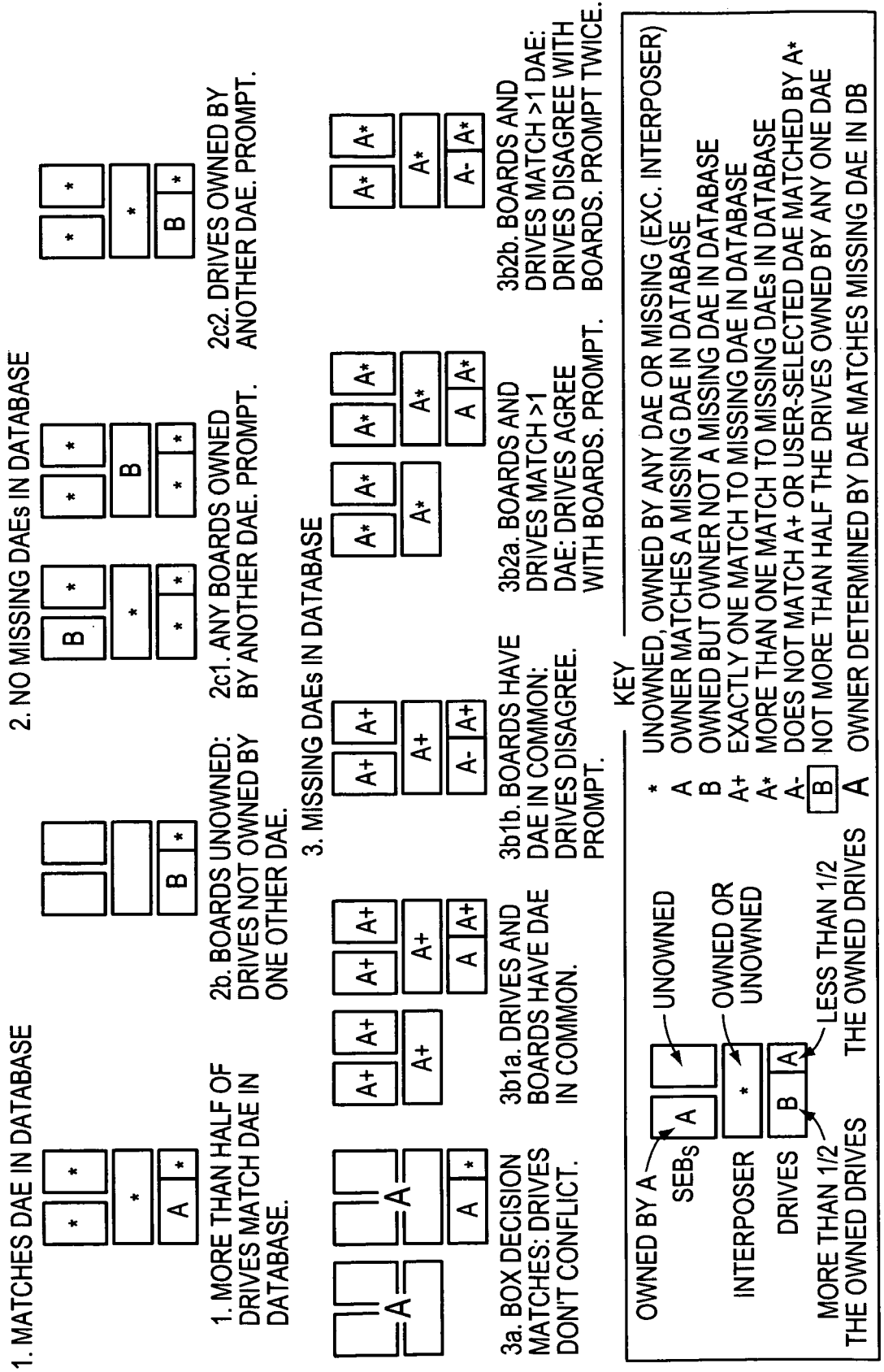
FIG. 8 is an illustration of aspects of enclosure identification.

Flare tests and processes DAEs in according with the following procedure, with reference to FIG. 8 which describes cold swap use cases. Flare accepts DAEs into the array silently with identity A, unless "prompt" is specified, depending on the configuration of boards and drives it finds and which DAEs in database are still missing. Use cases represented by numbers are described below and illustrated in FIGS. 10A-10E. Flare executes the tests in the order listed, unless otherwise indicated.

FIG. 8, part 1. If the DAE satisfies the following criteria (step 4410):
  it has owned drives,
  more than half of the owned drives are owned by the same DAE,
  that DAE is in Flare's database,
  that DAE is not already online, and
  there is not another newly connected DAE with an identity that conflicts with this DAE, Flare rewrites the signature on all three boards and drives if necessary, asserting ownership of any components not already owned by the DAE, and the blinking number changes to a solid number (and no longer unknown) (step 4420). Therefore if the majority of the drives agree, Flare relies on the drive signatures to identify the origin of the DAE regardless of input from the boards or the blinking number. This is the normal use case for a DAE with drives that was previously part of the array, whether or not any of its parts were swapped while the DAE was offline. When multiple DAEs come online at once, Flare first processes all DAEs that satisfy the above criteria before checking any of the other DAEs.

The remaining cases cover remaining facts: the DAE has no owned drives, the majority of drives in the DAE match the signature of a DAE already online, or the majority of drives in more than one DAE coming online have signatures that match the same DAE in the database. In these use cases "missing DAE" refers to a DAE in Flare's database that is not yet online. All DAEs not satisfying the above criteria are processed in the order they are connected to SP A except where specified.

FIG. 8, part 2. There are no missing DAEs (step 4430):
  2a. If there are already 4 DAEs in the database (step 4440), Flare rejects the candidate DAE with an error message about too many DAEs (step 4450).
  2b. If all boards and drives are unowned, or all boards are unowned and more than half of the owned drives are not owned by a single DAE (belonging to this or another array) (step 4460), Flare silently adds the DAE, assigning it the next enclosure number (step 4470).
  2c. If any boards are owned (2c1), or more than half the owned drives are owned by another single DAE (2c2) (step 4480), Flare prompts the user for confirmation before adding the candidate DAE as a new DAE (step 4490).

FIG. 8, part 3. There are missing DAEs. Flare examines the identity of the candidate DAE that it determined from its boards as shown in FIG. 7:

3a. If the identity matches a single missing DAE and it has no owned drives or more than half the owned drives are owned by that DAE, and only one candidate DAE matches this identity (step 4500), Flare silently recognizes this DAE as the missing DAE (step 4510).

3b. If the identity was "unknown", or if there were multiple candidates matching the same missing DAE, or the majority of drives are not owned by the candidate DAE (step 4520), Flare examines the owners of all owned drives and boards in the candidate DAE. There will be zero or more owners.

3b1. If these owners match exactly one missing DAE and none of the other candidate DAEs have parts owned by that DAE (step 4530):

3b1a. If the DAE has no drives or more than half of the owned drives in the candidate DAE match the same DAE (step 4540), Flare silently assumes this candidate is the missing DAE (step 4550).

3b1b. If there are owned drives and more than half are not owned by the missing DAE (step 4560), Flare accepts this DAE as the missing DAE after a user prompt (step 4570). At this point the user can instead request to add the DAE as a new DAE.

3b2. If the drives are all unowned, or these identities match no missing DAEs or more than one missing DAE, or other candidate DAEs match the same missing DAE (step 4580), Flare prompts the user with a list of missing DAEs that match these identities (or all missing DAEs, if it there are no matches), and asks the user to choose one or to add it as a new DAE (step 4590):

3b2a. If the DAE has no owned drives or more than half of the owned drives in the candidate DAB are owned by the chosen DAE (step 4600), Flare recognizes this DAE as the chosen DAE (step 4610).

3b2b. If there are owned drives and more than half are not owned by the chosen DAE (step 4620), Flare issues an additional "are you sure" prompt before accepting this DAE as the chosen one (step 4630). This prompt indicates that the majority of the drives in the candidate DAE come from other DAEs.

The enclosure numbering strategy described above specifies the system's behavior under component-swapping scenarios. In a specific implementation, the strategy relies on specific logic and functionality used by firmware and Flare to implement behavior under the strategy.

With respect to firmware behavior at DAE power up, logic may be implemented by firmware running in a management controller (MC) or the expander. The MC is a complex of one or more chips that manages enclosures. The MC has direct access to the displays and EEPROMs needed for implementation of the behavior. The expander is a highly suitable place to implement functionality that Flare depends on.

In each DAE, a resume EEPROM (vital product data memory (VPD)) is provided on the interposer board, and each SEB has a place to store an enclosure number in the range 0-4, a valid bit, and a 29-bit unique ID, all of which can be rewritten directly by MC firmware (and indirectly, by expanders). The VPD holds information programmed by the factory on some FRUs, generally containing some unique information on each part such as a serial number. A VPD EEPROM is provided on each SP, SEB, and interposer.

When shipped from the factory, the valid bit is set to off indicating a board that has not been acted upon by Flare. Other values are left uninitialized. Also, each VPD provides a read-only 32-bit World Wide Number (WWN) seed burned in by the factory, of which 29 bits are unique across all VPDs.

Each SEB also has a user-visible 7-segment LED display that firmware can set to blank, a value in the range 1-4 or a dash (to mean "unknown"), and which can be made blinking or solid.

As noted above, the DPE is identified as enclosure 0. Its SPs and interposer board also have VPDs but they are not used for the purposes of enclosure numbering described in this section.

The enclosure numbering behavior at power up described below is implemented by the firmware in order to obtain the results as described above. The purpose of this logic is to display the correct number for the enclosure when the DAE is powered up, before it is attached to a running Flare system, taking into account the possibility that one or more of the 3 boards in a DAE could have been replaced. A goal is to have both SEBs display the same value at all times, except in the case of failures in which SEBs cannot communicate with one another or the interposer.

"Correct number" means either "unknown" if the enclosure was never recognized by a Flare system, or the number assigned to the enclosure by Flare at some point in the past.

At power up, firmware in each SEB reads the enclosure number, valid bit and unique ID in the EEPROM of both SEBs and the interposer. With respect to FIG. 7, the firmware compares this information and retains it in these cases:

Interposer is valid and its number and ID matches one of the valid SEBs (retain the matching information)—FIG. 7 variants V4, V8, V9.

Interposer is valid and there are no valid SEBs (retain the interposer's information)—variant V3.

Interposer is invalid and valid SEBs match in number and ID, or there is just one valid SEB (retain the valid SEB's information)—variant V6.

Note that both the unique ID and enclosure number need to match in the cases in which a match is required.

All of the above variants taken together (V2, V3, V4, V6, V8, V9) are the ones in which firmware has the enclosure number and sets its enclosure number display to the blinking value it has retained. Note that in variants V2, V3 and V4 the SEB is setting its display to a number even though it has no number in its own VPD, and in variant V9 the SEB is setting the display to a number different from the one in its own VPD.

In addition to setting the display, if the SEB's own information was invalid, firmware copies the retained number and unique ID to its own VPD, setting it to valid. Likewise, if the interposer's information is invalid, firmware copies the retained information to the interposer's VPD and sets it valid. It is acceptable if firmware on both SEBs execute this last step, since they both write the same value, as long as they do not interfere with and corrupt the value on the interposer. On the other hand, a read of these values from the interposer needs to be atomic; accordingly a locking mechanism is used.

As a result of these steps, the invalid VPDs in variants 2, 3, 4 and 6 are set to the same unique ID and enclosure number as the valid ones. In variant 9, there remains an SEB with an ID and number different from the displayed value. This is used by Flare in a later operation to help identify the enclosure in certain cases.

In all of the other variants (1, 5, 7, 10, 11), the SEB sets its display to a blinking "unknown" symbol and does not write anything into the VPDs.

If an SEB cannot read the information from the other SEB's VPD, it treats that SEB as if it were invalid. If it cannot read the interposer's VPD it displays a blinking "unknown" and also lights the enclosure fault light and interposer fault light.

The behavior described above means that the numbers on both SEBs always match, or one or both will display "unknown". The two SEBs do not display different numbers even if the SEBs cannot communicate with each other or the interposer.

Bidirectional SAS Discovery

As described in at least some respects herein, a SAS network typically includes one or more SAS initiators (e.g., SP A) coupled to one or more SAS targets (e.g., drives) often via one or more SAS expanders (e.g., in enclosures). In general, SAS initiators initiate communications with SAS targets. The expanders expand the number of ports of a SAS network domain used to interconnect SAS initiators and SAS targets. The expander devices are often arranged such that the path from any SAS initiator to any particular SAS target may pass through multiple expander devices. In addition, there may exist multiple paths through the network of expanders to establish communications between a particular initiator and a particular target. The expanders (as well as initiators) therefore also include routing tables that enable SAS initiators and SAS devices to route communications through the network of expanders.

The system discovers the topology of enclosures and drives at power up and at each topology change. Every addressable SAS target has a unique SAS address. A SAS drive has a SAS address on each of its dual ports, burned in at the factory and never changed. SATA drives have SAS addresses, assigned by expanders based on the expander's own SAS address and port number (no information on the drive itself is used to form the SAS address). Expanders have their own SAS addresses for management purposes as targets of Serial Management Protocol (SMP) messages, and to form SATA addresses as mentioned above. In the system, expanders obtain their SAS addresses at startup from the resume EEPROM on the interposer board described herein. The MC reads the address and passes it to the expanders. Expanders A and B within a DPE or DAE have addresses that differ by a low order bit, so it is possible to tell from an address whether an expander is on the A side or B side.

The SAS initiator has a fixed SAS address hardwired that varies by one bit depending on whether it is SP A or SP B, and that differs from all possible expander and disk addresses.

The system described herein uses a subset of allowed SAS topologies. As described above, in a generic SAS topology, an initiator is connected to drives and/or expanders, and expanders are connected to drives and/or other expanders or initiators. Generically the topology is a branching tree with an initiator at the root, expanders at forks, and drives at the leaves, although multiple initiators are permitted. Each device (expander, initiator, or drive) has a SAS address. Each expander in the topology is a multiport router that receives a SAS frame on one of its ports, targeted for a destination identified by SAS address. If the target is directly attached to the expander, the expander sends the frame to that device. If the target is remote, the expander sends it to port connected to a neighboring expander. A routing table in the expander tells it which neighboring expanders provide connectivity to the remote device. Expanders have their own SAS addresses for management purposes, as targets of Serial Management Protocol messages (SMP).

To increase the bandwidth between expanders, several consecutive ports (e.g., 2-8) can be coalesced into a single wideport, all connected to the same neighboring expander or initiator. The wide port is treated as a single logical port from an addressing standpoint, so a frame to be sent to that expander can be sent on any one of the ports not already in use.

When an expander gets a frame for the SAS address of a locally attached device, the expander knows which port to send it to, based on information returned during link initialization. If the expander is connected to a neighboring expander, it has a routing table, entry, indexed by SAS address, for each remote device reachable through that neighboring expander. (Frames are transmitted in a cutthrough fashion and not fully buffered in expanders.) An expander can build its own routing table using either a self-discovery process described in the standard SAS specification for auto-configuring expanders or its own proprietary method, or a remote device such as a host, initiator, or other expander can build the table using SMP messages.

Also, at most one port on an expander can be configured as a "subtractive" port, which can be viewed as a catch-all port. (This can be a wideport.) If the SAS address in a frame is not destined for a locally attached device and is not listed in the expander's routing table, the expander sends the frame to its subtractive port. An expander does not need to have routing table entries for devices visible through the subtractive port. Subtractive ports save the need for every expander in the system to have a table of all possible devices.

Whenever any port on an expander changes state (i.e., an attached device is added or removed), the expander initializes the link to determine the SAS address of the device, if any, and then sends an SMP BROADCAST(CHANGE) message to all neighboring expanders and initiators (on both routing and subtractive ports). Expanders that receive a BROADCAST (CHANGE) message are compelled to forward the message to their neighbors, so that all expanders in a topology know that a change has occurred. The receipt of a BROADCAST (CHANGE) causes an expander to clear and rebuild its routing table.

In a typical branching tree topology with a single host controller at the root, each expander has one upstream port and can have one or more downstream ports. Therefore the typical method of configuring such a topology is to make the upstream port subtractive and to have each expander discover all the devices accessible on each of its downstream ports. Thus, generically in SAS, this avoids the need for expanders to discover devices in other branches of the topology.

But in the instant system's strictly linear topology there is only one branch, and the system's expanders always have exactly one downstream port and one upstream port. Having only two routable ports (portA and portB) allows the option of making either one subtractive, as long as the expanders work properly in a linear topology whether the upstream or downstream port is subtractive. In the instant system the firmware specifies the subtractive port at startup, and then an auto-discovery procedure is executed to build the expanders' routing tables.

Generically in SAS, the upstream port may be chosen as the subtractive port, in order to operate as described in the SAS specification. However, it is useful to do the opposite: there is an error use case in which the user forgets to wire one of the DAE's two incoming connectors and powers up the DPE. In this case one expander in the DAE is accessible to an operating DPE while the other expander is not. In this case, it is useful to turn on the enclosure's fault LED to indicate a problem. However, if no DPE is detected at all on either input port, it is not necessarily useful to indicate a problem because it likely means that the DAE is not connected at all or the DPE is not yet powered up.

In order to distinguish between these two cases, it is necessary for the expander to be able to determine whether an initiator (here, the initiator in the DPE) is visible at the head of the network of expanders. If the routing port is upstream and the subtractive port is downstream, the expander can make the determination by searching in its routing table for the canned SAS address of an initiator. According, the downstream (outgoing) port is made subtractive and the expander uses table routing on the upstream port.

Now described is an embodiment that includes a procedure that allows an enclosure to determine automatically which of its two external SAS connectors should serve as the output connector. The procedure allows dual use connectors—input or output so that it is unnecessary to have dedicated input and output connecters on each SEB. Each connector can be used like a hub, as either an input or an output, and the procedure determines a path to the initiator and outward.

In particular, the procedure is used by expander firmware to make use of discovered topology to decide which port (portA or portB) to make subtractive, which port to make table routing, and which fault LEDs to light or blink on various illegal or problem wiring combinations.

In a specific implementation described below with reference to C source code, the procedure relies on the following application programming interface (API) functionality.

API SetSubtractivePort sets a specified expander wideport to subtractive.
   void SetSubtractivePort(int portNum);

API SetRouteTable sets a routing table to contain one entry for each SAS address that points to the wideport, and erases any previous contents of the table.
   void SetRouteTable(SasAddr list[ ], int length, int portNum);

API Discover probes the path down local portA and returns an array named "list" (which is a data structure, not a disk array) of expanders and initiator found on portA or portB of attached expanders. It assumes that all expanders and initiator are connected only through expander ports portA or portB. Probing stops on a port not connected to an expander or when constant MAX_DISCOVER_LIST (described below) is reached. The first entry in the array identifies a locally attached device and the last entry identifies the initiator (if any). Only expanders and initiators appear in the array, not target devices.

The API returns one of the following results. FOUND_SELF is returned if the API terminated because the expander found itself (i.e., a loop), and the array lists all expanders except itself. WRONG_TYPE is returned if an immediately attached device was found but it was not an expander or an initiator. In other words, a target device was found on portA or portB of an expander being probed. FOUND_INITIATOR is returned if the API terminated at an initiator; the array lists expanders and the initiator in order discovered, so that list[0] identifies an immediate neighbor and list[length-1] identifies the initiator. NO_INITIATOR is returned if the API terminated on a port not connected to anything; the array lists all expanders discovered, in order. OVERFLOW is returned if the API terminated because MAX_DISCOVER_LIST was reached; the array lists all expanders discovered up to that point. If the API terminates at a target device attached to a remote expander, NO_INITIATOR is returned.

API Discover depends on any expander probed having first initialized its own phys at portA and portB. A "phy" is an object and/or circuitry used to interface to one or more devices. The phy may include a physical phy containing transceiver circuitry to interface to the applicable communication link. The phy may alternately and/or additionally include a virtual phy to interface to another virtual phy or to a physical phy. Each phy may have a unique identifier. A port may contain one or more phys. For example, a narrow port may contain only one phy, while a wideport may contain more than one phy.

int Discover(int portA, int portB, SasAddr list[], int *length);

The following refers to the expander itself.
   extern SasAddr self;

The following refers to the SAS address of the peer expander in the enclosure, and can be computed from "self".
   extern SasAddr peerExpander;

The following refer to the phy numbers of the two in/out wideports:

```
#define WP1 0
#define WP2 4
```

Constant MAX_DISCOVER_LIST is used to size arrays for discovery purposes to be at least big enough to accommodate a wiring mistake where every expander and initiator is on the same chain. A constant of 12 is suitable for a system having 10 expanders and 2 initiators. A bigger constant can be used, e.g., to accommodate mistakes and future growth without changing code.

define MAX_DISCOVER_LIST 50

The following variables identify upstream (toward host, i.e., toward initiator) and downstream (away from host) directions. The parameters are A,B or B,A wherein upID is toward initiator.

```
#define SET_DIRECTION(upID, downID)
    discoverList      = discoverList ## upID;
    length            = length ## upID;
    tablePort         = port ## upID;
    subtractivePort   = port ## downID;
```

The following constant defines the number of expanders in the DPE between the external connector and the controller. This is 0 if the connector is wired to the controller, or 1 if the connector is wired to the expander in the DPE.

define DISTANCE_TO_CONTROLLER_IN_DPE 1

The procedure as illustrated in FIGS. 11A-11D is executed after each BROADCAST(CHANGE) occurrence (step 5210) since an expander or initiator may have been added or removed (the procedure is not used for when a drive is added or removed). The procedure is executed only by expanders that could be connected to other expanders, either upstream or downstream, intentionally or unintentionally. The procedure relies on expanders being in a linear chain with one pair of in/out ports at known phy locations, and makes the upstream (toward host) port the routing port, and the downstream (away from host) port the subtractive port. In accordance with the procedure, only initiators and expanders need to be listed in the routing table.

```
void rediscover( ) {
    int portA = WP1;
    int portB = WP2;
```

Ports can become table routing (toward host) or subtractive routing (away from host):

```
int tablePort;
int subtractivePort;
```

Devices are listed that were found on the path to the initiator on both ports, including a locally attached device:

```
SasAddr discoverListA[MAX_DISCOVER_LIST];
SasAddr discoverListB[MAX_DISCOVER_LIST];
The lengths of the arrays are specified:
int lengthA, lengthB;
```

The list used for table routing is specified along with its length:

```
SasAddr discoverList[ ];
int length;
```

Fault and connection LEDs are turned off (step 5220):

```
setFaultLed(portA, OFF);
setFaultLed(portB, OFF);
setConnectionLed(portA, OFF);
setConnectionLed(portB, OFF);
```

Both ports are probed (step 5230):

```
int statusA = Discover(portA, portB, discoverListA, &lengthA);
int statusB = Discover(portB, portA, discoverListB, &lengthB);
```

If any expander or initiator detected on a port (step 5240), its connection LED is turned on (step 5250):

```
if (lengthA > 0) setConnectionLed(portA, ON);
if (lengthB > 0) setConnectionLed(portB, ON);
```

If the expander finds itself in at least one direction (step 5260), a loop is found, and both fault LEDs are turned on (step 5270):

```
if (statusA == FOUND_SELF || statusB == FOUND_SELF) {
    if (statusA != statusB) {
        debugMessage("Impossible case: found myself on one port but
not the other.");
    }
    setFaultLed(portA, ON);
    setFaultLed(portB, ON);
    return;
}
```

If an initiator is found in both directions (step 5280), the initiator with the lower SAS address is treated as the "real" initiator (step 5290), an appropriate fault LED is turned on (step 5300), and the last entry in discoverList has the initiator's address:

```
if (statusA == FOUND_INITIATOR && statusB ==
FOUND_INITIATOR)
{
        if (discoverListA[lengthA-1] < discoverListB[lengthB-1]) {
            SET_DIRECTION(A,B);
            if (lengthB ==
                DISTANCE_TO_CONTROLLER_IN_DPE +
1) setFaultLed(portB, ON);
                if (DISTANCE_TO_CONTROLLER_IN_DPE ==
1 &&
lengthB == 1) setFaultLed(portA, ON);
        } else {
            SET_DIRECTION(B,A);
            if (lengthA ==
                DISTANCE_TO_CONTROLLER_IN_DPE +
1) setFaultLed(portA, ON);
                if (DISTANCE_TO_CONTROLLER_IN_DPE ==
1 &&
lengthA == 1) setFaultLed(portB, ON);
        }
} else {
```

The procedure continues if there is no loop and initiators are not found on both ports.

If a device other than an initiator or an expander is found directly connected (step 5310), or if the chain overflows without finding an initiator (step 5320), a fault LED is turned on (step 5330) and the procedure continues as if no initiator has been found on that port, thereby treating it as a downstream port (step 5340).

```
BOOLEAN sA, sB;
if (statusA == WRONG_TYPE || statusA == OVERFLOW) {
    setFautlLed(portA, ON);
    statusA = NO_INITIATOR;
    sA = true;
}
if (statusB == WRONG_TYPE || statusB == OVERFLOW) {
    setFautlLed(portB, ON);
    statusB = NO_INITIATOR;
    sB = true;
}
```

The procedure should now return FOUND_INITIATOR, NO_INITIATOR, or WRONG_TYPE.

If no initiator is found on either port (step 5350), fault LEDs are set blinking (step 5360):

```
if (statusA == NO_INITIATOR && statusB == NO_INITIATOR) {
    if (lengthA = 0 && !sA) setFaultLed(portA, BLINK);
    if (lengthB == 0 && !sB) setFaultLed(portB, BLINK);
    return;
}
```

Otherwise, status returned should be NO_INITIATOR for one port and FOUND_INITIATOR for the other port:

```
switch(statusA) {
    case FOUND_INITIATOR:
        if (statusB == NO_INITIATOR) {
```

Here, it has been determined that portA has an initiator and portB does not (step 5370):

```
                SET_DIRECTION(A,B);
            } else {
                if debugMessage("Bad status %d on port %d",
statusB, portB);
                return;
            }
            break;
        case NO_INITIATOR:
            if (statusB == FOUND_INITIATOR) {
```

Here, it has been determined that portB has an initiator and portA does not:

```
                SET_DIRECTION(B,A);
            } else {
                debugMessage("Bad status %d on port %d",
statusB, portB);
                return;
            }
            break;
        default:
            debugMessage("Bad status %d on port %d",
                statusA,
portA);
                return;
        }
    }
```

Accordingly the following have been set: discoverList, length, tablePort, and subtractivePort.

An LED is turned on (step 5390) if the expander's peer is found in the list for either port (the peer does the same absent an error) (step 5380). If the peer is found only on one port, the DAE has two LEDs turned on, one on each side. If there is also a loop, all four LEDs are turned on.

if (contains(discoverListA, lengthA, peerExpander)) setFaultLed(portA, ON);
  if (contains(discoverListB, lengthB, peerExpander)) setFaultLed(portB, ON);

The expander is set up, including setting the subtractive port (step 5400) based on the above-described determination of the port that has the initiator:

SetSubtractivePort(subtractivePort);

If discoverList has more than one element (i.e., more than the neighboring expander/initiator) (step 5410), a routing table is made with the remaining elements in the array (step 5420), all pointing to tablePort which is a table that identifies the initiator and all expanders between the neighbor expander and the initiator.

```
        if (length > 1) {
            SetRouteTable(&discoverList[1], length-1, tablePort);
        }
    }
```

TRUE is returned if addr is contained in the list:
BOOLEAN contains(SasAddress list[ ], int length, SasAddress addr);

Interposer Assembly

Figure 12A:
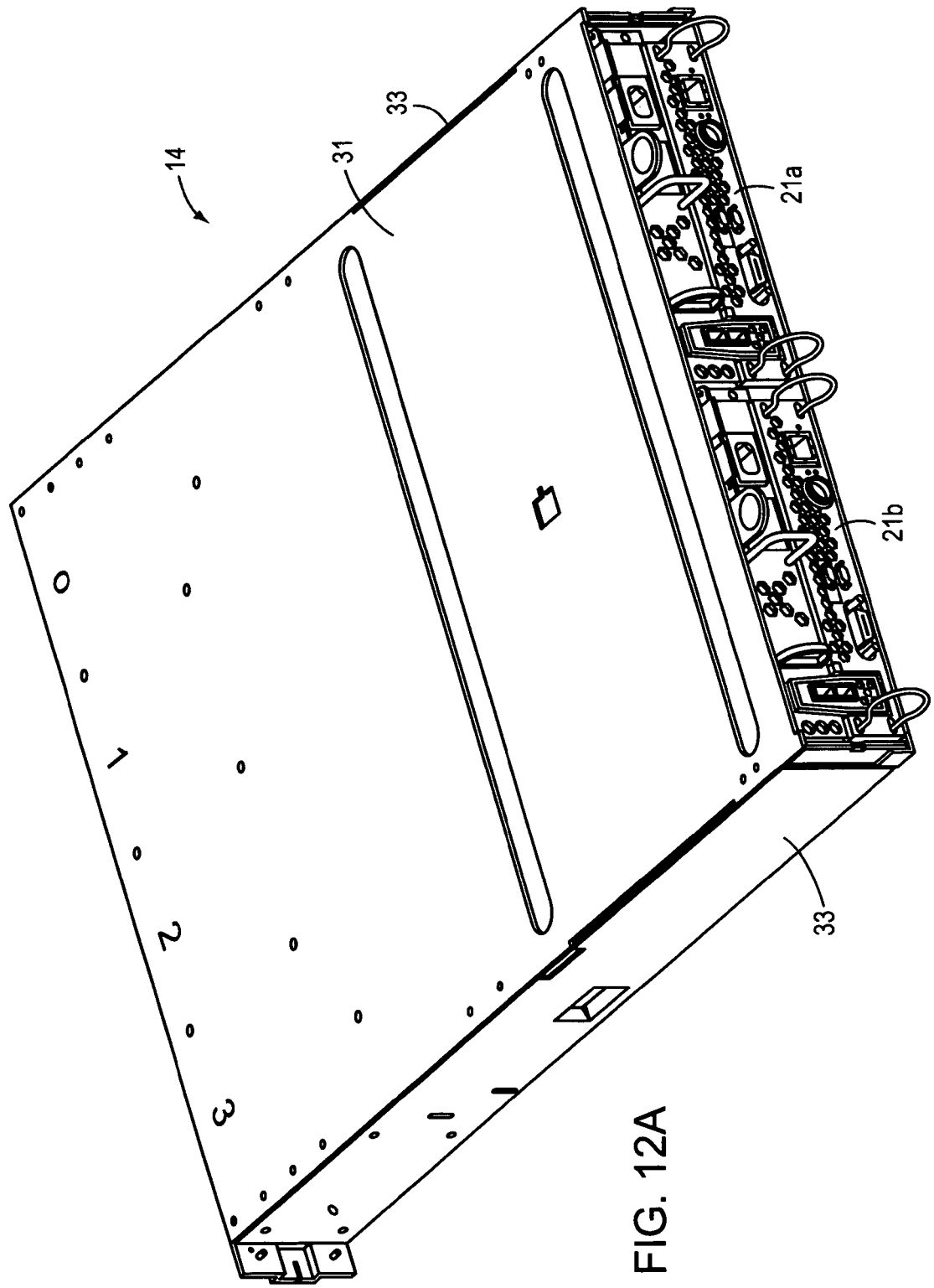
FIG. 12A is an isometric view of a DPE chassis of FIGS. 4 and 4A according to the invention.
Figure 12B:
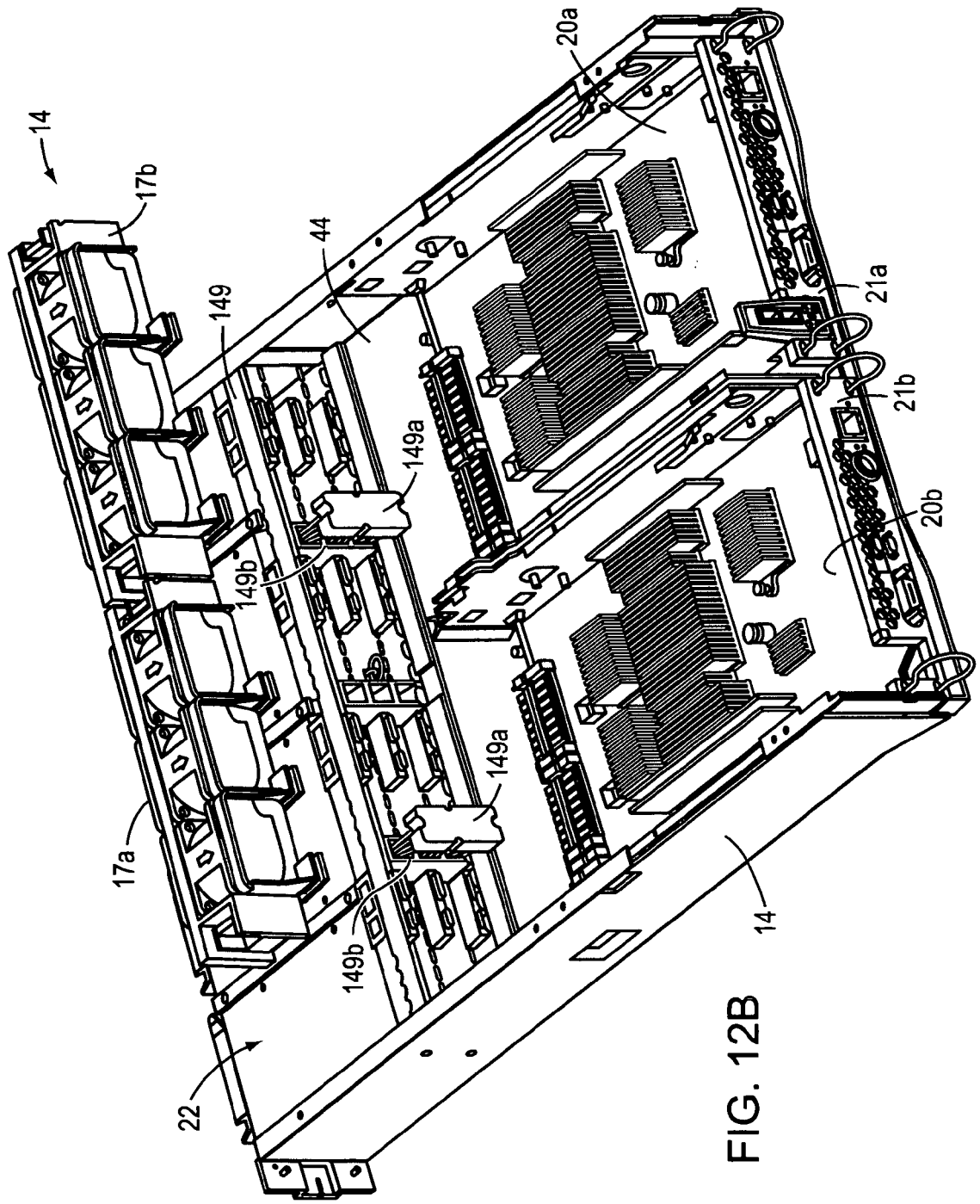
FIG. 12B is an isometric, partially exploded view of the DPE of FIG. 12A with the cover and a power supply unit removed.

Referring now to FIGS. 12A and 12B, an exemplary one of the DPE chassis 14 (FIG. 4) is shown. As shown and described in connection with FIG. 2, the chassis 14 includes a pair of storage processor boards, 20*a*, 20*b*, an interposer board 44 and a bank 22 of disk drives. It is noted that two sets of fans units 17*a*, 17*b* are included. More particularly, each one of the pair of storage processor boards, 20*a*, 20*b* is enclosed in a corresponding one of a pair of chassis 21*a*, 21*b*, respectively, which slide within the chassis 14 in a manner to be described in more detail in connection with FIG. 19. Each one of the chassis 21*a*, 21*b* has therein a corresponding one of the fan units 17*a*, 17*b*, respectively, as shown for an exemplary one of the chassis 21*a*, 21*b*, here chassis 21*a* in FIG. 13.

Referring now also to FIG. 12B, the DPE chassis 14 with the cover thereof removed, with the covers of each of the chassis 21*a*, 21*b* removed, and with the pair of fan units 17*a*, 17*b* exploded, is shown. Thus, inside the DPE chassis 14 is the bank 22 of, here twelve drives arranged in four rows, each row having a vertical stack of three disk drives, a pair of DPE enclosures, or chassis 21*a*, 21*b*, and multiplexer printed circuit board (PCB), referred to above as interposed board 44, the fan units 17*a*, 17*b*, being exploded for clarity. The bank 22 of disk drives is mounted by screws, not shown, to the back end of DPE chassis 14, as shown in FIG. 12B.

Each chassis 21*a*, 21*b* includes a corresponding one of the pair of data processor boards 20*a*, 20*b* (FIG. 2). As noted above, the two chassis 21*a*, 21*b* are each adapted to be independently slidably inserted into and removed from the interior region of the chassis DPE chassis 14 12 by handles 60. It is also noted that each chassis 21*a*, 21*b* includes a power supply 62 shown in FIG. 13 but removed from FIGS. 12B and 19 for clarity.

The DPE chassis 14 (FIG. 12A) includes a cover 31 (FIG. 12A and sides 33 in addition to the bank 22 of disk drives (FIG. 12B) mounted to the back portion of the DPE chassis 14. Here the chassis 14 is relatively slim, here about two inches thick. To assembly the multiplexer PCB i.e., interposer 44 and the pair of chassis 21*a*, 21*b* (FIG. 12B) without removing the cover after mounting the bank 22 of disk drives, it is necessary to first plug the multiplexer PCB interposer 44 into the bank 22 of disk drives through the open back end of the assembly chassis 14 and then, slide each of the pair of chassis 21*a*, 21*b* into the multiplexer PCB interposer 44. It should be noted that the interposer 44 includes vertically extending towers having LEDs used to project indicator lights out to the front of the system and which plug into light pipe receptacles 149*b*.

Figure 14:
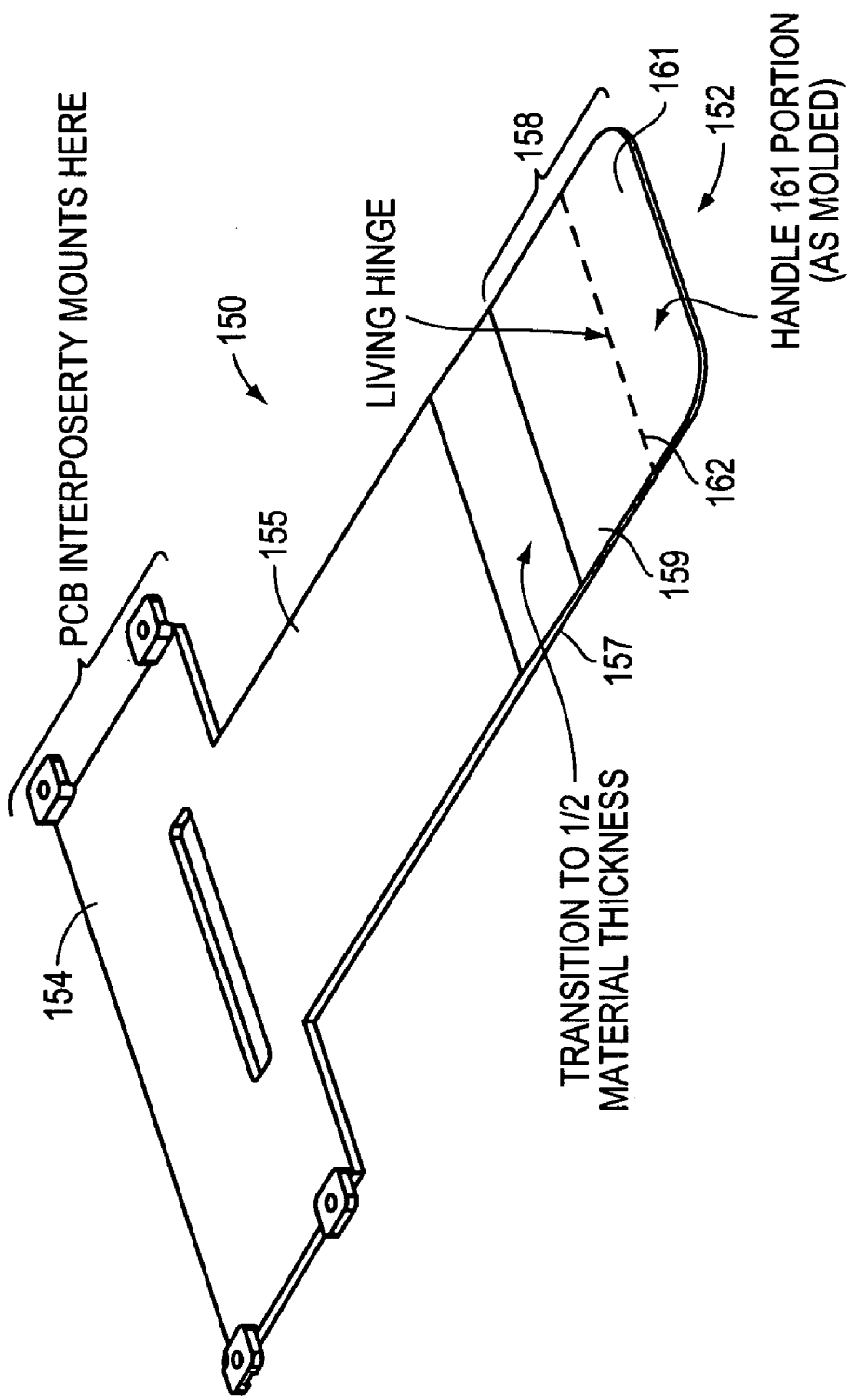
FIG. 14 is an isometric views of a tray-like device used to insert an interposers printed circuit PCB into the chaises of FIG. 13 according to the invention.
Figure 15A:
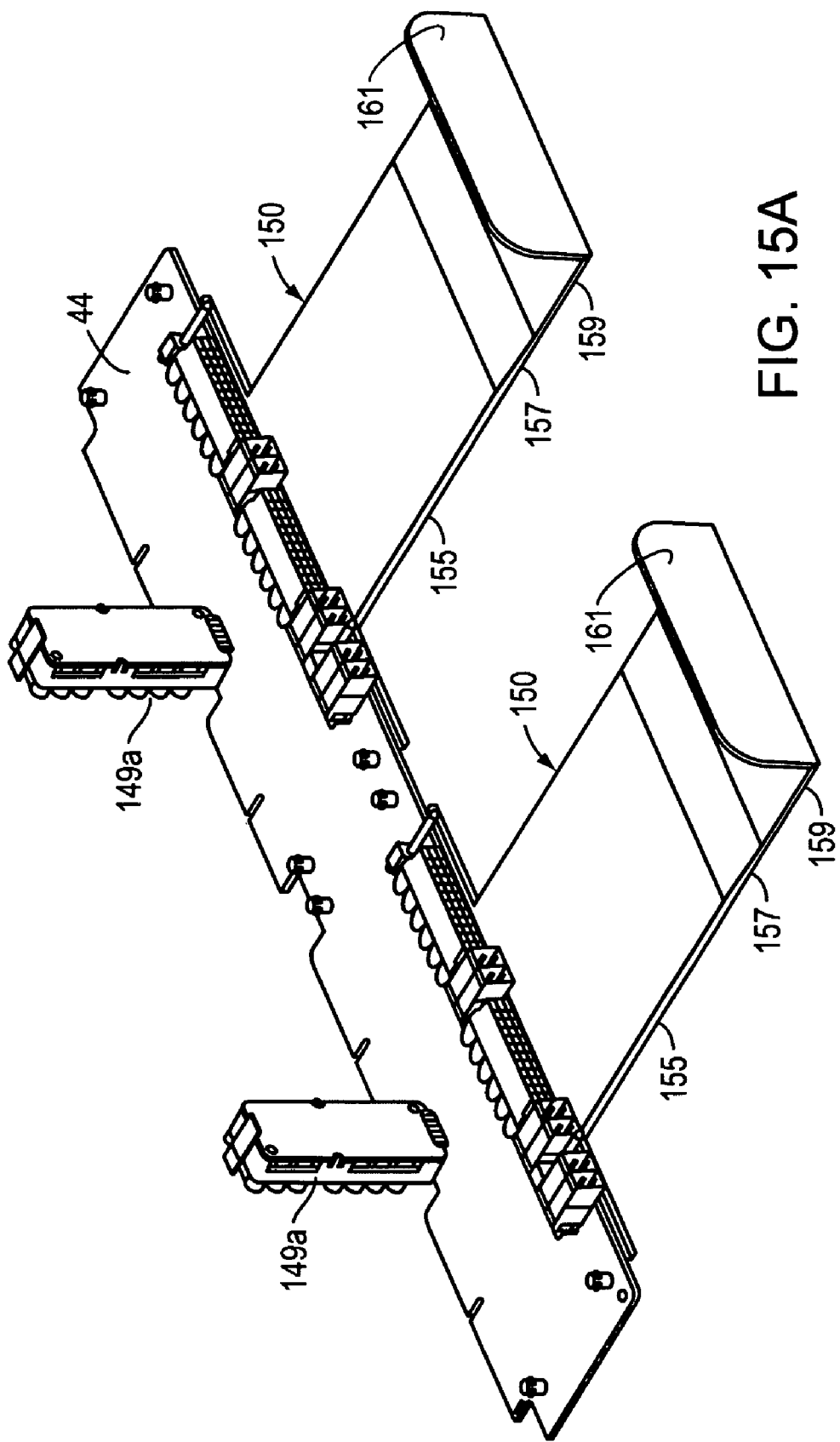
FIG. 15A is a top isometric view of a tray-like device of FIG. 14 having attached thereto an interposer printed circuit PCB.
Figure 15B:
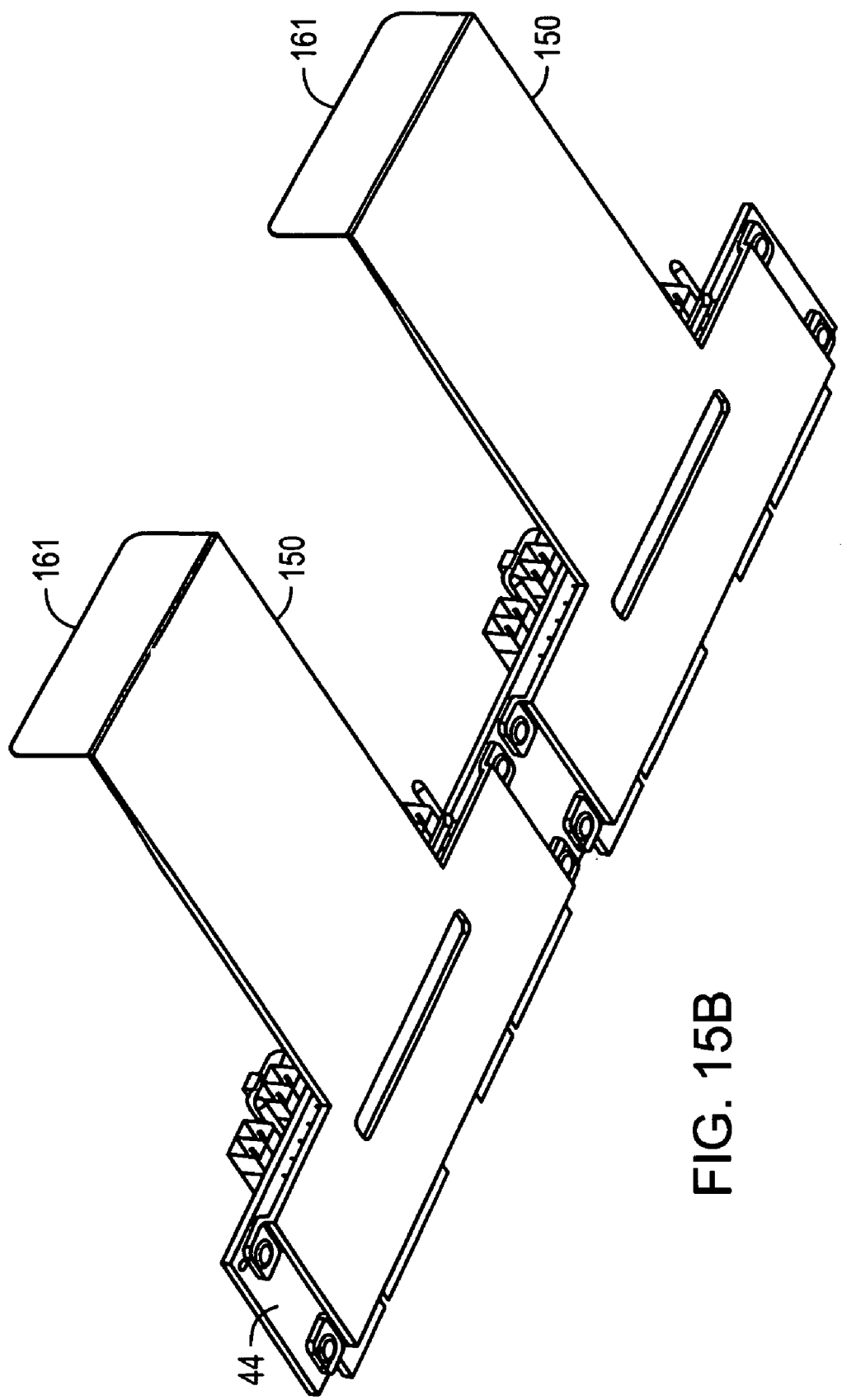
FIG. 15B is a bottom isometric view of a tray-like device of FIG. 14 having attached thereto an interposer printed circuit PCB.

The assemblage is performed through a tray-like device 150 shown on FIG. 14. The tray-like device 150 is used for inserting and/or removing a module, here the multiplexer PCB interposer 44, into or from an interior region of the DPE chassis 14 (FIG. 12B) with such chassis 14 having mounted to a distal region thereof an electrical component, here the bank 22 of disk drives. The tray-like device 150 is a single piece, elongated, structure, here plastic, having disposed along a longitudinal axis 152 thereof a module mounting region 154 disposed along a front region of the device 150 configured to have mounted thereto the one half of the interposer 44, here with screws passing through screw holes formed in the tray-like device 150, as shown in FIGS. 15A and 15B. Thus, here a pair of the tray-like devices 150 is used as shown in FIGS. 15A and 15B.

Each one of the tray-like devices 150 includes a distal portion; (i.e., the module mounting region 154), an intermediate portion 155 (FIG. 14) disposed adjacent to the distal portion 154, a transitional portion 157 disposed adjacent to the transitional portion 155, and a proximal portion 158 disposed adjacent to the transitional portion 157, as shown. The proximal portion 158 has an extension portion 159 adjacent to the transitional portion 157 and a handle portion 161 adjacent to the extension portion 158, as shown.

The distal portion 154, and intermediate portion 155 have a thickness twice as thick as the thickness of proximal portion 158 (i.e., the distal portion 154, and intermediate portion 155 have a thickness twice as thick as the thickness of both the extension portion 159 and the handle portion 161). The transitional portion 157 has a thickness transitioning from the thickness of the intermediate portion 155 to the thickness of the proximal portion 158. More particularly, the proximal portion 158 has a first portion, i.e., the extension portion 159) terminating in a back region of the transitional portion 155 and the handle portion 161 is pivotally connected to a rear region of the extension portion 159 along a hinge region 162 disposed between the extension region 159 and the handle region 161 to enable the handle portion 161 to pivot about an axis (i.e., the hinge portion 162) between the extension portion 159 and the handle portion 161 perpendicular to the longitudinal axis 152 of the tray-like device 150. The hinge is an area of reduced material thickness incorporated into a flexible plastic material, such as polypropylene, which allows the material to flex extensively or bend numerous times without breaking or degrading.

Figure 16A:
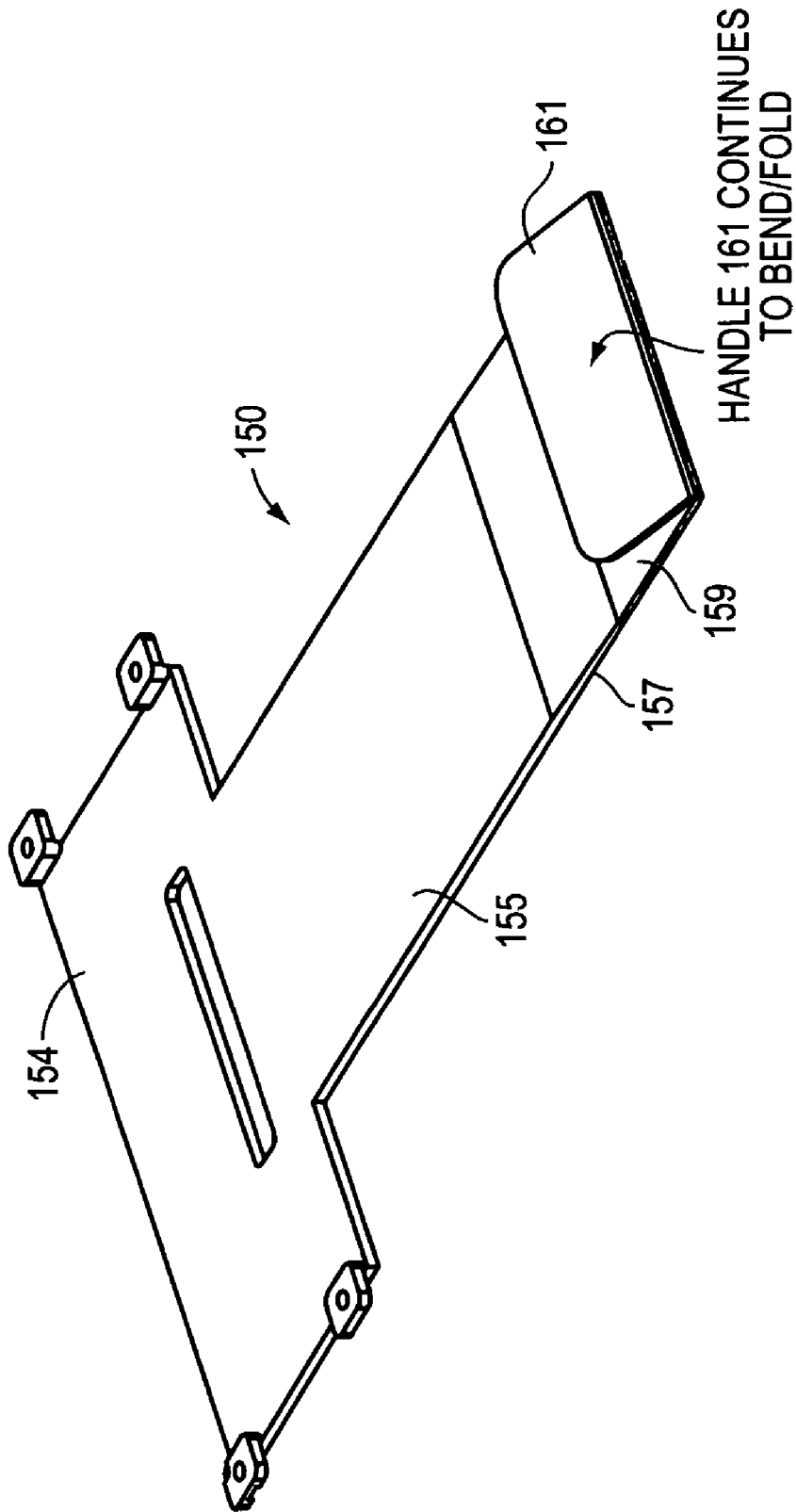
FIG. 16A is an isometric view of a tray-like device of FIG. 14 with a handle portion thereof in a partially closed position.

It is noted that, as shown in FIGS. 16A, 16B that the handle portion 161 is adapted to fold flush with the intermediate portion 155 and the distal portion 154, as shown in FIG. 16B. More particularly, because the thickness of the handle portion 161 and the extension portion 159 are each half the thickness of the intermediate portion 155 and the distal portion 154, the handle portion 161 is configured to fold flush with the intermediate portion 155 and the distal portion 154, as shown in FIG. 19 to provide a substantially flay tray-like device as shown.

Figure 17:
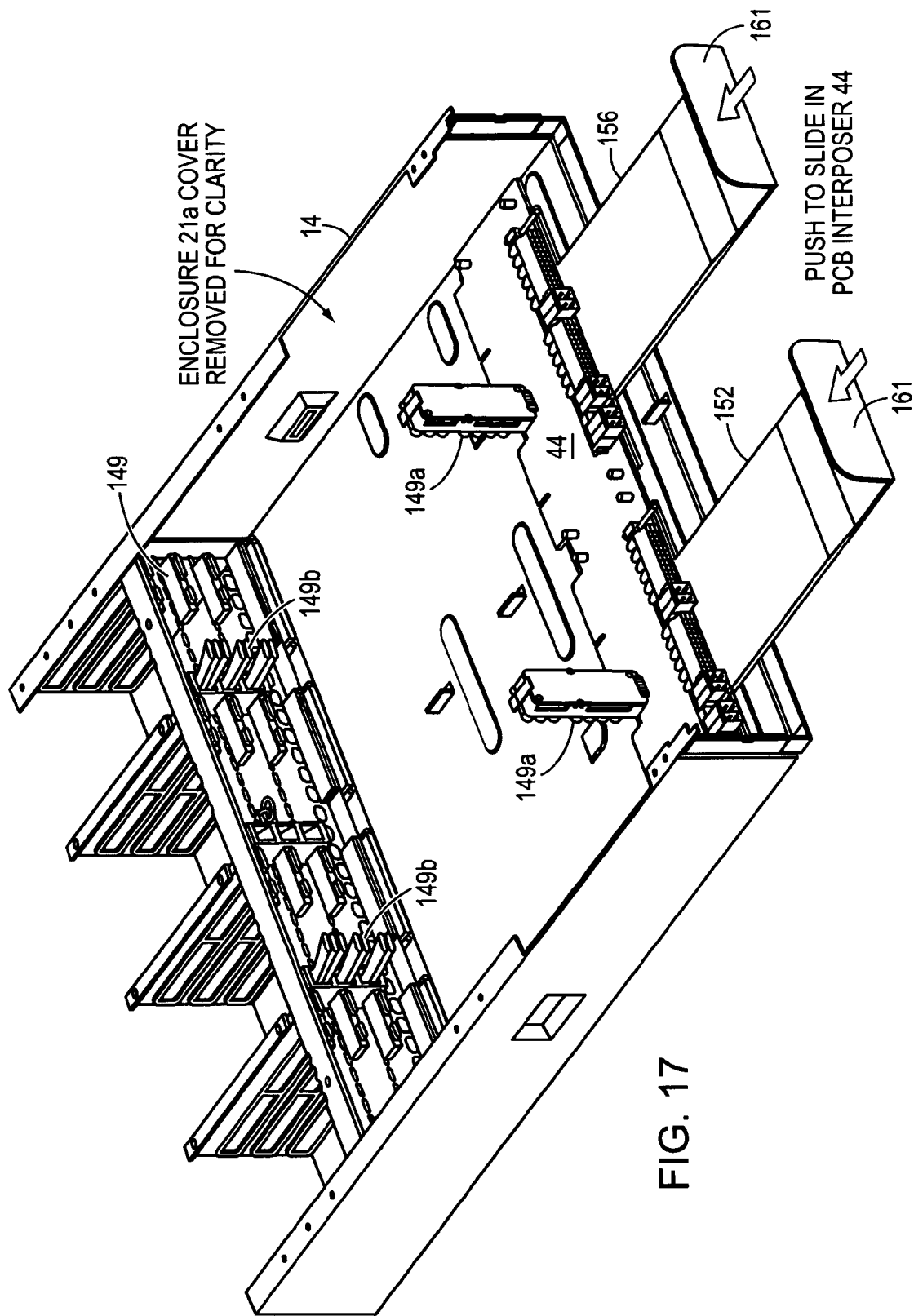
FIG. 17-19 are a series of isomeric views of a cover of exemplary one of the pair of storage processor chassis of FIG. 13 with the cover removed to show the process of inserting an interposer printed circuit board with the tray like device of FIG. 14
Figure 18:
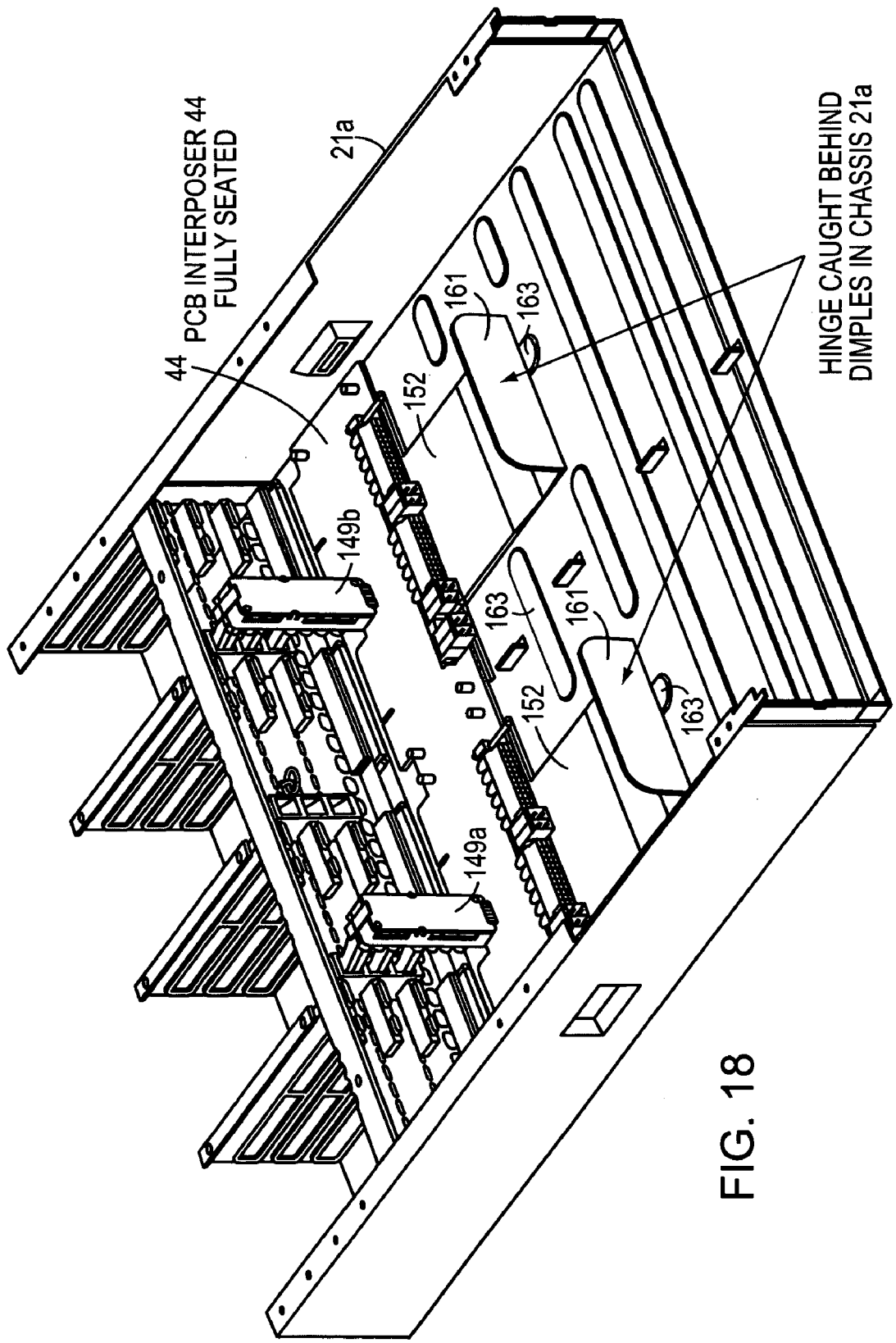
Figure 19:
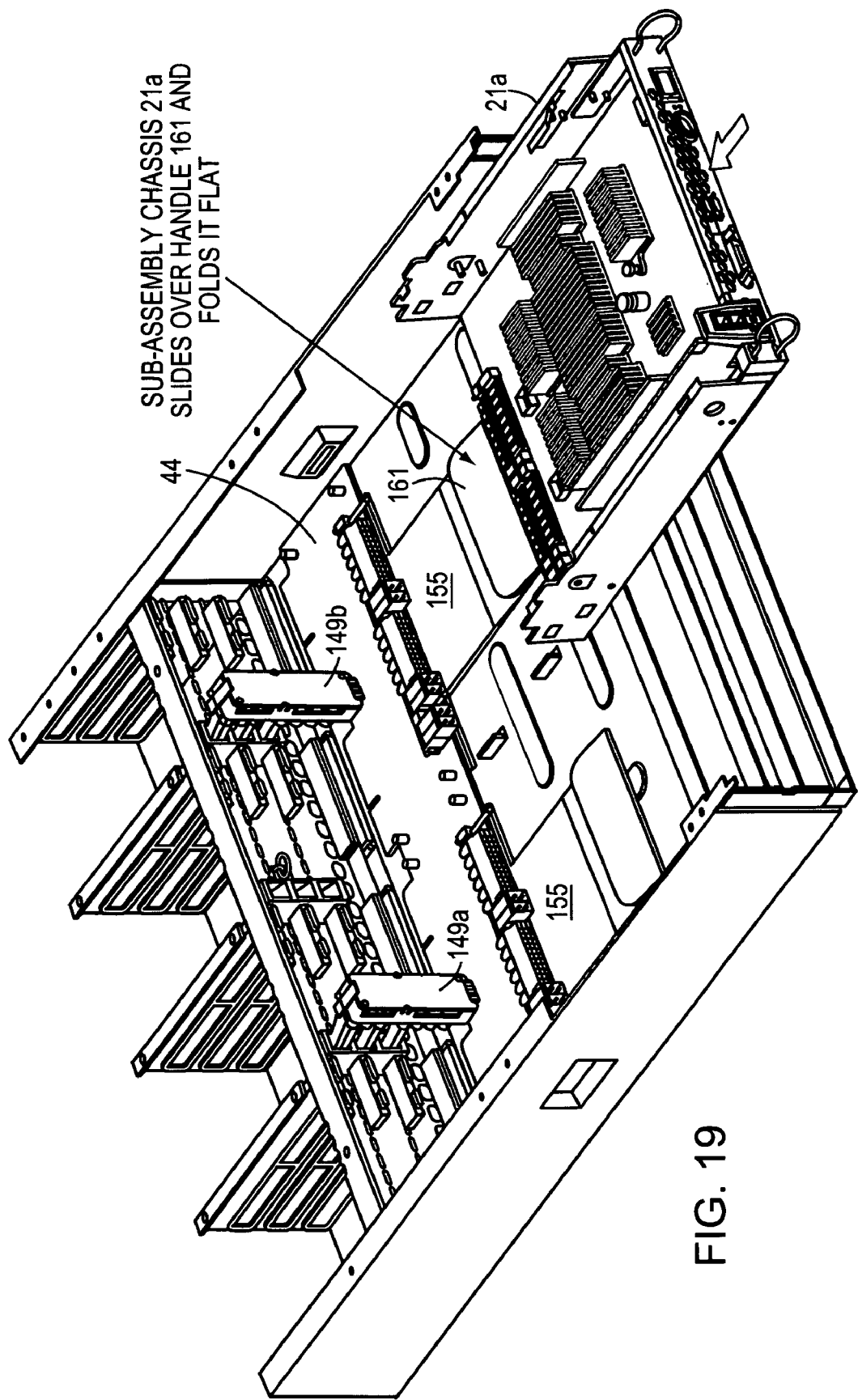

In operation, and referring to FIGS. 17, 18 and 19, with the bank 22 of disk drives mounted to the front end of the DPE chassis 14 but not shown for purposes of understanding the operation) and with the cover 31, FIG. 12A not shown in FIGS. 17-19 for purposes of understanding the operation) but mounted to the top of the DPE chassis 16, a technician, not shown places his/her fingers on the handle portion 161 of the tray-like device 150 with the multiplexer PCB interposer 44 mounted to such device 150, as shown, and continues to slide the tray 150 into the DPE chassis 14 until the multiplexer PCB interposer 44 (with the plugs 148a mounted to such interposer 44 for engagement with receptacles 149b) plugs into the bank 22 disk drives. It is noted that dimples 163 formed in the bottom of the DPE chassis 14 provide a place for the hinged portion to rest against, keeping the entire assembly from becoming inadvertently disengaged.

Next, the technician slides one of the chassis 21a, 21b (FIG. 19) into the DPE chassis 14. It is noted that the front portion of the chassis 21a engages the handle portion 161 thereby pivoting the handle portion 161 about hinge portion 162 (FIG. 14) forward to that the chassis 21a can continue to be slid into the DPE chassis 14 and plug into the back end of the multiplexer PCB interposer 44; (i.e., LEDs 149a are pushed into the receptacles 149b).

After insertion of one chassis 21a, the process in repeated for the second chassis 21b, not shown in FIG. 19.

Thus, from the above, it is noted that the slim, here about one-quarter inch thick, try-like device which attaches to the multiplexer PCB interposer 44 serves as a tray (or sled) to support, protect, and guide the PCB into the enclosure to its proper/final position.

As described above, the handle portion 151 is the used by the hands of the technician to insert and extract the PCB interposer 44 from deep within a computer enclosure, here the DPE chassis 14. The handle portion 151 is bent up to act as a handle to insert and "seat" the PCB, here the interposer 44 in its proper position into the bank 22 of disk drives. Other assemblies can now slide in and ride-over the handle portion by continuing to fold the handle portion 151 back on itself to essentially lay flat. This minimizes the space the handle occupies when not in use.

When subassemblies, which nest over top of the handle in a finished assembly, are removed, the folded handle is exposed. The technician can now reach in and fold the handle up to about a 90-degree position for grabbing and extracting the PCB assembly from the system.

Chassis/Suitcase Air Flap

Figure 13:
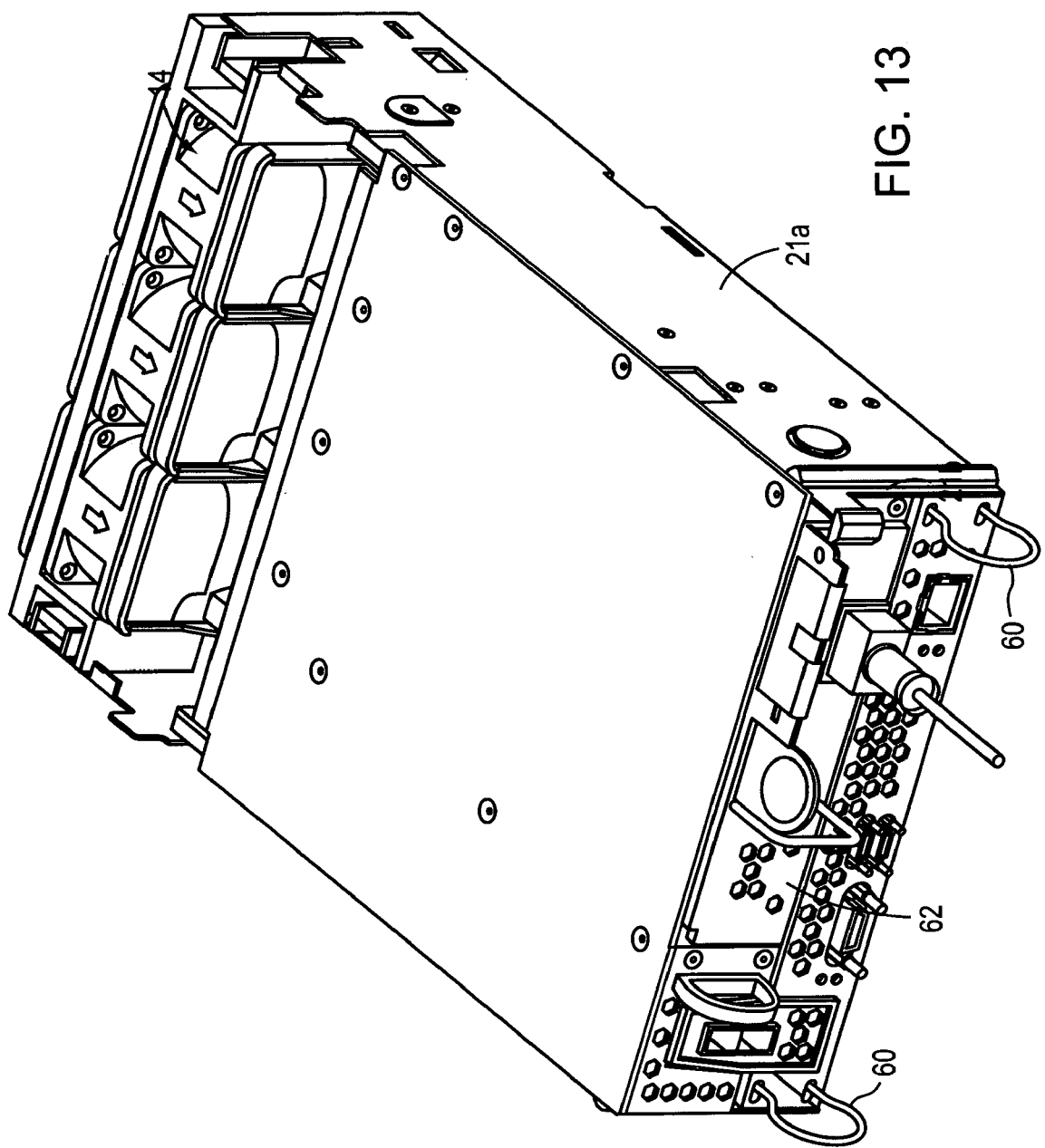
FIG. 13 is an isometric view of an exemplary one of a pair of storage processor chassis stored in the DPF of FIG. 12A according to the invention.
Figure 20:
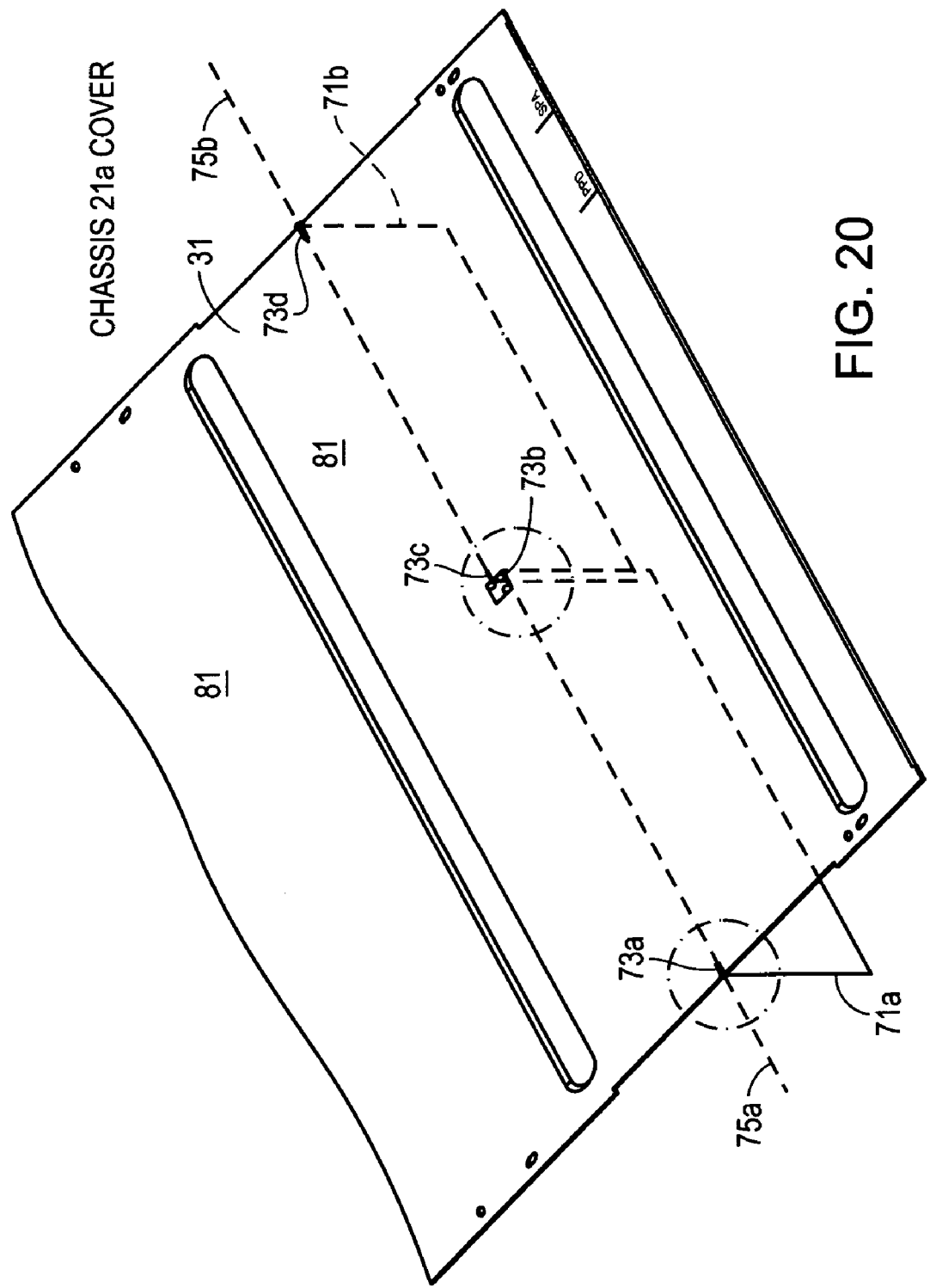
FIG. 20 is a top isometric view of a cover for an exemplary one of the pair of storage processor chassis of FIG. 13 according to the invention.
Figure 21:
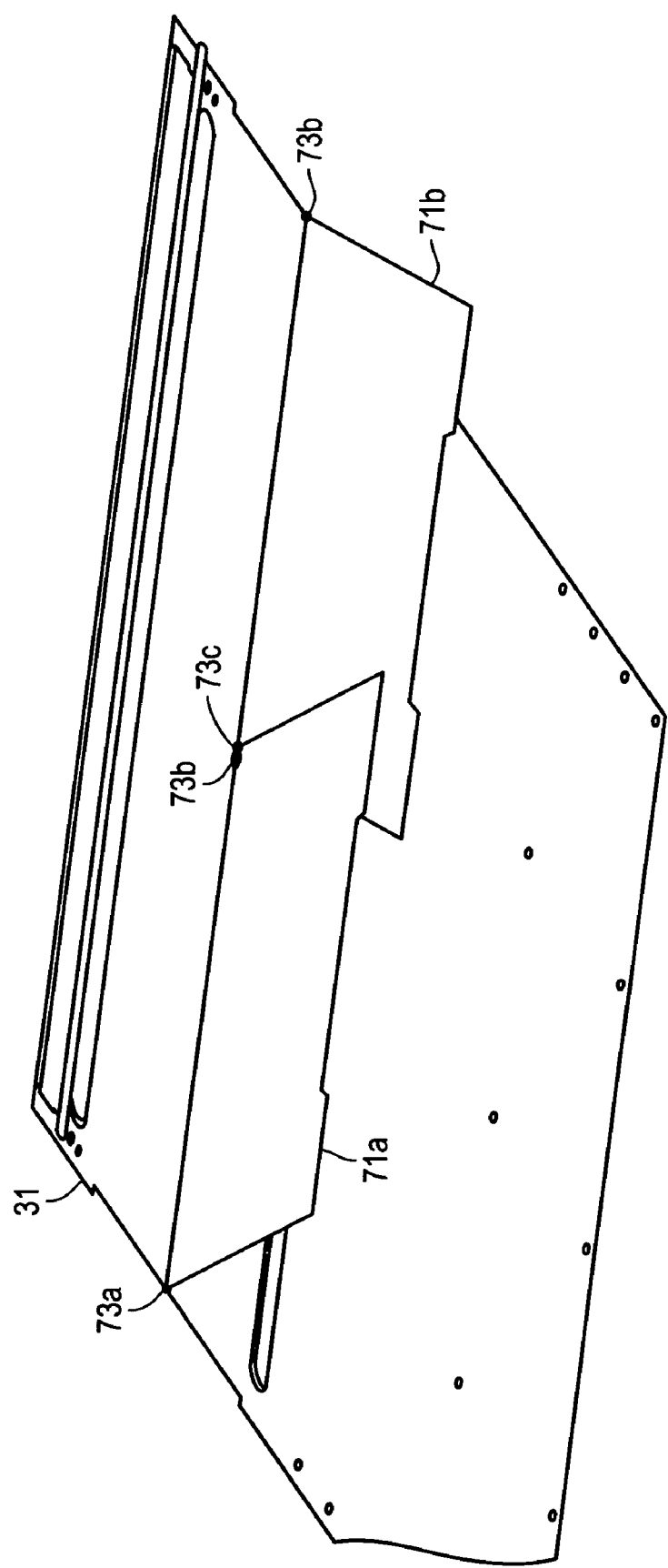
FIG. 21 is a bottom isometric view of the cover of FIG. 20.
Figure 22A:
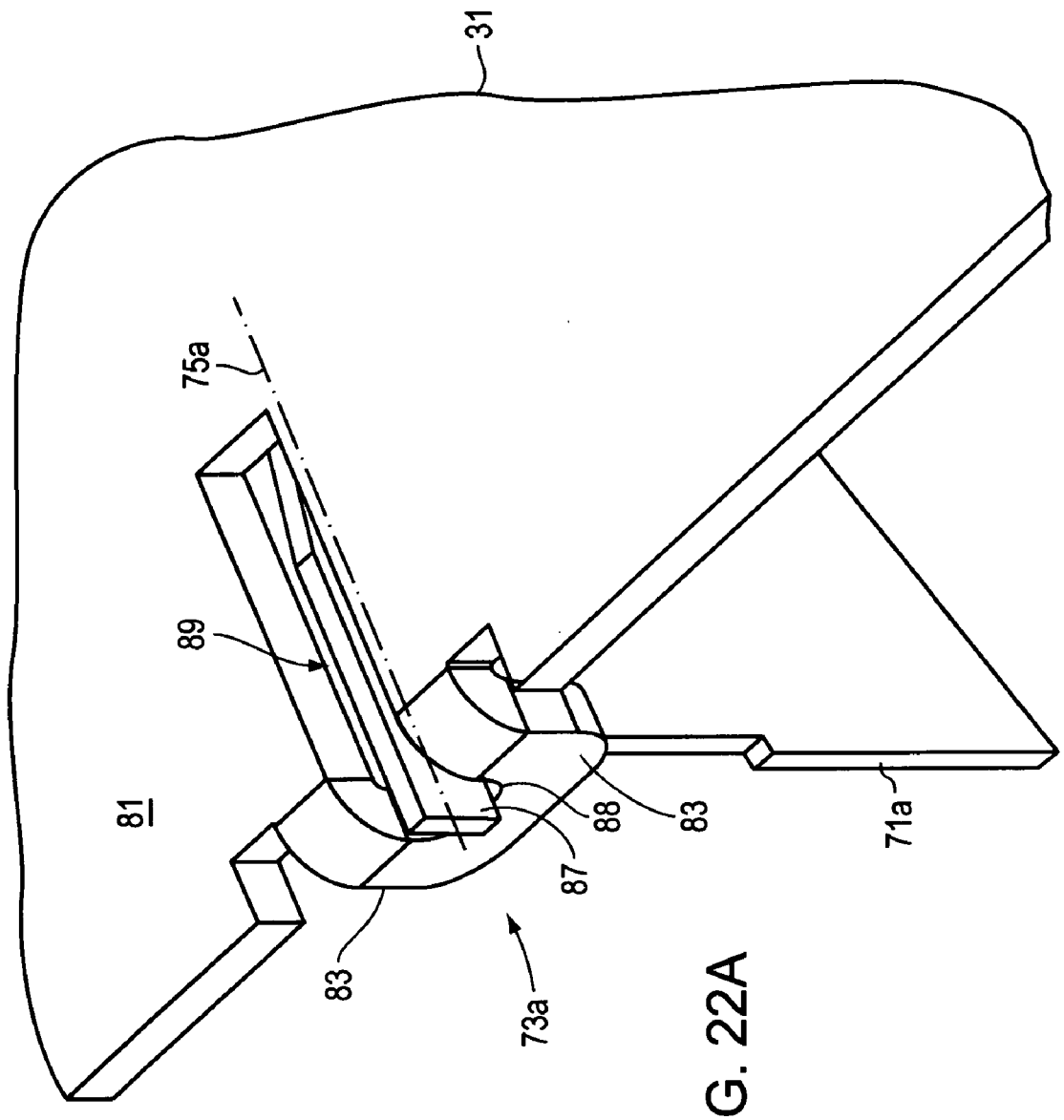
FIG. 22A is an enlarged isometric view of one of a pair of hinges used for one of a pair of flaps pivotally mounted to the cover of FIG. 20 and 21.
Figure 24A:
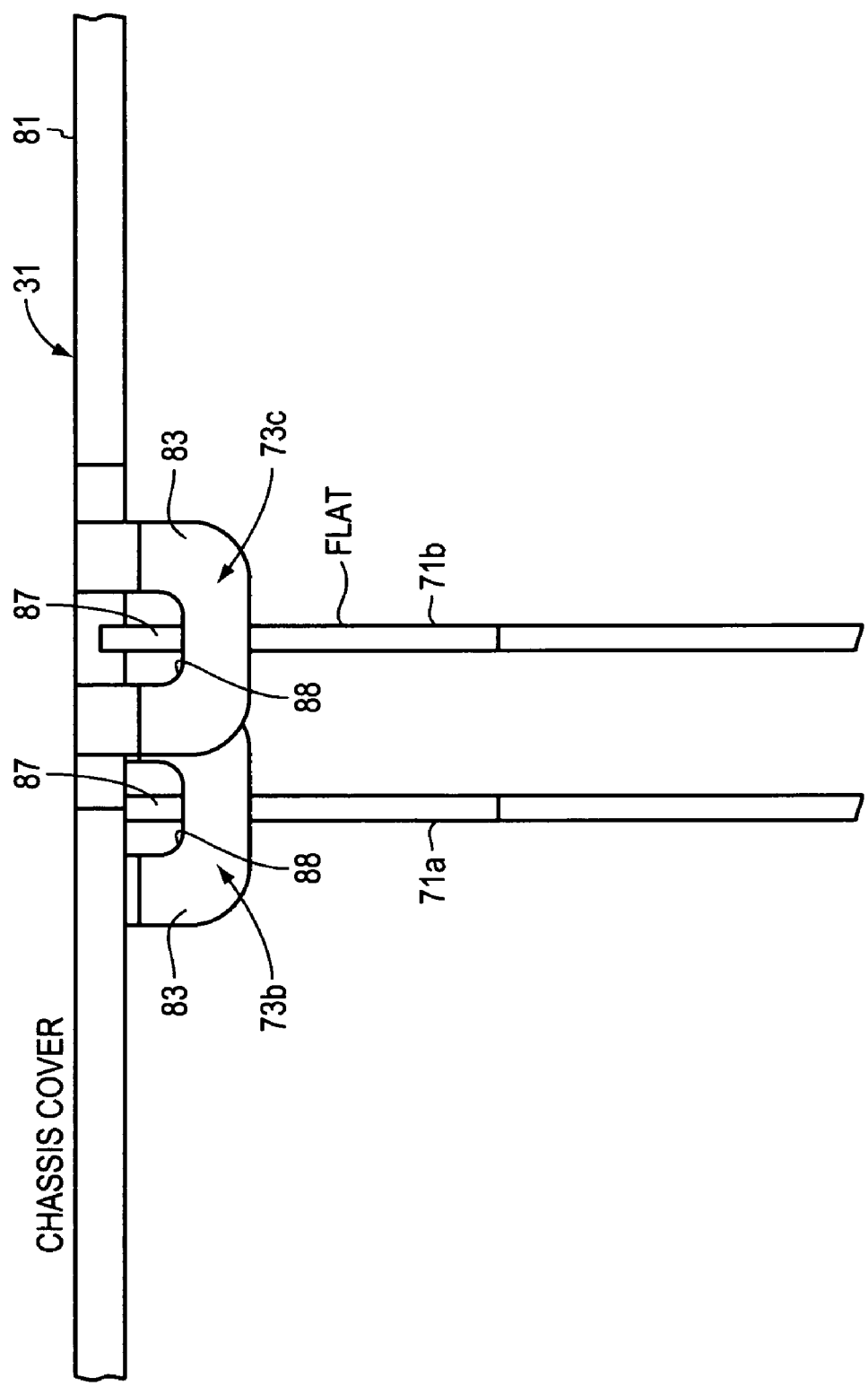
FIGS. 24A-24C are a series of side views of the cover of FIG. 20 with the flap in a vertical position, pivoted to a position between the vertical position and a horizontal position, and with the flap in a horizontal position, respectively.
Figure 24B:
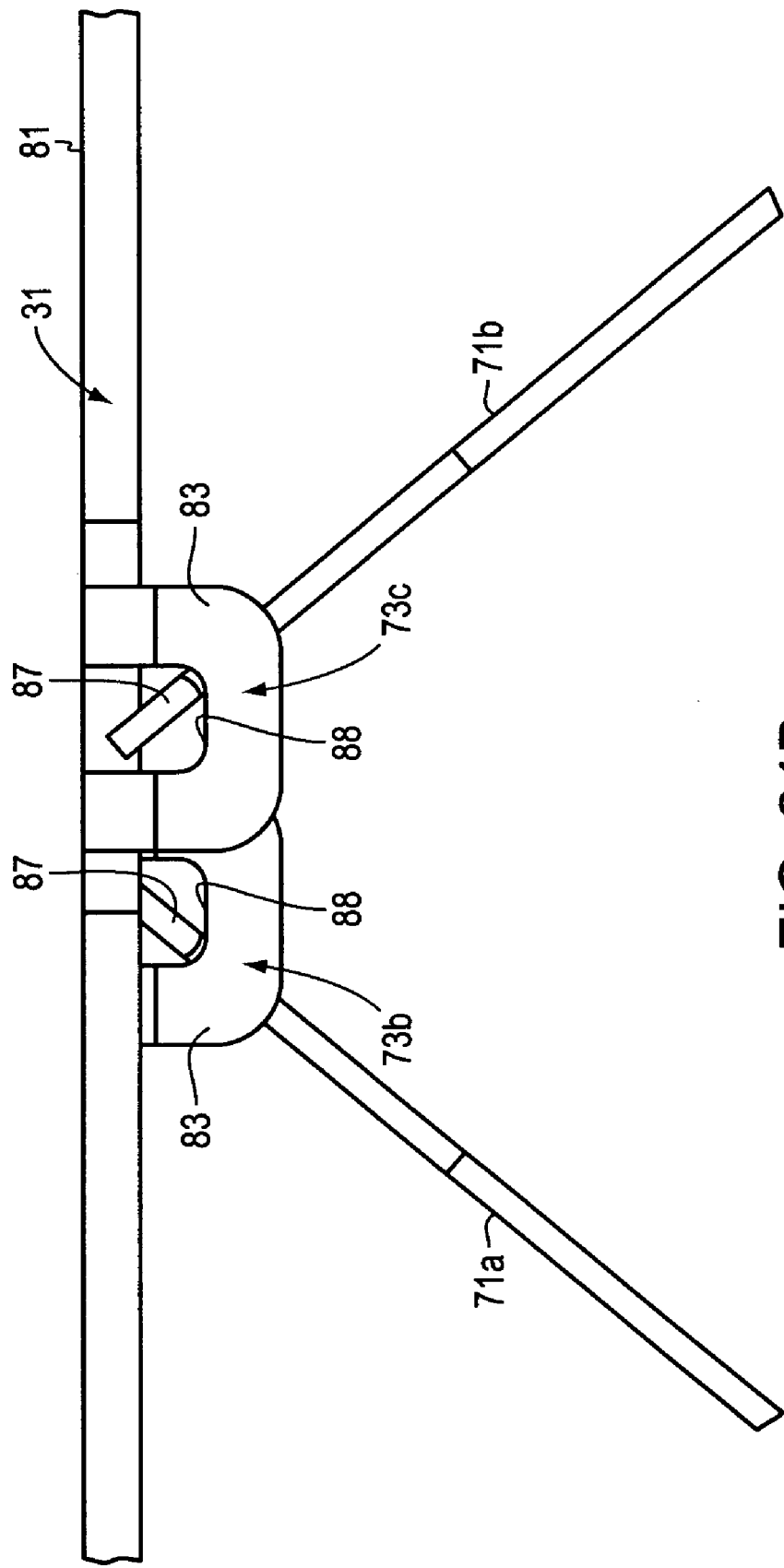
Figure 24C:
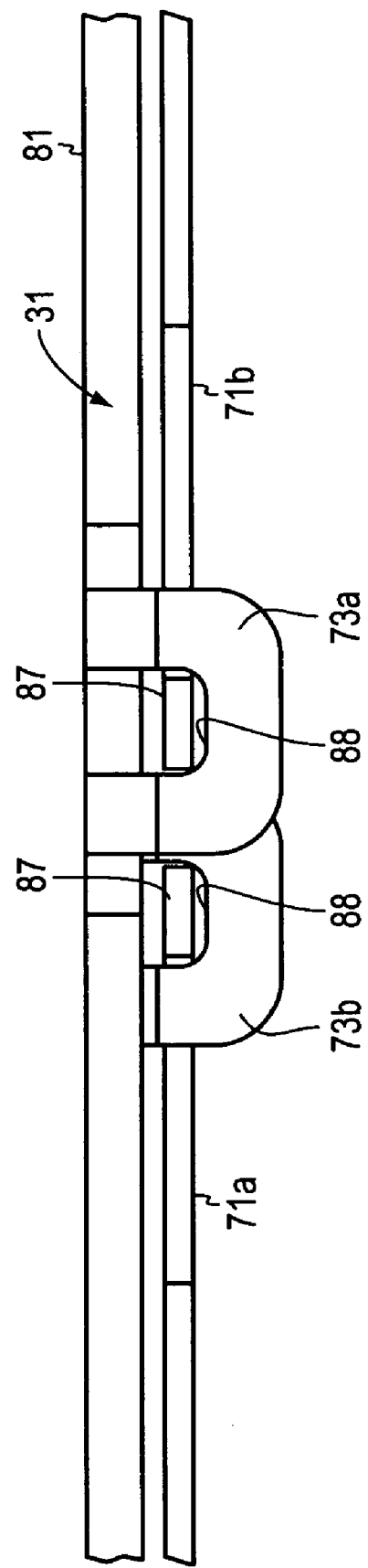

Referring now to FIG. 20, the top of an exemplary one of the covers 31 of chassis 21a, or 21b, FIG. 13, is shown. The bottom of the cover 31 has a pair of pivotally mounted flaps 71a. 71b. Flap 71a is hinged to the cover 31 by a pair of hinges 73a, 73b and flap 71b is hinged to the cover 31 by hinges 73c, 73d. The flaps 71a, 71b pivot, as shown in FIG. 21, in the hinges 73a-73d about laterally spaced axis 75a, 75b, respectively, to fall to a vertical orientation by gravitational forces when the planar surface of the cover 31 is in a horizontal plane, as shown in FIGS. 20, 22A, and 24A. It is noted that the flaps 71a, 71b are able to pivot forward of the vertical orientation substantially ninety degrees or backwards ninety degrees upon engagement with the vertically extending towers 149a (FIG. 17) or the chassis 21a (FIG. 19) or chassis 21b (FIG. 12B). FIG. 24B show the flaps 71a and 71b in a partially forward and partially rearward position, respectively. FIG. 24C show the flaps 71a and 71b in a fully forward horizontal position and fully rearward horizontal rearward position, respectively.

More particularly, when the interposer 44 is inserted into the DPE 14, as shown in FIG. 17, the towers 149a push both flaps 73a, 73b forward from the vertical orientation to the horizontal positions, to enable the towers 149a to engage receptacles 149b. (Conversely, when the interposer 44 is removed from the DPE 14, the towers 149a push both flaps 73a, 73b backwards from the vertical orientation, to enable the interposer 44 to be removed from the chassis 21a.

Also, when chassis 21a, is inserted into the DPE chassis 14, as shown in FIG. 19, the forward portion of the chassis 21a pushes the flap 71b (FIG. 20) forward from the vertical orientation, to enable the chassis 21a to engage inserted interposer 44 while flap 71b remains in the vertical orientation. Conversely, when chassis 21a, is removed from the DPE chassis 14, flap 71b (FIG. 20) returns to the vertical orientation by gravitational forces. It is noted that the flap 71a remains in the vertical orientation in chassis 21b is absent from the DPE chassis 14. Thus, air flow from the fan unit 17a (FIG. 12B) is prevented from exiting the open slot in the chassis 14 otherwise occupied by the chassis 21b. Therefore, a hot swap removal of chassis 21b will still provide proper air flow and hence cooling of the interior of the DPE chassis 14.

In like manner, when chassis 21b, is inserted into the DPE chassis 14, the forward portion of the chassis 21b pushes the flap 71a (FIG. 20) forward from the vertical orientation, to enable the chassis 21b to engage inserted interposer 44 while flap 71a remains in the vertical orientation. Conversely, when chassis 21b, is removed from the DPE chassis 14, flap 71a (FIG. 20) returns to the vertical orientation by gravitational forces. It is noted that the flap 71b remains in the vertical orientation in chassis 21b is absent from the DPE chassis 14 (or is in the forward position in the presence of chassis 21a). Thus, air flow from the fan unit 17b (FIG. 12B) is prevented from exiting the open slot in the chassis 14 otherwise occupied by the chassis 21*a*. Therefore a hot swap removal of chassis 21*a* will still provide proper air flow and hence cooling of the interior of the DPE 14.

Figure 22B:
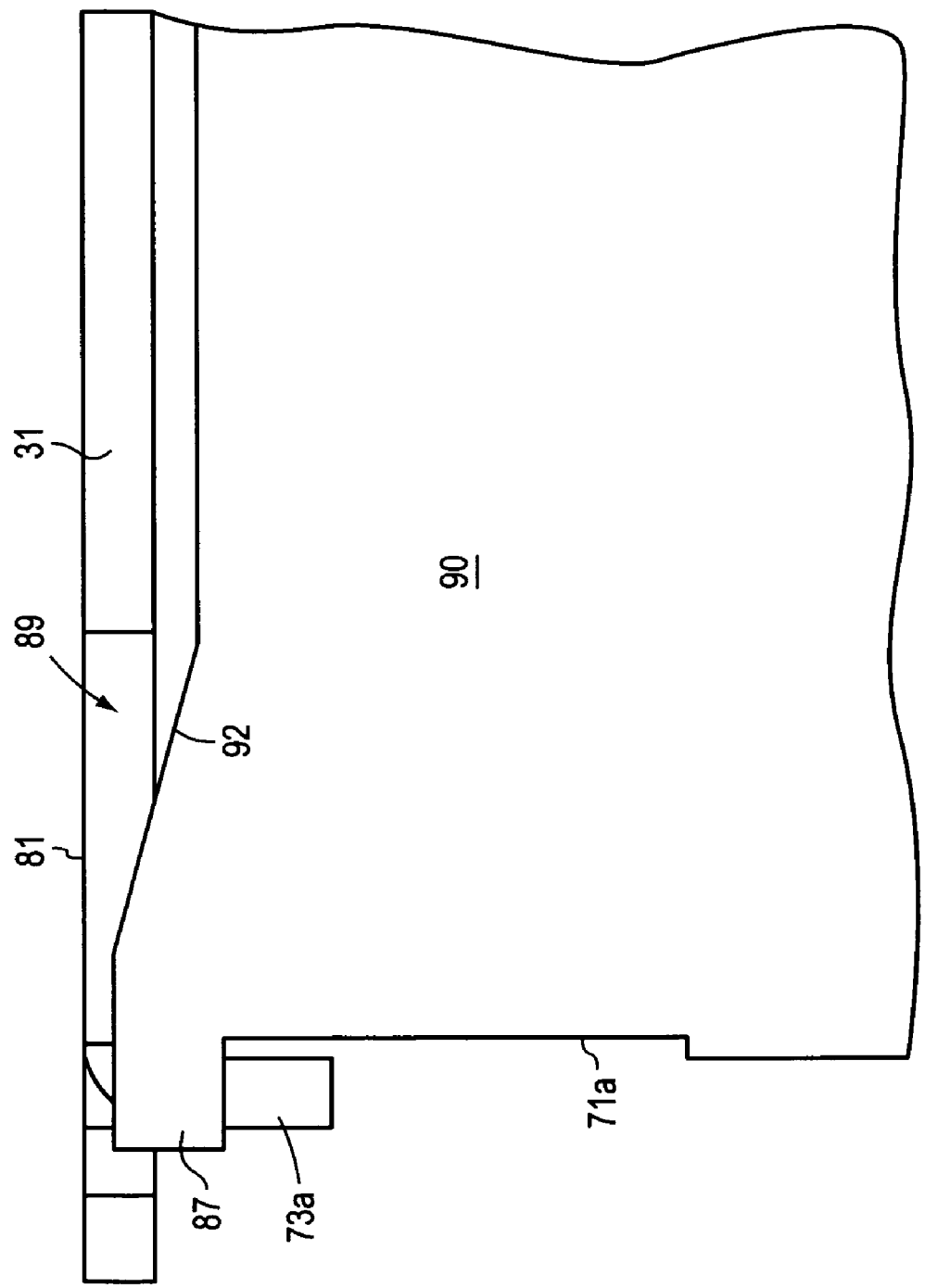
FIG. 22B is an enlarged cross-sectional isometric view of the hinge of FIG. 22A.
Figure 23A:
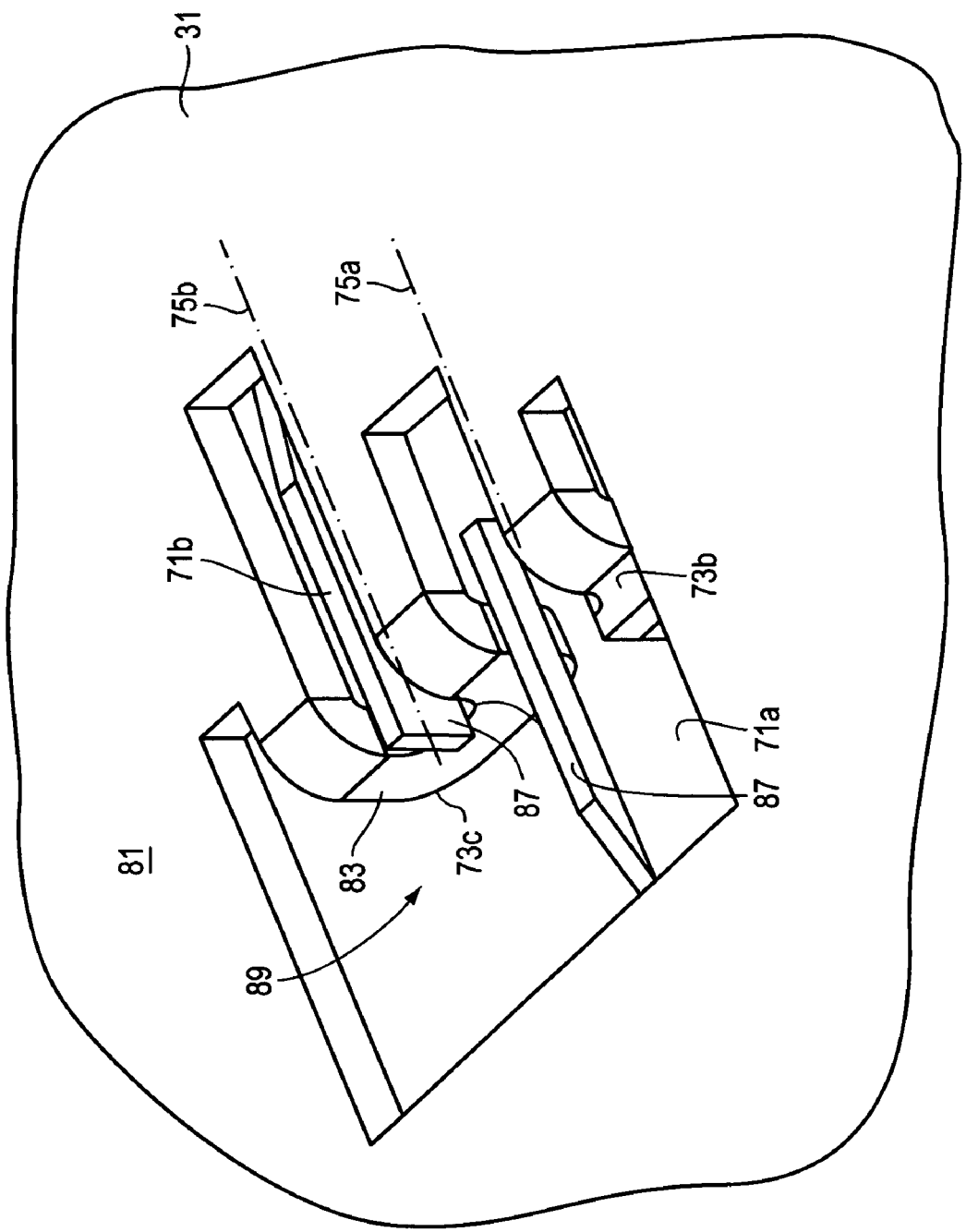
FIG. 23A is an enlarged isometric view of a second one of a pair of hinges used for one of a pair of flaps pivotally mounted to the cover of FIG. 20 and 21.
Figure 23B:
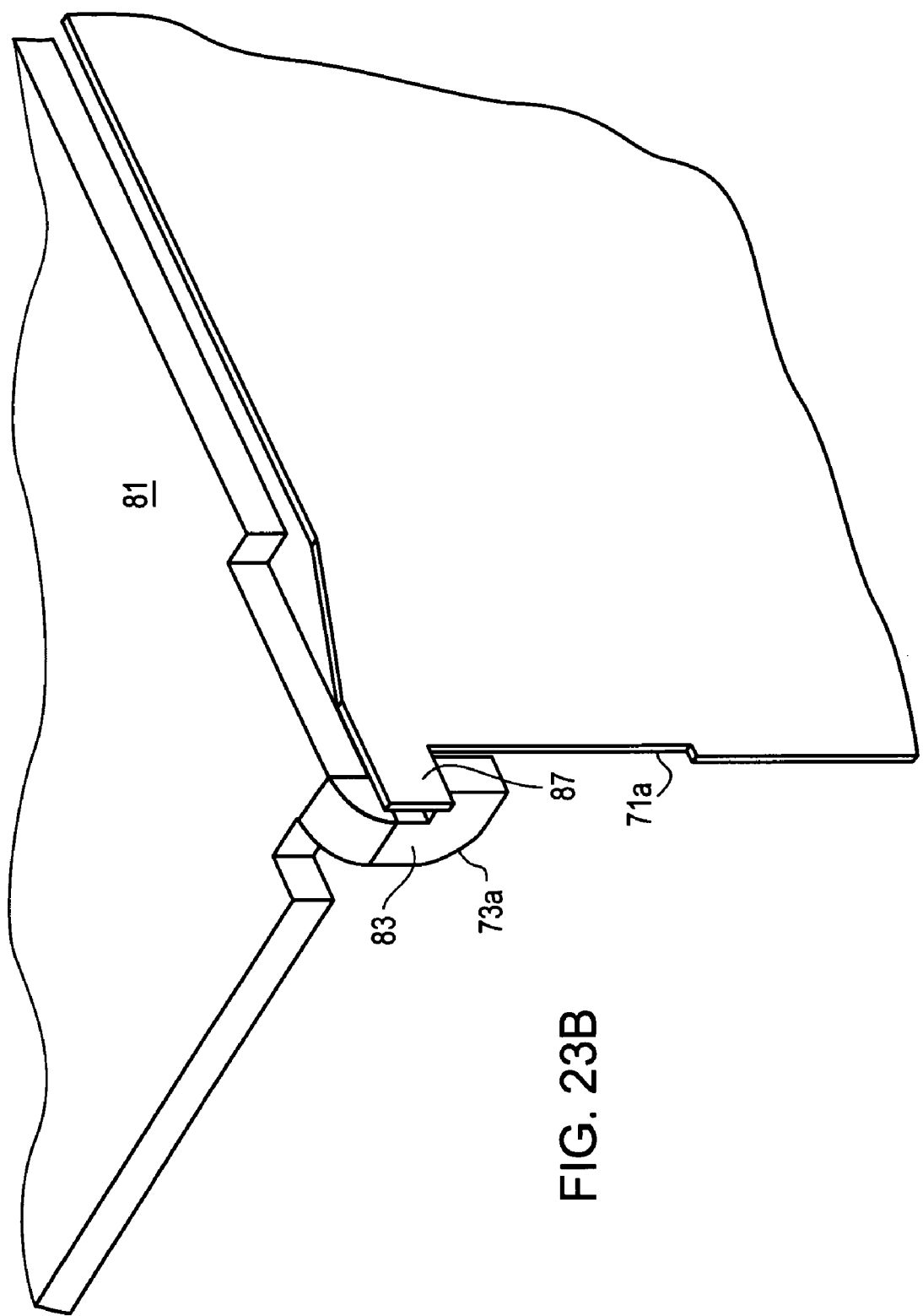
FIG. 23B is an enlarged cross-sectional isometric view of the hinge of FIG. 23A.

Referring also to FIGS. 22A, 22B, and 23B, such FIGS. show an exemplary one of the hinges 73*a*, 73*d* (FIG. 20), here hinge 73*a* shown in more detail. Referring also to FIG. 23A, such FIG. shows hinges 73*c* and 73*d* in more detail. More particularly, the cover 31 has planar surface portions 81. The cover 31 has formed therein the hinges 73*a*-73*d*. Each one of the hinges 73*a*-73*d* is a U-shaped hinge perpendicular to the planar surface portions 81 of the cover 31 and with the 83 arms of such hinges 73*a*-73*d* terminating at the planar surface portions 81.

The cover 31 has slots 89 therein aligned with U-shaped hinges 73*a*-73*d* for receiving the arms 83 of the flaps 71*a*, 71*b*, as shown in FIGS. 22A, 23A.

Each flap 71*a*, 71*b* has a pair of arms 87 at ends thereof, the arms 87 being pivotally disposed in the U-shaped hinges 73*a*-73*d*. Surfaces 88 of the U-shaped hinges providing a camming surface for the arms 87 to pivot the flaps 71*a*, 71*b* between a vertical position perpendicular to the surface portions 81 of the cover 31 as shown in FIG. 24A and the horizontal position parallel to the surface portions 81 of cover 31, shown in FIG. 24C as such flaps 71*a*, 71*b* pass through intermediate positions as shown in FIG. 24B.

Each flap 71*a*, 71*b* has a surface portion 90 (FIG. 22B) for flap 71*a*, connected to the arm 87 through a tapered region 92 (FIG. 22B), a portion of the tapered region 92 and the arm 87 being disposed in the slot 89, and the surface portion 90 of the flap 71*a* being disposed below the surface portion 81 of the cover 31, as shown on FIG. 22B. It should be noted that the cover 31 is stainless steel or other manually bendable resilient material. The process for inserting the arms 87 into the U-shaped hinges 73*a*-73*d* is as follows: The assembler bends the entire hinge 73*a*-73*d* by hand to a horizontal position, inserts the arms 87 into the hinges 73*a*-73*d*, and then releases the hinges and bends them back into the vertical position.

With this flap-cover arrangement, thin stainless steel doors or flaps and their pivot points in the cover 31 are designed to lay virtually flush with the inside surface of the cover 31 to maximize room for any sub-components in the chassis. The flaps are, as noted above, constructed of thin stainless steel for strength, flexibility, and weight (for gravity activation). Simple small rectangular features, i.e., the rectangular cross section of the arms 87 on each end of the flap function as pivot points. Between each flap pivot feature, the flap is taperered down, as described above in connection with FIG. 22B, to allow the flap pivots to raised to their maximum height without interfering with the remaining portions of the chassis cover 31.

The pivot features in the cover are formed out of the cover sheet metal to save space and cost. The flaps and the pivot features on the cover are "staggered" to allow the middle pivot points for each door to be on one bent flange, thereby minimizing the space required for the swinging door functionality. The pivot features allow the flaps to rotate through 180 degree of rotation; this is important in that it allows other large sub-components internal to the enclosure to be subsequently removed and reinstalled.

The flaps thus maintain consistent airflow through a computer product, even when sub-components are removed (called "hot-swapping" in the industry) is extremely important for the reliability and integrity of the product and its sub-components. When a sub-component is removed on a running system, the tendency is for the air-movers (fans or blowers) to pull air from the void made by the removed sub-component, thereby creating an airflow "short-circuit" and "starving" other electrical components (e.g. disk drives, CPUs, etc) from getting their necessary airflow.

Power Cord Bungee

Figure 25:
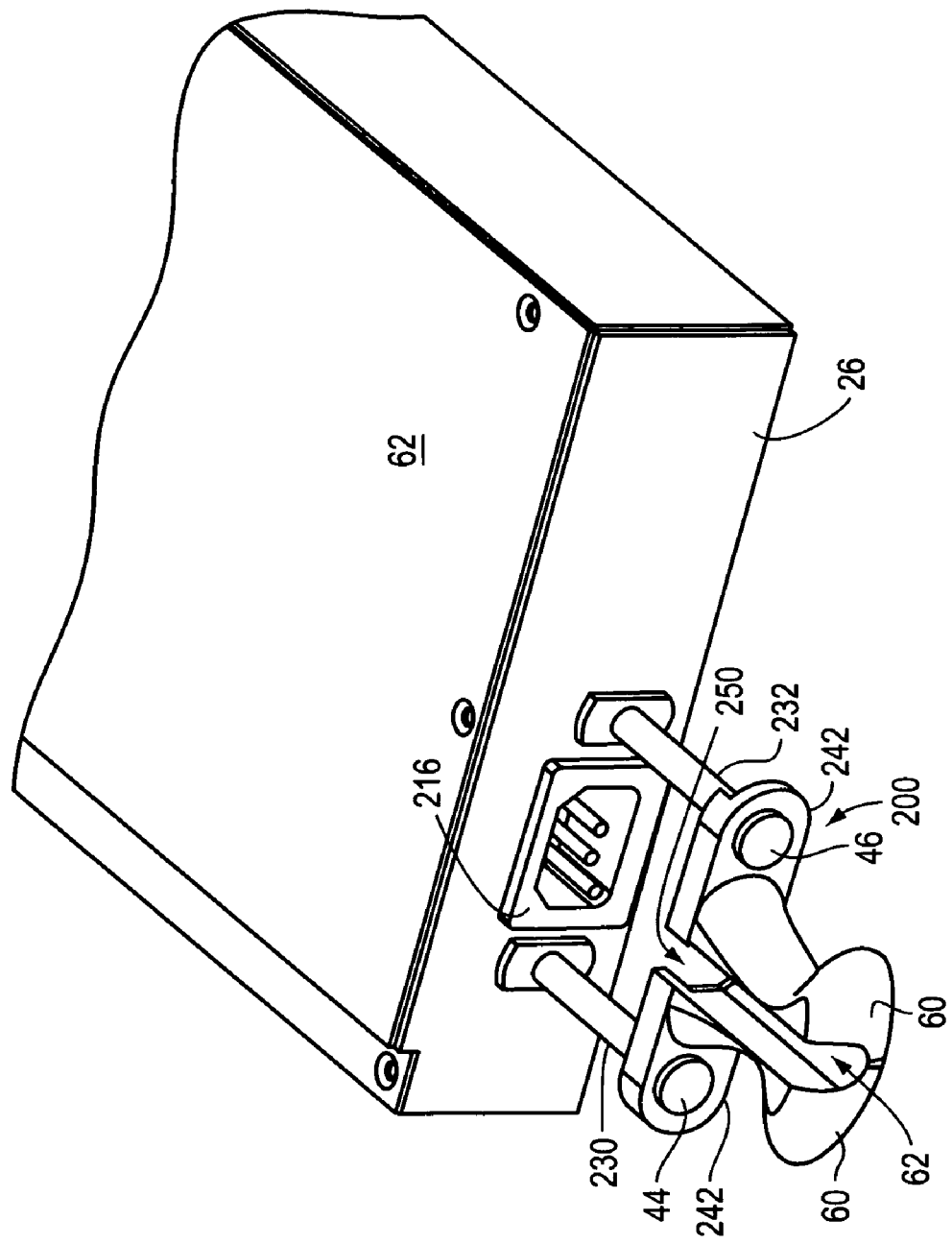
FIG. 25 is an isometric view of a cable retainer according to the invention and a power supply unit of the chassis of FIG. 13.
Figure 25A:
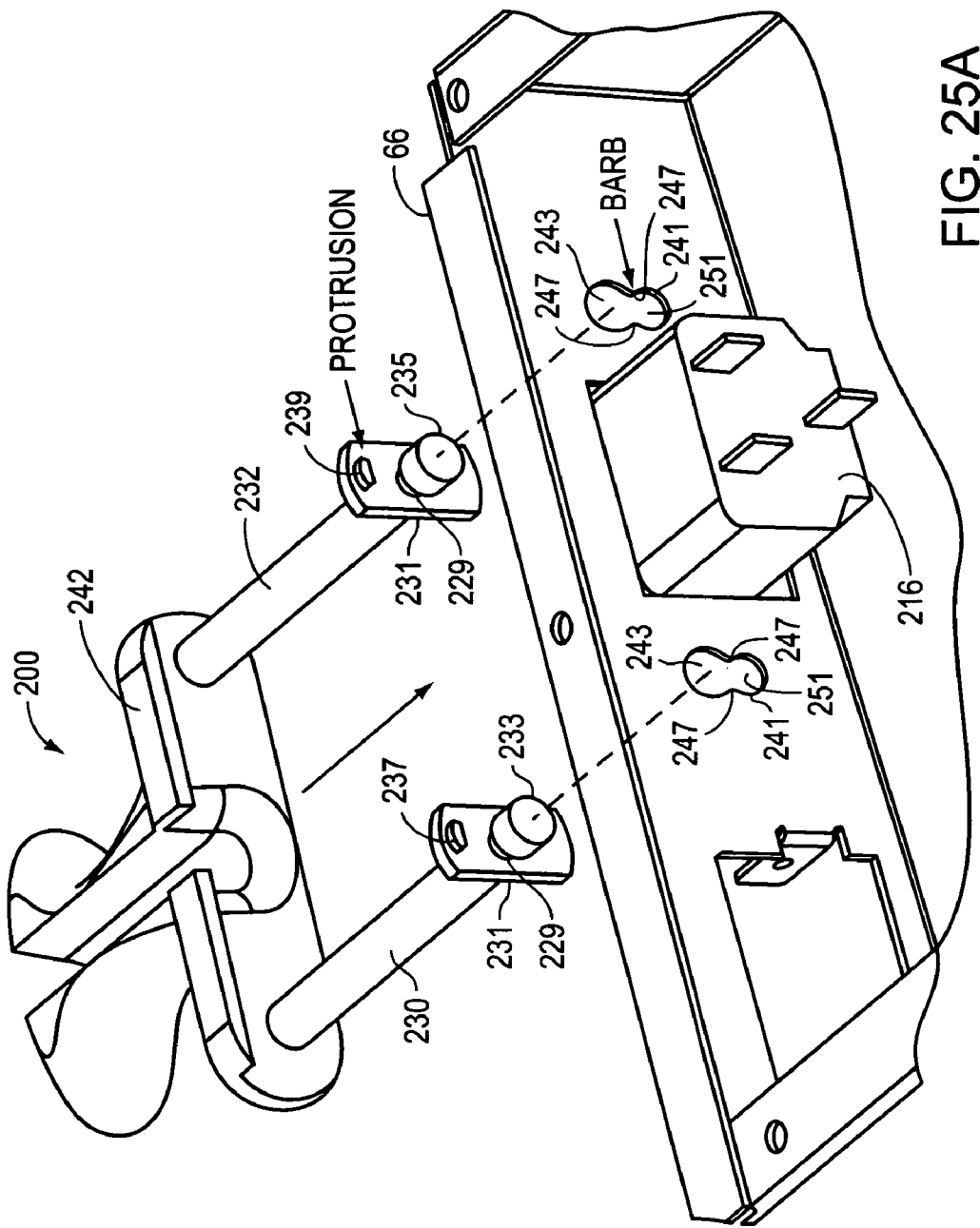
FIGS. 25A-25C is a series of views illustrating the manner of attaching the retainer of FIG. 25 to a chassis of the power supply of FIG. 25.
Figure 25B:
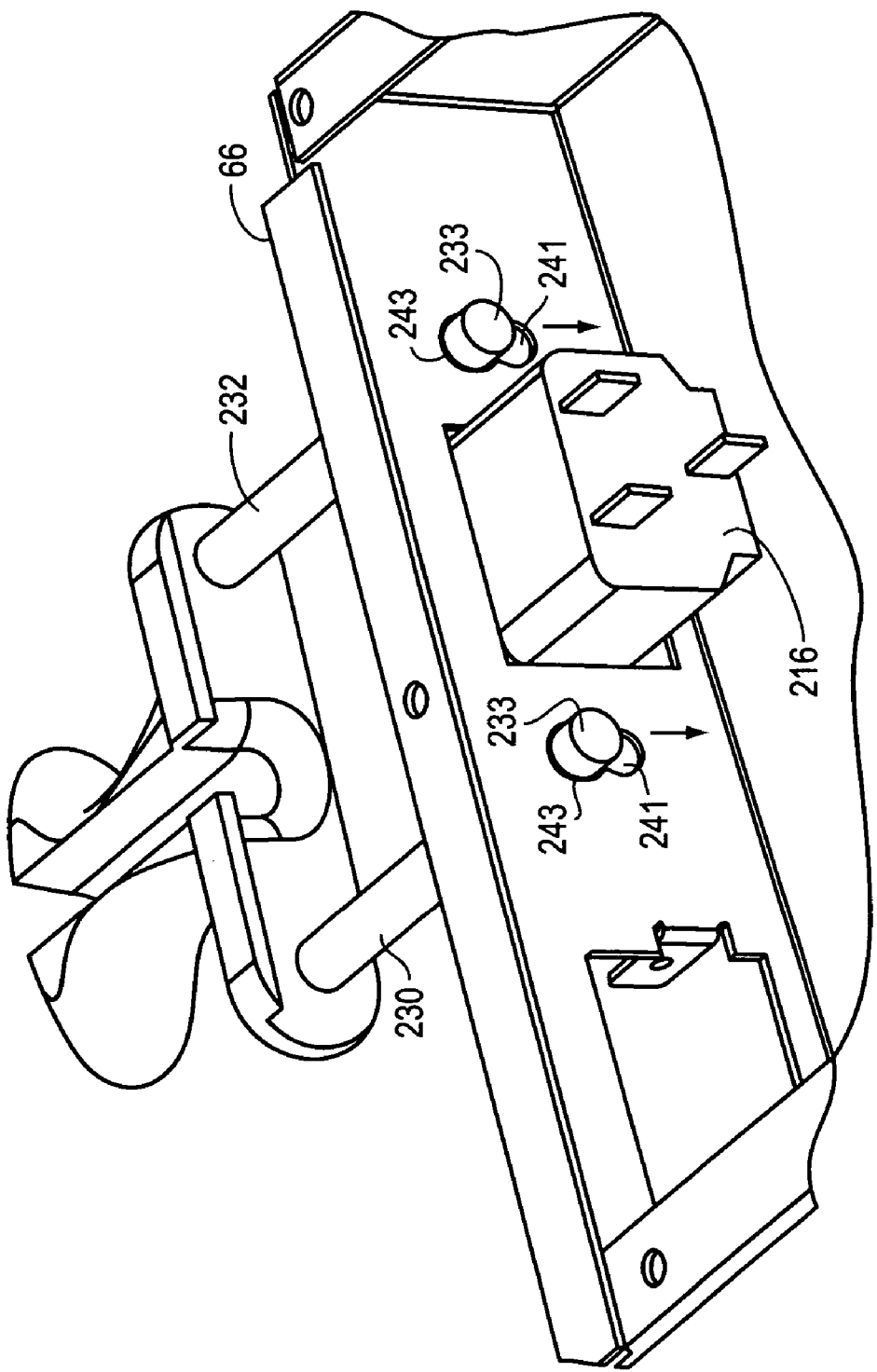
Figure 25C:
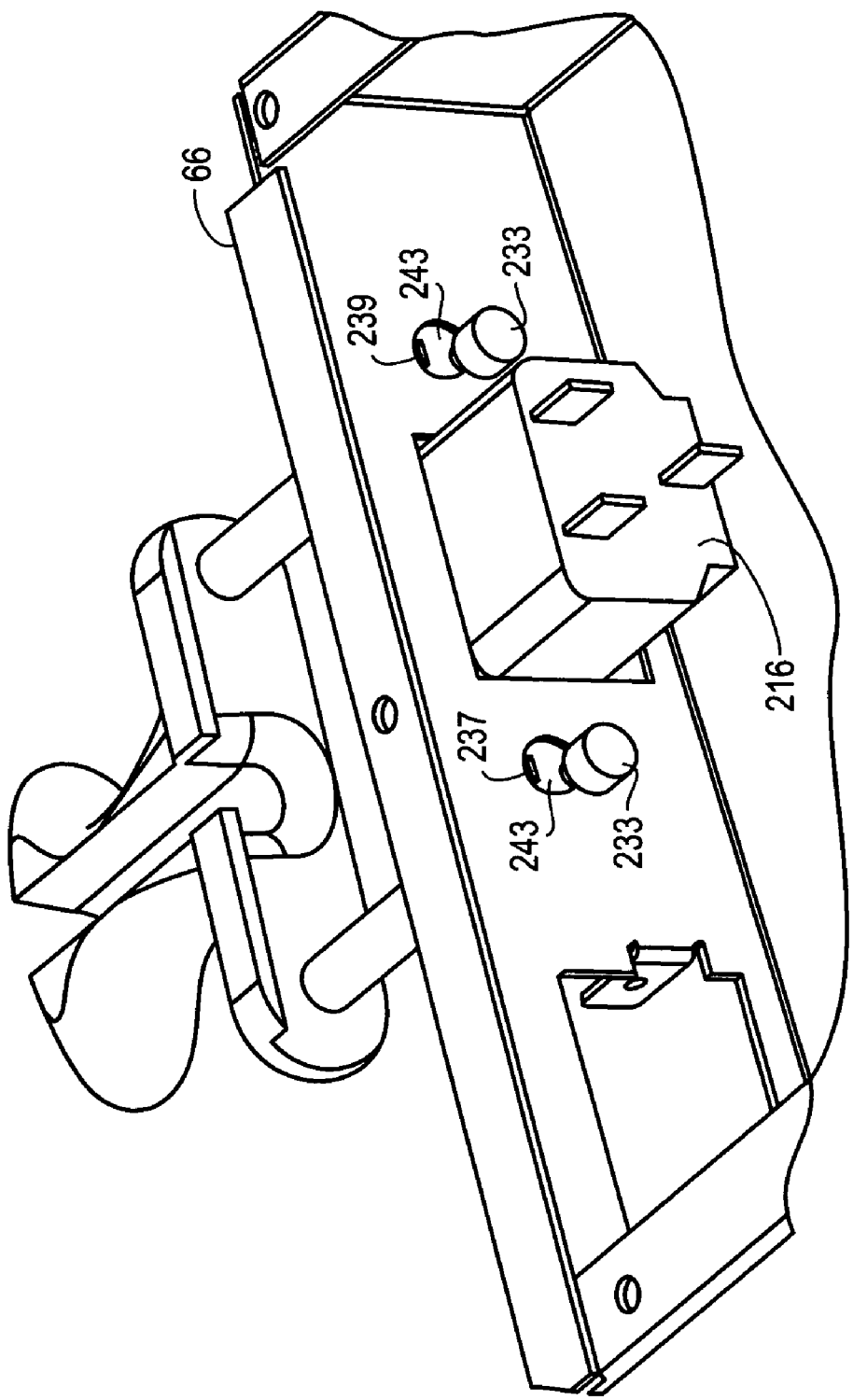

Referring now to FIG. 25, a power cord retainer 200 is shown for retaining a plug portion 212 (FIG. 26) of an electrical cord 214 in an electrical socket 216 mounted to a chassis, here the power supply chassis 62 (FIGS. 13 and 25). The retainer 200 includes a pair of resilient, self supporting posts 230, 232, here elastomer posts, each one having a distal end configured for affixation to inner wall position of the chassis 62 on opposing sides of the socket 216 as shown in FIGS. 25A-25B. Here, the distal ends of the posts 230, 232 have resilient flanges 231 with holes therethrough of a diameter through which pass the terminal ends 233, 235 of posts 230, 232. The flanges 231 are restrained in axial movement by undercuts 229 formed in end portions of the posts 230. The flanges 231 also have protrusions 237, 239. The chassis 62 has a pair of vertically positioned holes 241, 243, on each side of the plug 216 joined by barbs 247 between the holes forming passages 251. The diameters of holes 241 are smaller that the diameters of holes 247. The holes 247 are large enough to receive ends 233, 235, of posts 230, 232, as shown in FIG. 25B after such ends have been inserted into the chassis 62. The ends 233, 235 are then moved lower into holes 241 (FIG. 25C), it being noted that protrusions 237, 239 become inserted into holes 243 as shown in FIG. 25. The retainer 210 includes a pair of shoulders, 240, 242, (FIG. 25) here plastic, each one being affixed to a proximal end of a corresponding one of the pair of posts 230, 232 by passing button-like terminations 240, 246 at the distal ends of the posts 230, 232 through holes formed in the shoulders are affixed by an interference fit. The pair of shoulders 240, 242 are configured to form a grove, or trough 250 along adjacent inner sides thereof as shown in FIG. 25. The groove 250 is axially aligned with the socket 216, here a conventional three-prong IEC socket. The groove 250 is configured to receive the power cord 214 when the posts 230, 232 are in a stretched position as shown in FIGS. 26 through 29. The shoulders 240, 242 are configured to engage a rear portion of the plug 212 and together with the forces provided by the pair of posts 230, 232 when such posts are enabled to return to an unstretched, or contracted position, as shown in FIG. 29 retain such plug 212 in the socket 216.

Figure 26:
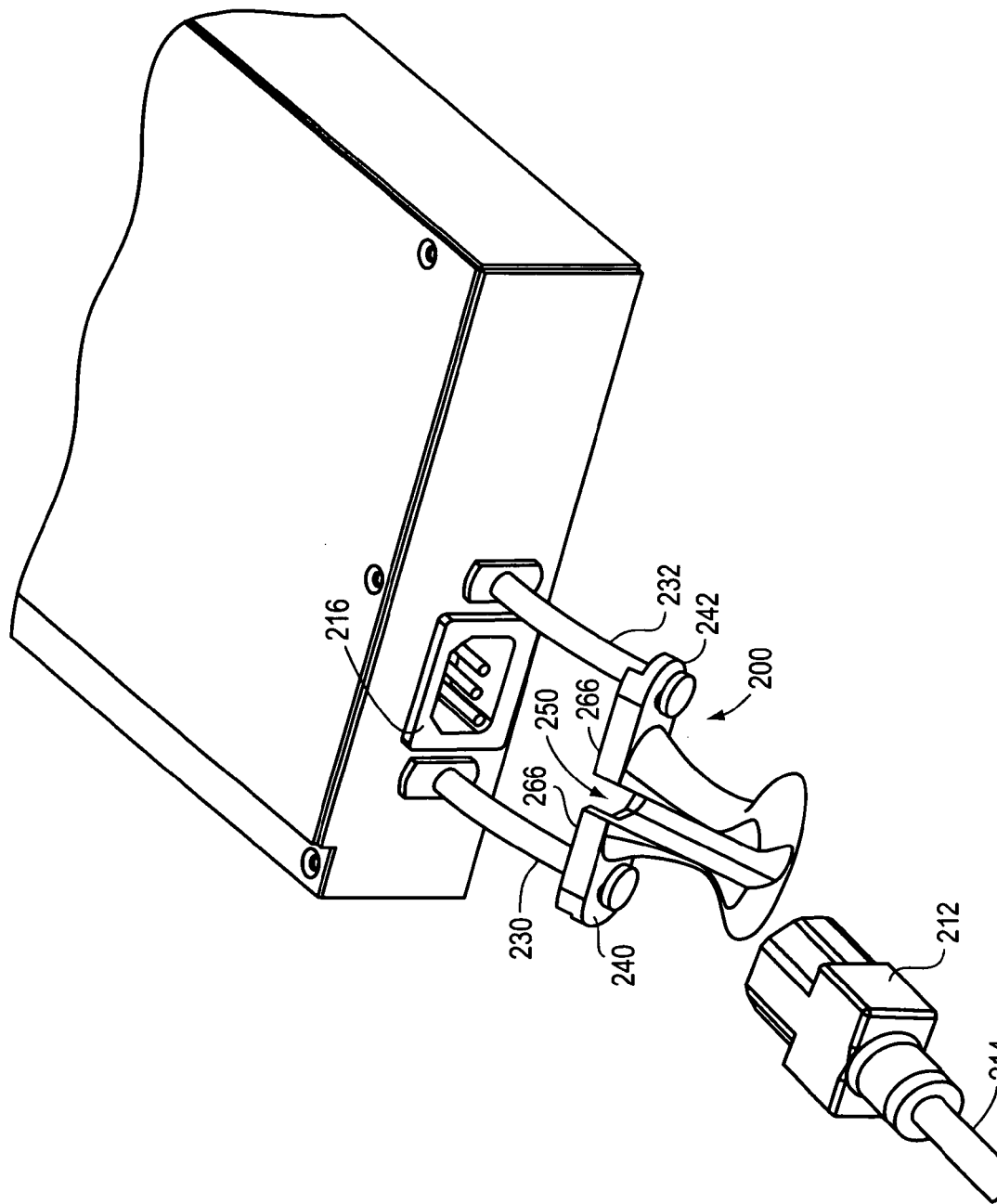
FIG. 26-29 is a series of views illustrating the manner of attaching the retainer of FIG. 25 to a power supply cord plugged into the power supply of FIG. 25.
Figure 27:
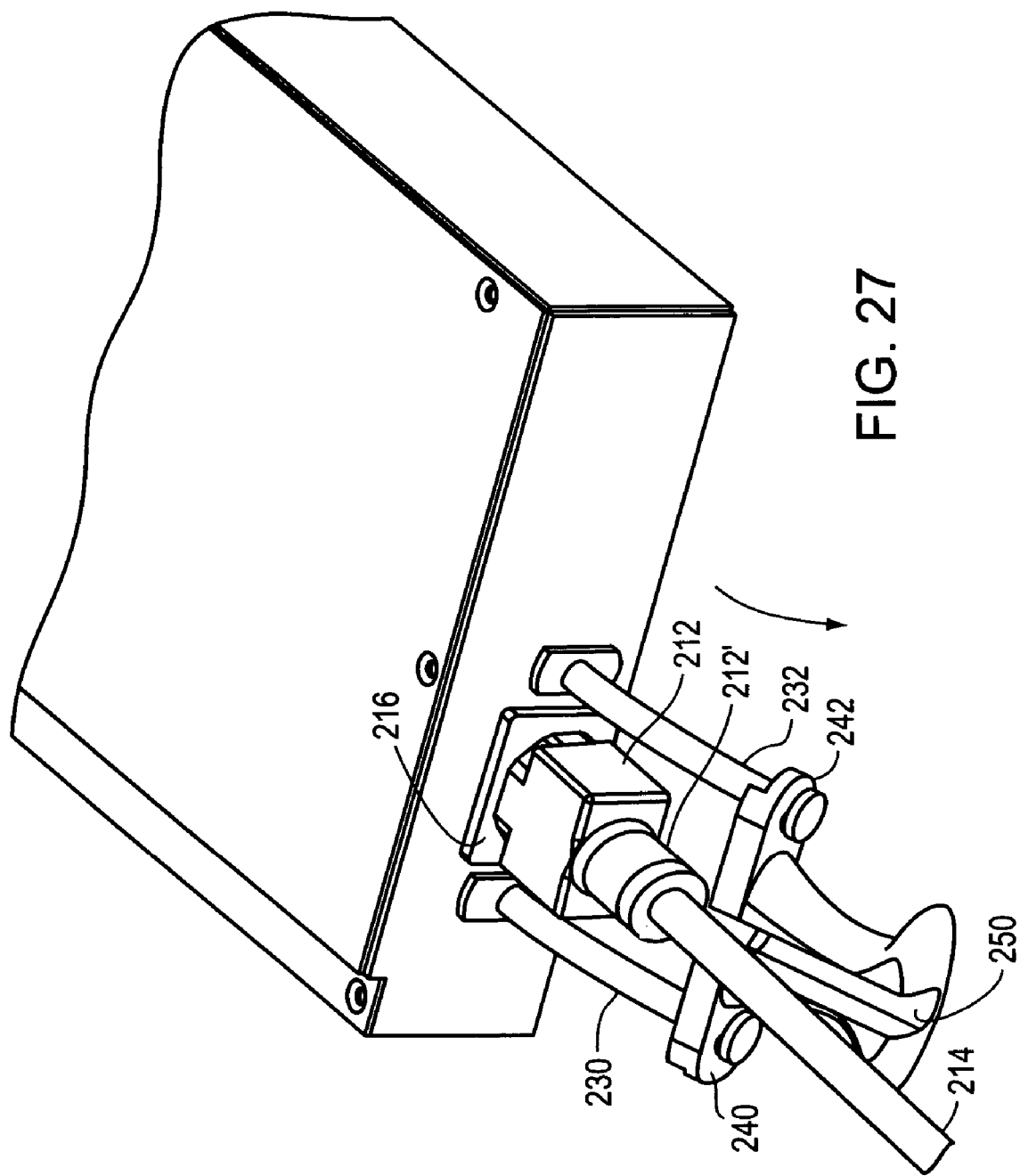
Figure 28:
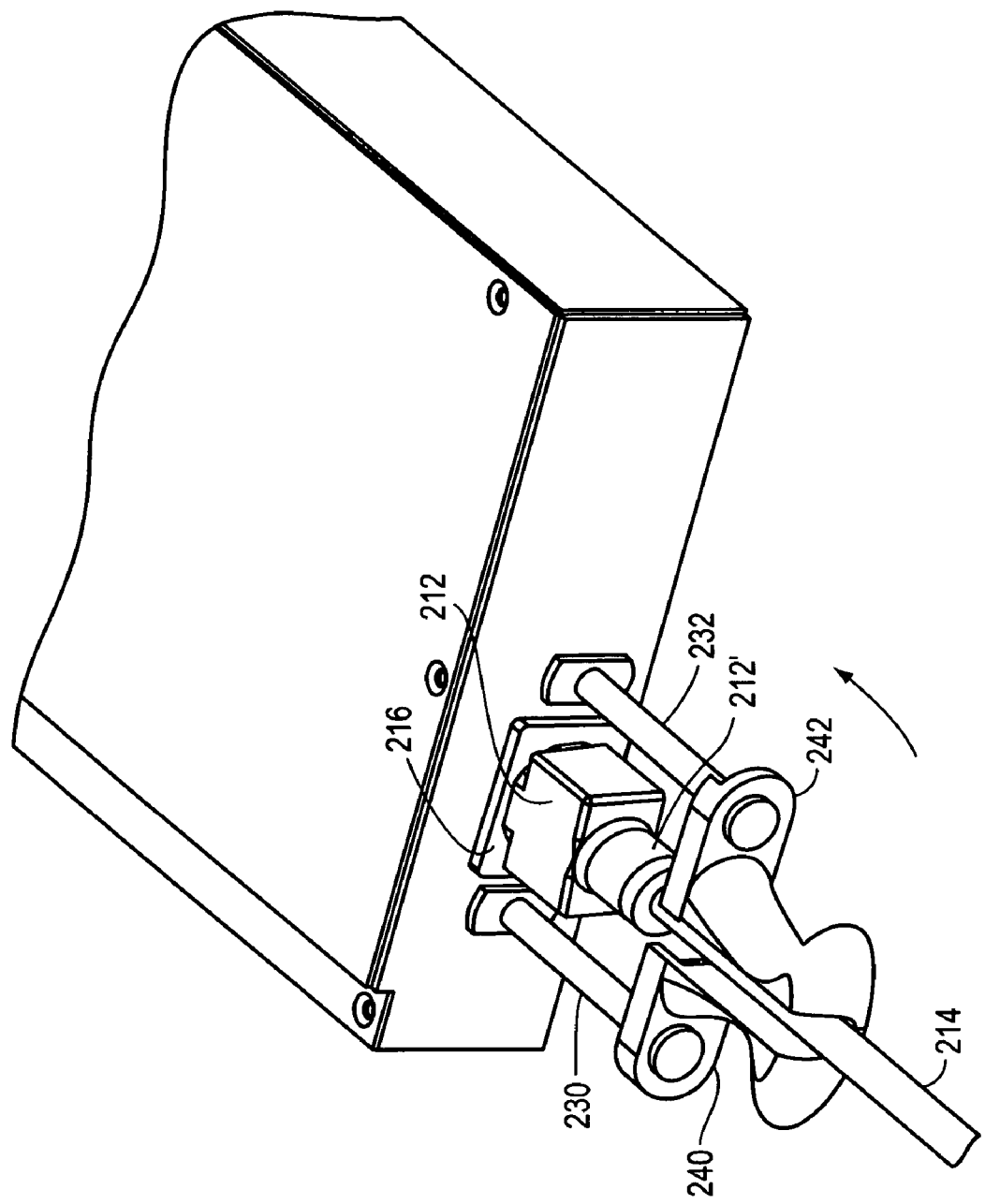
Figure 29:
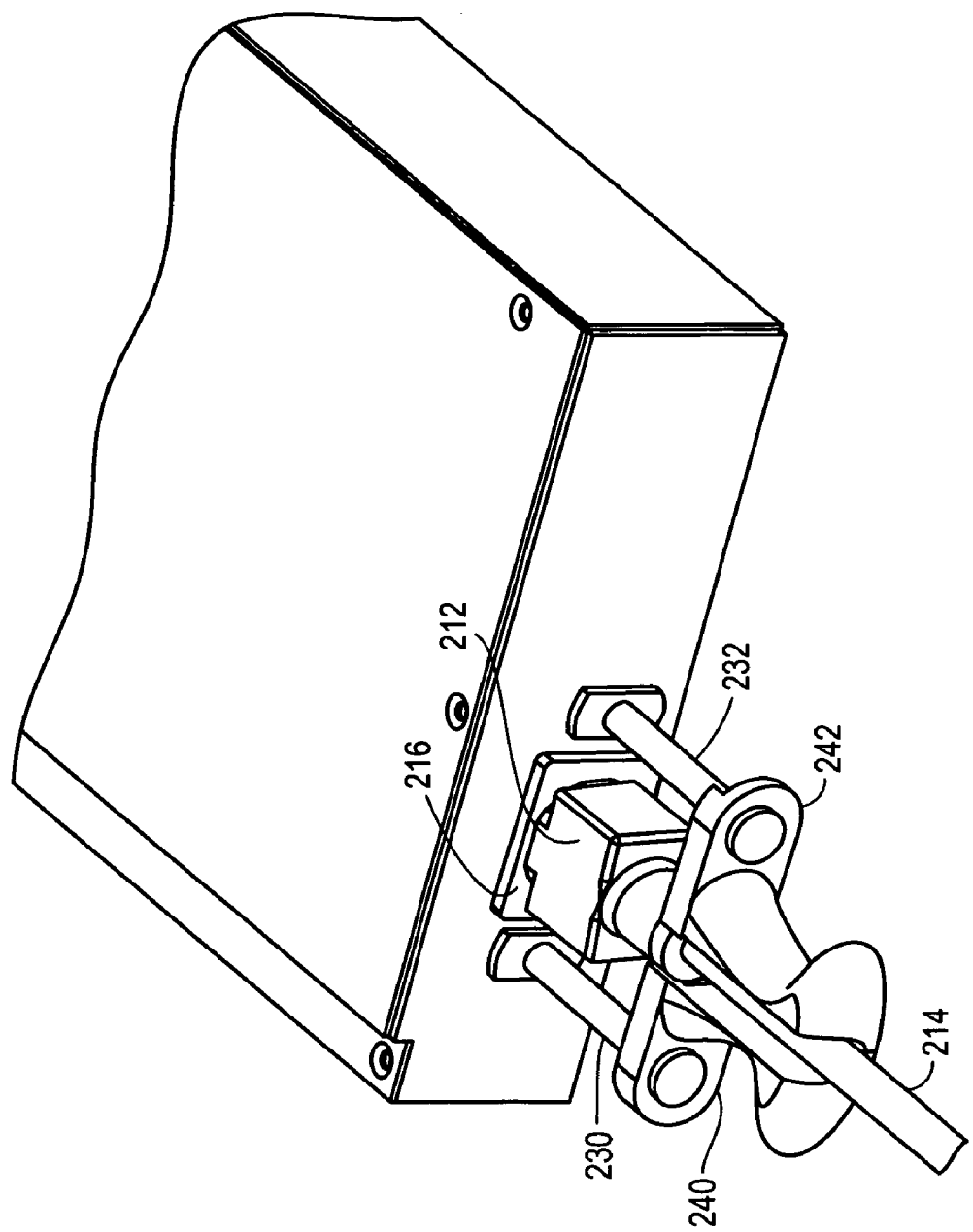

The pair of shoulders 240, 242 as include an outwardly extending handle portion 160 configured to receiving fingers used to stretch the posts 230, 232 as indicated in FIGS. 26-28 and enable the cord 214 and plug 212 to be engaged by the shoulders 240, 242 of the retainer 200. It is noted that the handle 260 has a groove 262 aligned with the groove 250 (FIG. 25) to receive the cord 214, FIGS. 26-28.

Referring again to FIGS. 26-29, the operation is shown wherein the elastomer-end of the retainer 200 has a raised lip 266 (FIG. 26) on either side of the trough 250. This lip 266 is required to grab any feature on the overmold 212' (FIG. 27) of the power cord 212, to keep the retainer 200 from pulling free of the overmold 212' when different forces are applied to the power cord 214. The trough 250 is sized to a worst-case cord diameter.

After the power cord 214 is inserted into the socket 216, as shown in FIGS. 27 and 28, the retainer 200 is pulled back, and lowered slightly as indicated by the arrow, not numbered, by hand, as indicated in FIG. 28, stretching the elastomer posts 230, 232, so that the shoulders 240, 242 are slightly further back than the overmold 212' as indicated by the arrow. The retainer is then raised slightly, so that the top lip of the retainer is above the overmold 212'. The retainer can then be released, where it will cradle the overmold 212', with the elastomers posts 230, 232 providing the necessary force to keep the power cord seated in the socket 116, FIG. 29.

To remove, the process is reversed and one simply pulls the retainer back and down to expose the power cord overmold 212' for extraction.

It will be understood that various modifications may be made. For example, the retainer geometry can take many different shapes and forms, but the concept can stay the same. The elastomer is sized to provide adequate retention for a wide range of overmold depths.

Fan Control/Single Point of Failure

Figure 30:
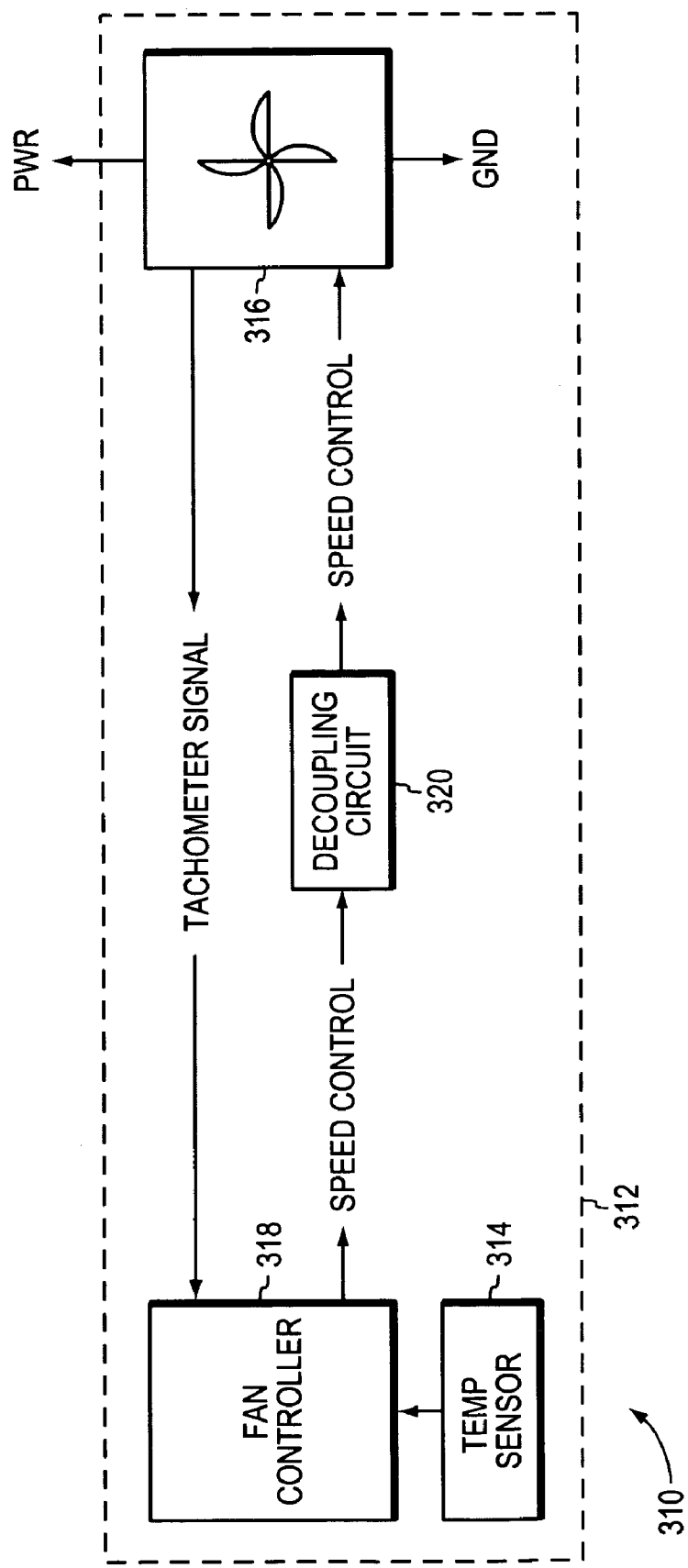
FIG. 30 is a block diagram of a fan control unit used in the chassis of FIG. 13 according to the invention.

Referring now to FIG. 30, a speed control system 310 is shown for controlling temperature within a chassis 312. The chassis 312 includes therein: a temperature sensing device 314 for producing a temperature signal representative of temperature within the chassis 12, a pulse width modulation (PWM) controlled fan 16; and a fan speed controller 318. Here for example, the fan 316 is model FFB0612EHE manufactured by Delta Electronics It is noted that here there is one speed control system 310 for the fan unit 17a, 17b in each chassis 21a, 21b, (FIG. 12B), with each board 20a, 20b having mounted to it a temperature sensing device 314.

The fan speed controller 318 produces a nominal fan speed control signal comprising a train of pulses, successive pulses having a duty cycle therebetween related to the temperature signal produced by the temperature sensing device 314, such duty cycle increasing with increasing temperature. The speed control system 310 includes a decoupling circuit 320 responsive to the nominal fan speed control signal for, in response to relatively short time durations, coupling the nominal fan control signal to an output of the decoupling circuit, and, in response relatively high time durations, producing a preset fan speed signal at the output of the decoupling circuit. The fan has a speed in accordance with the signal at the output of the decoupling circuit. Here, the nominal speed control signal varies from a zero fan speed control signal to a maximum fan speed control signal and wherein the preset fan speed control signal is represents the maximum fan speed control signal. Here, the relatively high time duration indicates a failure of the fan speed controller.

As noted above, the fan 316 is a Pulse Width Modulated (PWM) controlled fan. The fan speed controller 318 produces a nominal fan speed control signal comprising a train of pulses, i.e., a pulse width modulated signal. More particularly, the nominal fan control signal is a square wave signal having a duty cycle related to the temperature signal produced by the temperature sensing device 314. If the temperature sensed by the temperature sensing device 14 is low, the duty cycle is 0%, i.e., the nominal speed control signal is a constant zero volt signal; if the temperature sensed by the temperature sensing device 314 is about midway between low and a maximum temperature, the duty cycle is 50%, i.e., the nominal speed control signal is, during a complete cycle, of time duration, T, here +V volts for a period of time T/2 followed by 0 volts for the succeeding T/2 period of time in which case the fan 316 operate at 50 percent of their rate RPM; and; if the temperature sensed by the temperature sensing device 314 is at maximum temperature, the duty cycle is 100%, i.e., the nominal speed control signal is, during a complete cycle, of time duration, T, here +V volts the period of time T in which case the fan 316 operate at 100 percent of their rate RPM; In short, if the fan sees a duty cycle of 0% (0 Volts) it shuts the fan off 50% duty cycle it spins the fan at 50% of its rated RPM; 100% duty cycle (i.e., +V Volts) the fan 316 runs at full speed. The fan controller 318 monitors the temperature in the chassis and determines how fast the fan should be running. Successive pulses have duty cycle therebetween related to the temperature signal produced by the temperature sensing device 314. The duty cycle increase with increasing temperature.

The speed control system 310 includes, as noted above, the decoupling circuit 320. The decoupling circuit 320 is provided for driving the fan 316 to full speed in the event of a failure of the fan controller 318. As will be described in more detail below, if the time duration which a 0 volts signal is produced is excessively large, indicating a failure of the fan controller 318, the decoupling circuit 20 produces at its output a constant +V signal driving the fan 316 to operate at full speed; otherwise, in the absence of an excessively large 0 volt time duration, the nominal, PWM fan control signal is fed to the fan 316 to enable such fan 316 to operate with a speed which is a function of the temperature signal produced by the temperature sensing device 314, as described in the paragraph above. Thus, the decoupling circuit 320 is responsive to the nominal fan speed control signal for, in response to relatively short time durations between successive pulses, couples the nominal fan control signal to an output of the decoupling circuit 20, and, in response relatively high time durations, produces a preset fan speed signal at the output of the decoupling circuit 320.

Thus, the decoupling circuit 320 is responsive to the nominal fan speed control signal for coupling the nominal fan control signal to an output of the decoupling circuit 320 when such nominal speed control signal is detected by the decoupling circuit 320 as being within a predetermined range of speeds, and produces a preset fan speed signal at the output of the decoupling circuit 320 when such nominal speed control signal is detected by the decoupling circuit 320 as being below the predetermined range of speeds.

Figure 31:
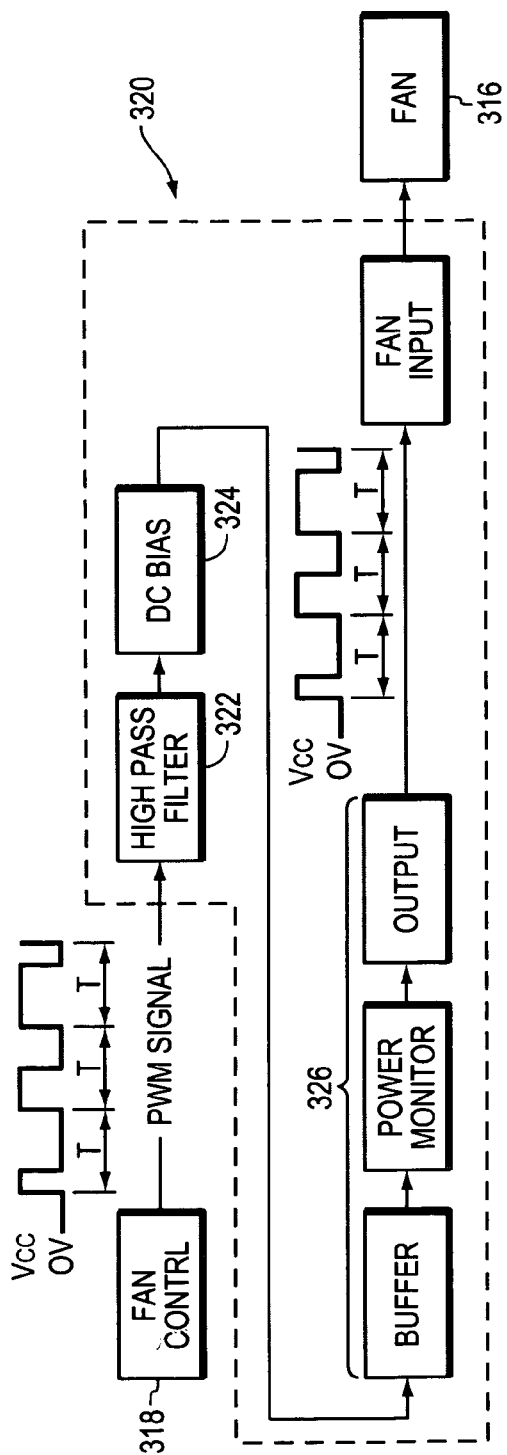
FIG. 31 is a block diagram of a circuit used in the fan control unit of FIG. 30.

More particularly, as shown in FIG. 31, the decoupling circuit 320 includes a high pass filter 322 fed by the nominal PWM signals produced by the fan speed controller 16, FIG. 30. In this example, the pulses swing between 0 volts and Vcc volts and the period between successive pulses is a time duration T. The high pass filter 322 passes pulses having a predetermined frequency greater than 2 Hz. Thus, in the event of a failure of the fan controller 318 the signal produced thereby will be constant at either 0 volts or Vcc volts. In either case, the constant voltage level will be rejected by the high pass filter 322. However, during normal operation of the fan controller the pulses will pass through the high pass filter 322. Thus, the decoupling circuit 230, in response to a pulse repetition frequency greater than a predetermined frequency, couples the nominal fan control signal to an output of the decoupling circuit 20, and, in response to a pulse repetition frequency less than the predetermined frequency, produces a preset fan speed signal at the output of the decoupling circuit driving the fan 316 to its maximum speed.

Figure 32:
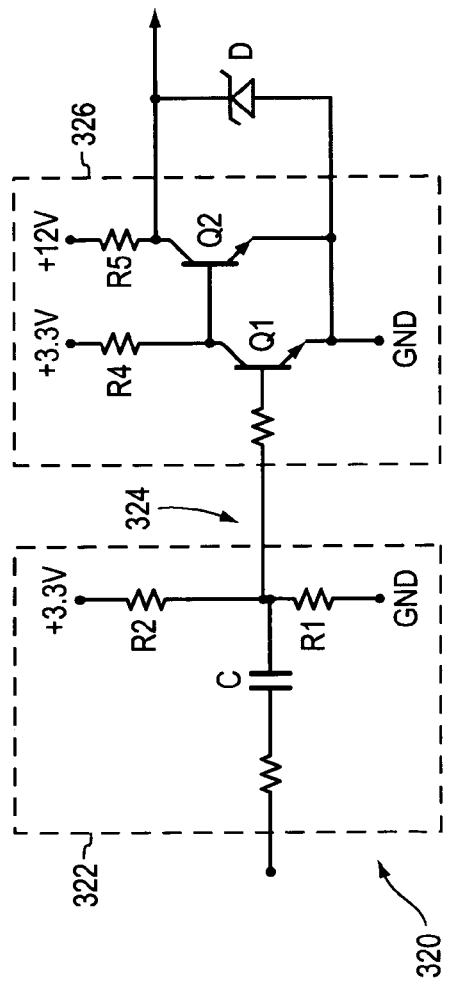
FIG. 32 a schematic diagram of a circuit used in the fan control unit of FIG. 31.

Referring also to FIG. 32, the high pass filter includes a series capacitor C and shunt resistor R1 and R2, as shown. A DC bias circuit 324 is provided by resistor R1 and a resistors R2, as shown. The resistors R1 and R2 are serially connected between +3.3 Volts and ground, as shown. The output of the high pass filter 322 and bias circuit 324 are fed to a level shifting buffer 326 for converting the level of the pulses from +3.3 volts to here +5 Volts. The level shifting circuit 26 includes a pair of bipolar transistors Q1 and Q2 having grounded emitters, as shown. The collectors are connected to a +3.3 Volt supply and a +12 volt supply, respectively as shown, through resisters R4 and R5, respectively, as shown. The collector of transistor Q1 is connected to the base of transistor Q2, as shown. The collector of transistor Q2 is connected to ground through Zener diode D and to the input of the fan 16, as shown in FIG. 31.

In operation, when the voltage passed through capacitor C is 0 Volts, transistor Q1 is "off" and the transistor Q2 is biased via R4 to saturation driving its collector at about ground so that the Zener diode is non-conducting. When the voltage at the output of capacitor C goes towards 3.3 Volts, the transistor Q1 is biased "on" pulling its collector near ground. Thus, transistor Q2 goes "off" so that its collector goes towards +12 volts; but the collector of transistor Q2 becomes clamped by the Zener diode to +5 volts. The fan operates in response to the PWM duty cycle of the signal at the collector of transistor Q2; however, in the absence of a voltage to the capacitor C for a long time, as in the case of a failure of the fan speed controller, the output at the collector of transistor Q2 is held constant at the +5 volts Zener breakdown voltage.

More particularly, the level shift is performed by transistor Q2. It is noted that transistor Q2 is also an inverter. Thus, transistor Q1 is also an inverter so that the polarity of the output signal at the collector of transistor Q2 is the same as the input signal fed to the high pass filter 320. Transistor Q1 also monitors the stand-by power that powers the fan speed controller 318. If the stand-by power is lost, (i.e., the speed controller fails) R stops being a pull-up resistor and now becomes a pull down resistor. This forces transistor Q2 off, allowing resistor R5 to pull up the signal to the fan 316 to +5V.

A number of embodiments of the invention have been described. Nevertheless, it will be understood that various modifications may be made without departing from the spirit and scope of the invention. Accordingly, other embodiments are within the scope of the following claims.

What is claimed is:

1. A speed control system for controlling temperature within a chassis, comprising:
    a temperature sensing device disposed in the chassis, for producing a temperature signal representative of temperature within the chassis,
    a pulse width modulated controlled fan disposed within the chassis;
    a fan speed controller, for produces a nominal fan speed control signal comprising a train of pulses, successive pulses having a duty cycle related to the temperature signal produced by the temperature sensing device, such duty cycle increasing with increasing temperature;
    a decoupling circuit fed by the nominal fan speed control signal for, in response to a relatively low duty cycle, coupling the nominal fan control signal to an output of the decoupling circuit, and, in response a relatively high duty cycle, producing a preset fan speed signal at the output of the decoupling circuit; and
    wherein the fan has a speed in accordance with the signal at the output of the decoupling circuit.

2. The system recited in claim 1 wherein the nominal speed control signal varies from a zero fan speed control signal to a maximum fan speed control signal and wherein the preset fan speed control signal represents the maximum fan speed control signal.

3. The system recited in claim 2 wherein the relatively high duty cycle indicates a failure of the fan speed controller.

4. The speed control system recited in claim 1 wherein the decoupling circuit includes a high pass filter fed by the nominal speed control signal.

5. An interface for coupling data between bank of disk drives and a host computer/server, such interface comprising:
    a chassis having therein:
        the bank of disk drives;
        a storage processor adapted for coupling between the host computer/server and the bank of disk drives;
        a temperature sensing device for producing a temperature signal representative of temperature within the chassis;
        a fan speed controller for producing a nominal fan speed control signal comprising a train of pulses, successive pulses having a duty cycle related to the temperature signal produced by the temperature sensing device, such time durations decreasing with increasing temperature;
        a decoupling circuit fed by the nominal fan speed control signal for, in response to relatively low duty cycles, coupling the nominal fan control signal to an output of the decoupling circuit, and, in response relatively high duty cycles, producing a preset fan speed signal at the output of the decoupling circuit; and
        a fan having a speed in accordance with the signal at the output of the decoupling circuit.

6. The interface recited in claim 5 wherein the nominal speed control signal varies from a zero fan speed control signal to a maximum fan speed control signal and wherein the preset fan speed control signal represents the maximum fan speed control signal.

7. The interface recited in claim 6 wherein the relatively high duty cycle indicates a failure of the fan speed controller.

8. An interface for coupling data between bank of disk drives and a host computer/server, such interface comprising:
    a chassis having therein:
        the bank of disk drives;
        a storage processor adapted for coupling between the host computer/server and the bank of disk drives;
        a temperature sensing device for producing a temperature signal representative of temperature within the chassis;
        a fan speed controller for producing a nominal fan speed control signal comprising a train of pulses in accordance with the temperature signal produced by the temperature sensing device;
        a decoupling circuit fed by the nominal fan speed control signal for coupling the nominal fan control signal to an output of the decoupling circuit when such nominal speed control signal is detected by the decoupling circuit as having a being within a predetermined range of speeds, and for producing a preset fan speed signal at the output of the decoupling circuit when such nominal speed control signal is detected by the decoupling circuit as being below the predetermined range of speeds; and
        a fan having a speed in accordance with the signal at the output of the decoupling circuit.

9. The interface recited in claim 8 wherein the decoupling circuit includes a high pass filter fed by the nominal speed control signal.

10. An interface for coupling data between bank of disk drives and a host computer/server, such interface comprising:
    a chassis having therein:
        the bank of disk drives;
        a storage processor adapted for coupling between the host computer/server and the bank of disk drives;
        a temperature sensing device for producing a temperature signal representative of temperature within the chassis;

a fan speed controller for producing a nominal fan speed control signal having a pulse repetition frequency in accordance with the temperature signal produced by the temperature sensing device;

a decoupling circuit fed by the nominal fan speed control signal for, in response to a pulse repetition frequency greater than a predetermined frequency, coupling the nominal fan control signal to an output of the decoupling circuit, and, in response to a pulse repetition frequency less than the predetermined frequency, producing a preset fan speed signal at the output of the decoupling circuit; and a fan having a speed in accordance with the signal at the output of the decoupling circuit.

11. The interface recited in claim 10 wherein the decoupling circuit includes a high pass filter fed by the nominal speed control signal.

* * * * *